(12) United States Patent
Koike

(10) Patent No.: US 6,223,194 B1
(45) Date of Patent: Apr. 24, 2001

(54) ADAPTIVE FILTER, STEP SIZE CONTROL METHOD THEREOF, AND RECORD MEDIUM THEREFOR

(75) Inventor: Shin'ichi Koike, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/095,103

(22) Filed: Jun. 10, 1998

(30) Foreign Application Priority Data

| Jun. 11, 1997 | (JP) | 9-152753 |
| Jun. 16, 1997 | (JP) | 9-158771 |
| Jun. 16, 1997 | (JP) | 9-158802 |
| Jun. 16, 1997 | (JP) | 9-175281 |

(51) Int. Cl.$^7$ .................................................. G06F 17/10
(52) U.S. Cl. ................................................................. 708/322
(58) Field of Search ............................... 708/322, 323

(56) References Cited

U.S. PATENT DOCUMENTS

| 5,608,804 | * | 3/1997 | Hirano | 708/322 |
| 5,768,313 | * | 6/1998 | Kuribayashi | 708/323 |
| 5,905,659 | * | 5/1999 | Rose | 708/322 |
| 5,974,434 | * | 10/1999 | Rose | 708/322 |
| 5,978,824 | * | 11/1999 | Ikeda | 708/322 |

FOREIGN PATENT DOCUMENTS

| 56-500734 | 5/1981 | (JP) . |
| 57-183117 | 11/1982 | (JP) . |
| 61-18887 | 5/1986 | (JP) . |
| 61-234131 | 10/1986 | (JP) . |
| 63-228817 | 9/1988 | (JP) . |
| 02-1409 | 1/1990 | (JP) . |
| 02-65310 | 3/1990 | (JP) . |
| 2-291712 | 12/1990 | (JP) . |
| 4-117811 | 4/1992 | (JP) . |
| 4-280113 | 10/1992 | (JP) . |
| 7-193467 | 7/1995 | (JP) . |
| 7-212278 | 8/1995 | (JP) . |
| 7-212279 | 8/1995 | (JP) . |
| 8-213880 | 8/1996 | (JP) . |

OTHER PUBLICATIONS

S. Koike, "A New Efficient Method of Convergence Calculation for Adaptive Filters Using the Sign Algorithm with Digital Data Inputs", Acoustics, Speech, and Signal Processing, 1997. ICASSP–97, 1997 IEEE International Conference on, 3 (Apr. 1997), pp. 2333–2336 with Abstract.

S. Koike, "Convergence Analysis of a Data Echo Cancellor with a Stochastic Gradient Adaptive FIR Filter Using the Sign Algorithm", Signal Processing, IEEE Transactions on, 43 [12], (1995), pp. 2852–2862 with Abstract.

(List continued on next page.)

Primary Examiner—David H. Malzahn
(74) Attorney, Agent, or Firm—Sughrue, Mion, Zinn, Macpeak & Seas, PLLC

(57) ABSTRACT

An adaptive filter which is realized as an FIR filter employing stochastic gradient algorithm comprises a step size controller for controlling step size $\alpha_c^{(n)}$ so as to minimize the mean squared estimation error $\epsilon^{(n)}$ at each time n. The step size controller regards a step size $\alpha_c^{(n)}{}_{opt}$ which satisfies $\delta\epsilon^{(n+1)}/\delta\alpha_c^{(n)}{}_{opt}=0$ at each time n as a theoretical optimum step size, and sets the step size $\alpha_c^{(n)}$ at each time n so as to be approximately equal to the theoretical optimum step size $\alpha_c^{(n)}{}_{opt}$. For example, when the adaptive filter employs stochastic gradient sign algorithm as the tap weight control algorithm, the step size controller provided with a leakage accumulator calculates a vector $q^{(n)}$ one by one according to the update equation: $q^{(n+1)}=(1-\rho)q^{(n)}+\rho\mathrm{sgn}(e_n+\upsilon_n)(|e_n+\upsilon_n|)^{1/2}a^{(n)}$ ($\rho$: leakage coefficient, $e_n$: an error signal sequence component, $\upsilon_n$: an additive noise sequence component, $a^{(n)}$: an input signal sequence vector), and sets the step size $\alpha_c^{(n)}$ at each time n as: $\alpha_c^{(n)}=\beta\|q^{(n)}\|^2(\beta=1.07870520/\mathrm{trace}(Ra^2)$, $Ra=E[a^{(n)}a^{(n)T}])$. By the step size controller, both faster convergence of the adaptive filter and smaller residual mean squared estimation error after convergence can be attained.

33 Claims, 23 Drawing Sheets

OTHER PUBLICATIONS

S. Koike, "Convergence and Residual Echo Analysis of an Echo Cancellor with a First-order IIR Filter", Intelligent Signal Processing and Communication Systems, 1992 Workshop Notes, 1992 IEEE International Workshop on (Mar. 1992), pp. 343–257 with Abstract.

V. John Mathews et al., "A Stochastic Gradient Adaptive Filter with Gradient Adaptive Step Size", *IEEE Transactions on Signal Processing,* vol. 41, No. 6, Jun. 1993, pp. 2075–2087.

Akira Kenemasa et al., "An Adaptive–Step Sign Algorithm for Fast Convergence of a Data Echo Canceller", *IEEE Transactions on Communications,* vol. COM–35, No. 10, Oct. 1987, pp. 1102–1108.

Dimitrios I. Pazaitis et al., "A Kurtosis–Driven Variable Step–Size LMS Algorithm", Proceedings IEEE ICASSP96, vol. III, May 1996, pp. 1846–1849.

* cited by examiner

F I G. 19
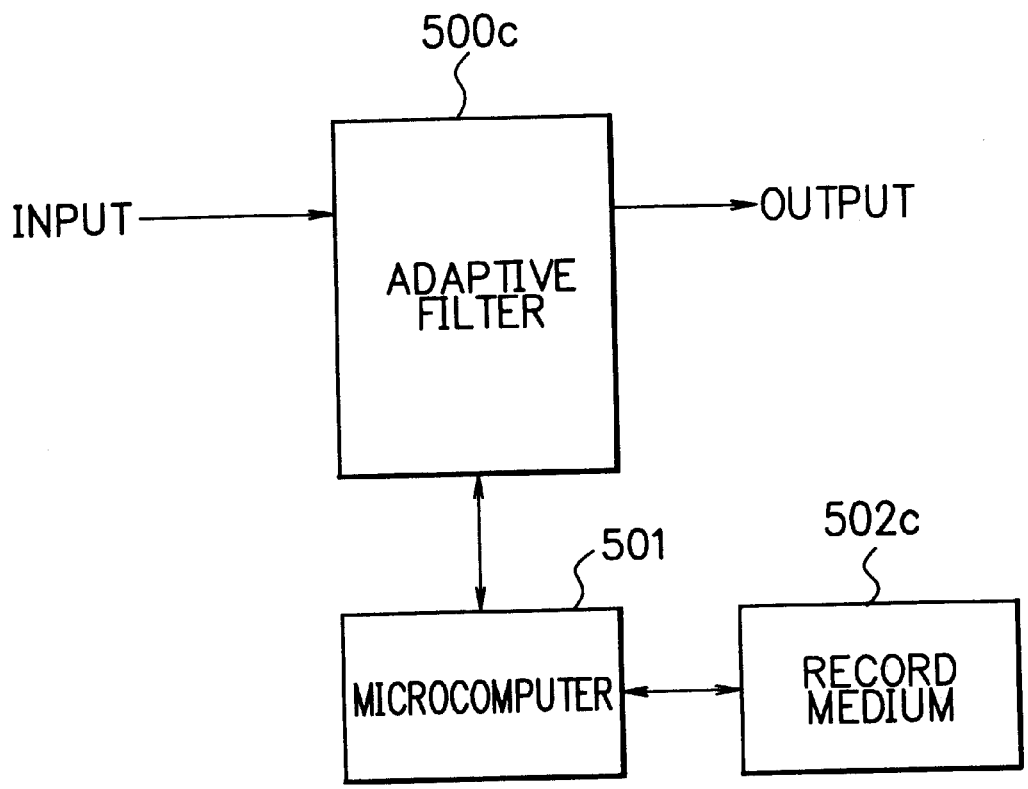

ADAPTIVE FILTER, STEP SIZE CONTROL METHOD THEREOF, AND RECORD MEDIUM THEREFOR

BACKGROUND OF THE INVENTION

The present invention relates to adaptive filters for identifying unknown systems, which are used as echo cancelers in audio systems, automatic equalizers for digital data transmission, etc.

DESCRIPTION OF THE PRIOR ART

At the outset, the principle behind conventional adaptive filters will be explained. FIG. 1 is a block diagram showing a circuit in which an adaptive filter is used for identifying an unknown system.

The circuit of FIG. 1 includes an adaptive filter 42 to which an input signal sequence is supplied and from which an estimate signal sequence is outputted, an unknown system 45 to which the same input signal sequence is supplied and from which an unknown signal sequence is outputted as the response to the input signal sequence, an adder 44 for adding additive noise to the unknown signal sequence outputted from the unknown system 45, a subtracter 43 for subtracting the estimate signal sequence from the output of the adder 44, and thereby outputting a signal sequence which is composed of an error signal sequence (between the unknown signal sequence and the estimate signal sequence) and the additive noise added together, to the adaptive filter 42.

The adaptive filter 42 is a filter used for identifying the unknown system 45, by generating the estimate signal sequence (an estimate of the response of the unknown system 45 to the input signal sequence) using the input signal sequence and by updating its filter parameters based on the error signal sequence (i.e. the difference between the unknown signal sequence and the estimate signal sequence). Usually, the additive noise is added to the unknown signal sequence as noise while observation.

As shown above, starting from an initial state in which the adaptive filter 42 has learned nothing, the adaptive filter 42 and its filter parameters converge on a particular final state, thereby identification of the unknown system 45 is performed.

In many cases, the same input signal sequence is supplied to both the unknown system 45 and the adaptive filter 42 as shown in FIG. 1 and the unknown signal sequence is given as the response of the unknown system 45 to the input signal sequence. Such principle is applied to echo cancelers, automatic equalizers, etc.

Next, detailed composition of the adaptive filter 42 shown in FIG. 1 will be described referring to FIG. 2. FIG. 2 is a block diagram showing an example of composition of part of an adaptive filter. The circuit of FIG. 2 includes a delay unit 51 for delaying the input signal sequence by a fixed time interval, a delay unit 52 for delaying each component $a_{n-k}$ of the delayed input signal sequence supplied from the delay unit 51 by a fixed time interval, a sign detector 54 for detecting the sign (i.e. polarity) of the sum of a component $e_n$ of the error signal sequence and a component $v_n$ of the additive noise sequence which are supplied thereto, a multiplier 55 for obtaining the product of the component $a_{n-k}$ and $\text{sgn}(e_n+v_n)$ (Here, the component $a_{n-k}$ is a component of the delayed input signal sequence which is supplied from the delay unit 51, and the $\text{sgn}(e_n+v_n)$ is the sign of the sum of the error signal sequence component $e_n$ and the additive noise sequence component $v_n$ which are supplied from the sign detector 54.), a multiplier 56 for multiplying the product outputted by the multiplier 55 by a step size $\alpha_c^{(n)}$ at time n, an adder 57 for adding the step size $\alpha_c^{(n)}$ at the time n (when the multiplication of the $\alpha_c^{(n)}$ was executed) and the k-th tap weight $c_k^{(n)}$ at the time n, and outputting the sum as the k-th tap weight $c_k^{(n+1)}$ at time n+1, a delay unit 53 for delaying the k-th tap weight $c_k^{(n+1)}$ at the time n+1 by a fixed time interval and thereby outputting the k-th tap weight $c_k^{(n)}$ at the time n, and a multiplier 58 for obtaining the product of the k-th tap weight $c_k^{(n)}$ and the delayed input signal sequence component $a_{n-k}$ supplied from the delay unit 51.

An adaptive filter is usually realized as an FIR (Finite Impulse Response) filter (i.e. non-recursive filter) as shown in FIG. 2. The FIG. 2 is showing a circuit for controlling the k-th tap weight $c_k^{(n)}$ which is included in a set of N pieces of tap weights: $\{c_0^{(n)}, c_1^{(n)}, \ldots, c_{N-1}^{(n)}\}$. The resultant output obtained by the adaptive filter is the sum of outputs of such circuits corresponding to each k.

The N pieces of tap weights $\{c_0^{(n)}, c_1^{(n)}, \ldots, c_{N-1}^{(n)}\}$ are controlled by the adaptive filter using the sum of the error signal sequence component $e_n$ and the additive noise sequence component $v_n$. As mentioned above, in FIG. 2, n denotes time, $a_n$ denotes a component of the input signal sequence at the time n, and $\alpha_c^{(n)}$ denotes a step size at the time n. The tap weight control algorithm employed in the circuit of FIG. 2 is stochastic gradient sign algorithm which is expressed as the following equation:

$$c^{(n+1)} = c^{(n)} + \alpha_c^{(n)} \text{sgn}(e_n + v_n) a^{(n)}$$

where $$c^{(n)} = [c_0^{(n)}, c_1^{(n)}, \ldots, c_{N-1}^{(n)}]^T$$

and $$a^{(n)} = [a_n, a_{n-1}, \ldots, a_{n-N+1}]^T.$$

Here, the $c^{(n)}$ and the $a^{(n)}$ in the above equations are the tap weights and the input signal sequence which are represented in the form of vectors. Incidentally, in the above equations, the 'sgn( )' represents the sign (i.e. the polarity) of ( ), and the '[ ]$^T$' represents the matrix transpose of [ ].

FIG. 3 is a block diagram showing another example of an adaptive filter. Similarly to FIG. 2, FIG. 3 is showing a circuit for controlling the k-th tap weight $c_k^{(n)}$, and the resultant output which is obtained by the adaptive filter is the sum of outputs of such circuits corresponding to each k. The N pieces of tap weights $\{c_0^{(n)}, c_1^{(n)}, \ldots, c_{N-1}^{(n)}\}$ are controlled by the adaptive filter using the $(e_n+v_n)$ in FIG. 3. As mentioned above, n is denoting time, $a_n$ is denoting a component of the input signal sequence at the time n, and $\alpha_c^{(n)}$ is denoting a step size at the time n. The control algorithm for tap weights shown in FIG. 3 is stochastic gradient algorithm which can be expressed more generally as the following equation:

$$c^{(n+1)} = c^{(n)} + \alpha_c^{(n)} f(e_n + v_n) g(a^{(n)})$$

where $$c^{(n)} = [c_0^{(n)}, c_1^{(n)}, \ldots, c_{N-1}^{(n)}]^T$$

and $$a^{(n)} = [a_n, a_{n-1}, \ldots, a_{n-N+1}]^T$$

and $$g(a^{(n)})=[g(a_n),g(a_{n-1}),\ldots,g(a_{n-N+1})]^T.$$

Here, both of the functions 'f( )' and 'g( )' are odd functions, and normally, nonlinear functions.

The following algorithms are industrially used as tap weight control algorithms of adaptive filters.

a. stochastic gradient LMS algorithm:
   $f(x)=x$, $g(a^{(n)})=a^{(n)}$ b. stochastic gradient normalized LMS algorithm:
   $f(x)=x$, $g(a^{(n)})=a^{(n)}/Pa$, $Pa=a^{(n)T}a^{(n)}$ c. stochastic gradient signed regressor algorithm:
   $f(x)=x$, $g(a^{(n)})=sgn(a^{(n)})$ d. stochastic gradient sign algorithm (FIG. 2):
   $f(x)=sgn(x)$, $g(a^{(n)})=a^{(n)}$ e. stochastic gradient sign-sign algorithm:
   $f(x)=sgn(x)$, $g(a^{(n)})=sgn(a^{(n)})$ For example, in the case of the stochastic gradient LMS algorithm ($f(e_n+\upsilon_n)=e_n+\upsilon_n$, $g(a^{(n)})=a^{(n)}$), a circuit shown in FIG. 4 can be adopted for controlling the k-th tap weight $c_k^{(n)}$.

In the following, the setting of the step size $\alpha_c^{(n)}$ will be discussed. In the case where the step size $\alpha_c^{(n)}$ is a predetermined fixed value $\alpha_{cfixed}$ independently of the time n, convergence of the adaptive filter can be made faster by setting the fixed step size $\alpha_{cfixed}$ larger, as long as the fixed step size $\alpha_{cfixed}$ is in a range where the adaptive filter is stable. However, when the additive noise exists, the power of residual error after convergence is necessitated to be larger due to the large fixed step size $\alpha_{cfixed}$.

On the other hand, if the fixed step size $\alpha_{cfixed}$ is set smaller, the residual error after convergence can be made smaller. However, the convergence of the adaptive filter is necessitated to be considerably slower.

In order to resolve the above problem and provide an adaptive filter by which both fast convergence and small residual error can be realized, some methods for adaptive control of the step size have been proposed. In such methods, the step size is set large in the initial stage of convergence, and is set smaller according to the progress of the convergence.

The above proposed methods include: (1) gradient adaptive step size method, (2) error-replica correlation method, (3) kurtosis (fourth order statistics) method, etc. The details of these methods are described in the following documents respectively:

(1) V. J. Mathews et al., "A Stochastic Gradient Adaptive Filter with Gradient Adaptive Step Size," IEEE Trans. on SP, vol. 41, no. 6, pp. 2075–2087, June 1993, (2) A. Kanemasa et al., "An Adaptive-Step Sign Algorithm for Fast Convergence of a Data Echo Canceler," IEEE Trans. on Commun., vol. 35, no. 10, pp. 1102–1108, October 1987, and (3) D. Pazaitis et al., "A Kurtosis-Driven Variable Step-Size LMS Algorithm," Proceedings IEEE ICASSP96, vol. III, pp. 1846–1849, Atlanta, Ga., May 1996.

Further, in consideration of both fast convergence and small residual error after convergence, the following methods have been further proposed. In a method which is disclosed in Japanese Patent Application Laid-Open No.HEI8-265223, the step size is varied according to the absolute value of the tap weight. In Japanese Patent Application Laid-Open No.HEI2-291712, the step size is varied according to the variance of the error signal power. And in Japanese Patent Application Laid-Open No.SHO61-234131, the step size is varied according to correlation between the sign of the error signal and the sign of output (i.e. an estimate or a replica) of the adaptive filter (refer to the above document (2)).

However, above methods are known to be insufficient to get satisfactory effects. Especially, when it is tried to reduce the residual error after convergence as small as the level which is attainable by the aforementioned fixed step size, it is difficult to improve the convergence speed sufficiently.

SUMMARY OF THE INVENTION

It is therefore the primary object of the present invention to provide an adaptive filter employing the stochastic gradient algorithm in which the step size can be controlled so as to attain both faster convergence of the adaptive filter and smaller residual error after convergence.

In accordance with a 1st aspect of the present invention, there is provided an adaptive filter which is realized as a finite impulse response filter employing stochastic gradient algorithm expressed by the following equation as tap weight control algorithm:

$$c^{(n+1)}=c^{(n)}+\alpha_c^{(n)}f(e_n+\upsilon_n)g(a^{(n)})$$

where:

n is time, $c^{(n)}$ is an N dimensional tap weight vector at the time n, $\alpha_c^{(n)}$ is a step size at the time n, $e_n$ is an error signal sequence component at the time n, $\upsilon_n$ is an additive noise sequence component at the time n, and $a^{(n)}$ is an input signal sequence vector at the time n, comprising a step size controller means for controlling the step size $\alpha_c^{(n)}$ so as to minimize the mean squared estimation error $\epsilon^{(n)}=E[e_n^2]$ at each time n. The step size controller means regards a step size $\alpha_c^{(n)}{}_{opt}$ which satisfies $\delta\epsilon^{(n+1)}/\delta\alpha_c^{(n)}{}_{opt}=0$ at each time n as a theoretical optimum step size, and sets the step size $\alpha_c^{(n)}$ at each time n so as to be approximately equal to the theoretical optimum step size $\alpha_c^{(n)}{}_{opt}$.

In accordance with a 2nd aspect of the present invention, in the 1st aspect, the step size controller means calculates vectors $q_0^{(n)}$ and $q^{(n)}$ and a scalar quantity $\tau^{(n)}$ one by one according to the following update equations:

$$q_0^{(n+1)}=(1-\rho_0)q_0^{(n)}+\rho_0(e_n+\upsilon_n)a^{(n)}$$

$$q^{(n+1)}=(1-\rho)q^{(n)}+\rho f(e_n+\upsilon_n)g(a^{(n)})$$

$$\tau^{(n+1)}=(1-\rho_\tau)\tau^{(n)}+\rho_\tau\{a^{(n-L)T}f(e_n+\upsilon_n)g(a^{(n)})\}^2$$

where the $\rho_0$, $\rho$ and $\rho_\tau$ are leakage coefficients, and the L is a delay time length which is sufficiently large so that $E[a^{(n-L)T}a^{(n)}]$ will be approximately zero, and sets the step size $\alpha_c^{(n)}$ at each time n as:

$$\alpha_c^{(n)}=q_0^{(n)T}q^{(n)}/\tau^{(n)}$$

where the $q_0^{(n)T}q^{(n)}$ is the inner product of the vectors $q_0^{(n)}$ and $q^{(n)}$.

In accordance with a 3rd aspect of the present invention, in the 2nd aspect, the step size controller means includes a multiplier means, a first leakage accumulator means, a second leakage accumulator means, a first inner product calculator means, a second inner product calculator means, a squarer means, a third leakage accumulator means, and a divider means. The multiplier means multiplies the input signal sequence vector $a^{(n)}$ by the sum of the error signal sequence component $e_n$ and the additive noise sequence component $\upsilon_n$. The first leakage accumulator means obtains the vector $q_0^{(n)}$ according to the update equation using the leakage coefficient $\rho_0$ and the product vector $(e_n+\upsilon_n)a^{(n)}$ obtained by the multiplier means. The second leakage accumulator means obtains the vector $q^{(n)}$ according to the update equation using the leakage coefficient $\rho$ and the vector $f(e_n+\upsilon_n)g(a^{(n)})$ which is used for controlling the tap weight vector $c^{(n)}$. The first inner product calculator means obtains the inner product of the vector $q_0^{(n)}$ and the vector $q^{(n)}$. The second inner product calculator means obtains the inner product of the vector $f(e_n+\upsilon_n)g(a^{(n)})$ and a vector $a^{(n-L)}$ which is the input signal sequence vector $a^{(n)}$ delayed by the delay time length L. The squarer means obtains the square of the inner product $a^{(n-L)T}f(e_n+\upsilon_n)g(a^{(n)})$ obtained by the second inner product calculator means. The third leakage accumulator means obtains the scalar quantity $\tau^{(n)}$ according to the update equation using the leakage coefficient $\rho_\tau$ and the square $\{a^{(n-L)T}f(e_n+\upsilon_n)g(a^{(n)})\}^2$ obtained by the squarer means. And the divider means divides the inner product $q_0^{(n)T}q^{(n)}$ obtained by the first inner product calculator means by the scalar quantity $\tau^{(n)}$ obtained by the third leakage accumulator means and thereby obtains the step size $\alpha_c^{(n)}=q_0^{(n)T}q^{(n)}/\tau^{(n)}$.

In accordance with a 4th aspect of the present invention, in the 1st aspect, the adaptive filter employs stochastic gradient sign algorithm in which the $f(e_n+\upsilon_n)$ is $\text{sgn}(e_n+\upsilon_n)$ and the $g(a^{(n)})$ is $a^{(n)}$ as the tap weight control algorithm, and the step size controller means calculates a vector $q^{(n)}$ one by one according to the following update equation:

$$q^{(n+1)}=(1-\rho)q^{(n)}+\rho\text{sgn}(e_n+\upsilon_n)(|e_n+\upsilon_n|)^{1/2}a^{(n)}$$

where the $\rho$ is a leakage coefficient, and sets the step size $\alpha_c^{(n)}$ at each time n as:

$$\alpha_c^{(n)} = \beta\|q^{(n)}\|^2$$

where $$\beta = (\pi/2)^{1/2}/\Gamma^2(5/4)/\text{trace}(Ra^2)$$
$$= 1.07870520/\text{trace}(Ra^2)$$

where $$Ra = E[a^{(n)}a^{(n)T}].$$

In accordance with a 5th aspect of the present invention, in the 4th aspect, the step size controller means includes a sign detector means, an absolute value calculator means, a square root calculator means, a first multiplier means, a second multiplier means, a leakage accumulator means, a norm calculator means, and a third multiplier means. The sign detector means detects the sign of the sum of the error signal sequence component $e_n$ and the additive noise sequence component $\upsilon_n$. The absolute value calculator means calculates the absolute value of the sum $(e_n+\upsilon_n)$. The square root calculator means calculates the square root of the absolute value $|e_n+\upsilon_n|$ calculated by the absolute value calculator means. The first multiplier means calculates the product of the sign $\text{sgn}(e_n+\upsilon_n)$ detected by the sign detector means and the square root $(|e_n+\upsilon_n|)^{1/2}$ calculated by the square root calculator means. The second multiplier means multiplies the input signal sequence vector $a^{(n)}$ by the product $\text{sgn}(e_n+\upsilon_n)(|e_n+\upsilon_n|)^{1/2}$ calculated by the first multiplier means. The leakage accumulator means obtains the vector $q^{(n)}$ according to the update equation using the leakage coefficient $\rho$ and the product vector $\text{sgn}(e_n+\upsilon_n)(|e_n+\upsilon_n|)^{1/2}a^{(n)}$ obtained by the second multiplier means. The norm calculator means calculates the squared norm of the vector $q^{(n)}$ obtained by the leakage accumulator means. And the third multiplier means multiplies the squared norm $\|q^{(n)}\|^2$ obtained by the norm calculator means by the coefficient $\beta$ and thereby obtains the step size $\alpha_c^{(n)}=\beta\|q^{(n)}\|^2$.

In accordance with a 6th aspect of the present invention, in the 1st aspect, the adaptive filter employs stochastic gradient sign algorithm in which the $f(e_n+\upsilon_n)$ is $\text{sgn}(e_n+\upsilon_n)$ and the $g(a^{(n)})$ is $a^{(n)}$ as the tap weight control algorithm, and the step size controller means calculates a vector $q^{(n)}$ and a scalar quantity $|\sigma|^{(n)}$ one by one according to the following update equations:

$$q^{(n+1)}=(1-\rho)q^{(n)}+\rho\text{sgn}(e_n+\upsilon_n)a^{(n)}$$

$$|\sigma|^{(n+1)}=(1-\rho_\sigma)|\sigma|^{(n)}+\rho_\sigma|e_n+\upsilon_n|$$

where the $\rho$ and $\rho_\sigma$ are leakage coefficients, and sets the step size $\alpha_c^{(n)}$ at each time n as:

$$\alpha_c^{(n)}=\beta'\|q^{(n)}\|^2|\sigma|^{(n)}$$

where $\beta'=\pi/2/\text{trace}(Ra^2)$ where $Ra=E[a^{(n)}a^{(n)T}]$.

In accordance with a 7th aspect of the present invention, in the 6th aspect, the step size controller means includes a sign detector means, an absolute value calculator means, a first multiplier means, a first leakage accumulator means, a norm calculator means, a second leakage accumulator means, a second multiplier means, and a third multiplier means. The sign detector means detects the sign of the sum of the error signal sequence component $e_n$ and the additive noise sequence component $\upsilon_n$. The absolute value calculator means calculates the absolute value of the sum $(e_n+\upsilon_n)$. The first multiplier means multiplies the input signal sequence vector $a^{(n)}$ by the sign $\text{sgn}(e_n+\upsilon_n)$ detected by the sign detector means. The first leakage accumulator means obtains the vector $q^{(n)}$ according to the update equation using the leakage coefficient $\rho$ and the product vector $\text{sgn}(e_n+\upsilon_n)a^{(n)}$ obtained by the first multiplier means. The norm calculator means calculates the squared norm of the vector $q^{(n)}$ obtained by the first leakage accumulator means. The second leakage accumulator means obtains the scalar quantity $|\sigma|^{(n)}$ according to the update equation using the leakage coefficient $\rho_\sigma$ and the absolute value $|e_n+\upsilon_n|$ calculated by the absolute value calculator means. The second multiplier means multiplies the squared norm $\|q^{(n)}\|^2$ calculated by the norm calculator means by the scalar quantity $|\sigma|^{(n)}$. And the third multiplier means multiplies the product $\|q^{(n)}\|^2|\sigma|^{(n)}$ obtained by the second multiplier means by the coefficient $\beta'$ and thereby obtains the step size $\alpha_c^{(n)}=\beta'\|q^{(n)}\|^2|\sigma|^{(n)}$.

In accordance with an 8th aspect of the present invention, in the 1st aspect, the adaptive filter employs stochastic gradient LMS algorithm in which the $f(e_n+\upsilon_n)$ is $e_n+\upsilon_n$ and the $g(a^{(n)})$ is $a^{(n)}$ as the tap weight control algorithm, and the step size controller means calculates a vector $q^{(n)}$ one by one according to the following update equation:

$$q^{(n+1)}=(1-\rho)q^{(n)}+\rho\text{sgn}(e_n+\upsilon_n)a^{(n)}$$

where the $\rho$ is a leakage coefficient, and sets the step size $\alpha_c^{(n)}$ at each time n as:

$$\alpha_c^{(n)}=\beta'\|q^{(n)}\|^2$$

where $\beta'=\pi/2/\text{trace}(Ra^2)$ where $Ra=E[a^{(n)}a^{(n)T}]$.

In accordance with a 9th aspect of the present invention, in the 8th aspect, the step size controller means includes a sign detector means, a first multiplier means, a leakage accumulator means, a norm calculator means, and a second multiplier means. The sign detector means detects the sign of the sum of the error signal sequence component $e_n$ and the additive noise sequence component $\upsilon_n$. The first multiplier means multiplies the input signal sequence vector $a^{(n)}$ by the sign $\text{sgn}(e_n+\upsilon_n)$ detected by the sign detector means. The leakage accumulator means obtains the vector $q^{(n)}$ according to the update equation using the leakage coefficient $\rho$ and the product vector $\text{sgn}(e_n+\upsilon_n)a^{(n)}$ obtained by the first multiplier means. The norm calculator means calculates the squared norm of the vector $q^{(n)}$ obtained by the leakage accumulator means. And the second multiplier means multiplies the squared norm $\|q^{(n)}\|^2$ obtained by the norm calculator means by the coefficient $\beta$ and thereby obtains the step size $\alpha_c^{(n)}=\beta'\|q^{(n)}\|^2$.

In accordance with a 10th aspect of the present invention, in the 1st aspect, the adaptive filter employs stochastic gradient normalized LMS algorithm in which the $f(e_n+\upsilon_n)$ is $e_n+\upsilon_n$ and the $g(a^{(n)})$ is $a^{(n)}/Pa$ $(Pa=a^{(n)T}a^{(n)})$ as the tap weight control algorithm, and the step size controller means calculates a vector $q^{(n)}$ one by one according to the following update equation:

$$q^{(n+1)}=(1-\rho)q^{(n)}+\rho\text{sgn}(e_n+\upsilon_n)a^{(n)}$$

where the $\rho$ is a leakage coefficient, and sets the step size $\alpha_c^{(n)}$ at each time n as:

$$\alpha_c^{(n)}=\beta''\|q^{(n)}\|^2$$

where $\beta''=(\pi/2)\sigma_a^2 N/\text{trace}(Ra^2)$
where $Ra=E[a^{(n)}a^{(n)T}]$,
    N is the number of taps, and
    $\sigma_a^2$ is the power of the input signal sequence $a^{(n)}$.

In accordance with an 11th aspect of the present invention, in the 10th aspect, the step size controller means includes a sign detector means, a first multiplier means, a leakage accumulator means, a norm calculator means, and a second multiplier means. The sign detector means detects the sign of the sum of the error signal sequence component $e_n$ and the additive noise sequence component $\upsilon_n$. The first multiplier means multiplies the input signal sequence vector $a^{(n)}$ by the sign $\text{sgn}(e_n+\upsilon_n)$ detected by the sign detector means. The leakage accumulator means obtains the vector $q^{(n)}$ according to the update equation using the leakage coefficient $\rho$ and the product vector $\text{sgn}(e_n+\upsilon_n)a^{(n)}$ obtained by the first multiplier means. The norm calculator means calculates the squared norm of the vector $q^{(n)}$ obtained by the leakage accumulator means. And the second multiplier means multiplies the squared norm $\|q^{(n)}\|^2$ obtained by the norm calculator means by the coefficient $\beta''$ and thereby obtains the step size $\alpha_c^{(n)}=\beta''\|q^{(n)}\|^2$.

In accordance with a 12th aspect of the present invention, there is provided a step size control method for an adaptive filter which is realized as a finite impulse response filter employing stochastic gradient algorithm expressed by the following equation as tap weight control algorithm:

$$c^{(n+1)}=c^{(n)}+\alpha_c^{(n)}f(e_n+\upsilon_n)g(a^{(n)})$$

where:
    n is time,
    $c^{(n)}$ is an N dimensional tap weight vector at the time n,
    $\alpha_c^{(n)}$ is a step size at the time n,
    $e_n$ is an error signal sequence component at the time n,
    $\upsilon_n$ is an additive noise sequence component at the time n, and $a^{(n)}$ is an input signal sequence vector at the time n.
wherein the step size $\alpha_c^{(n)}$ is controlled so as to minimize the mean squared estimation error $\epsilon^{(n)}=E[e_n^2]$ at each time n. In the step size control method, a step size $\alpha_c^{(n)}{}_{opt}$ which satisfies $\delta\epsilon^{(n+1)}/\delta\alpha_c^{(n)}{}_{opt}=0$ at each time n is regarded as a theoretical optimum step size, and the step size $\alpha_c^{(n)}$ at each time n is set so as to be approximately equal to the theoretical optimum step size $\alpha_c^{(n)}{}_{opt}$.

In accordance with a 13th aspect of the present invention, in the 12th aspect, vectors $q_0^{(n)}$ and $q^{(n)}$ and a scalar quantity $\sigma^{(n)}$ are calculated one by one according to the following update equations:

$$q_0^{(n+1)}=(1-\rho_0)q_0^{(n)}+\rho_0(e_n+\upsilon_n)a^{(n)}$$

$$q^{(n+1)}=(1-\rho)q^{(n)}+\rho f(e_n+\upsilon_n)g(a^{(n)})$$

$$\tau^{(n+1)}=(1-\rho_\tau)\tau^{(n)}+\rho_\tau\{a^{(n-L)T}f(e_n+\upsilon_n)g(a^{(n)})\}^2$$

where the $\rho_0$, $\rho$ and $\rho_\tau$ are leakage coefficients, and the L is a delay time length which is sufficiently large so that $E[a^{(n-L)T}a^{(n)}]$ will be approximately zero. And the step size $\alpha_c^{(n)}$ at each time n is set as:

$$\alpha_c^{(n)}=q_0^{(n)T}q^{(n)}/\tau^{(n)}$$

where the $q_0^{(n)T}q^{(n)}$ is the inner product of the vectors $q_0^{(n)}$ and $q^{(n)}$.

In accordance with a 14th aspect of the present invention, in the 13th aspect, the step size control method comprises the steps of:

(1) multiplying the input signal sequence vector $a^{(n)}$ by the sum of the error signal sequence component $e_n$ and the additive noise sequence component $\upsilon_n$;

(2) obtaining the vector $q_0^{(n)}$ according to the update equation using the leakage coefficient $\rho_0$ and the product vector $(e_n+\upsilon_n)a^{(n)}$ obtained in the step (1);

(3) obtaining the vector $q^{(n)}$ according to the update equation using the leakage coefficient $\rho$ and the vector $f(e_n+\upsilon_n)g(a^{(n)})$ which is used for controlling the tap weight vector $c^{(n)}$;

(4) obtaining the inner product of the vector $q_0^{(n)}$ and the vector $q^{(n)}$;

(5) obtaining the inner product of the vector $f(e_n+\upsilon_n)g(a^{(n)})$ and a vector $a^{(n-L)}$ which is the input signal sequence vector $a^{(n)}$ delayed by the delay time length L;

(6) obtaining the square of the inner product $a^{(n-L)T}f(e_n+\upsilon_n)g(a^{(n)})$ obtained in the step (5);

(7) obtaining the scalar quantity $\tau^{(n)}$ according to the update equation using the leakage coefficient $\rho_\tau$ and the square $\{a^{(n-L)T}f(e_n+\upsilon_n)g(a^{(n)})\}^2$ obtained in the step (6); and (8) dividing the inner product $q_0^{(n)T}q^{(n)}$ obtained in the step (4) by the scalar quantity $\tau^{(n)}$ obtained in the step (7) and thereby obtaining the step size $\alpha_c^{(n)}=q_0^{(n)T}q^{(n)}/\tau^{(n)}$.

In accordance with a 15th aspect of the present invention, in the 12th aspect, a vector $q^{(n)}$ is calculated one by one according to the following update equation:

$$q^{(n+1)}=(1-\rho)q^{(n)}+\rho\text{sgn}(e_n+\upsilon_n)(|e_n+\upsilon_n|)^{1/2}a^{(n)}$$

where the $\rho$ is a leakage coefficient. And the step size $\alpha_c^{(n)}$ at each time n is set as:

$$\alpha_c^{(n)} = \beta \|q^{(n)}\|^2$$

where $$\beta = (\pi/2)^{1/2}/\Gamma^2(5/4)/\text{trace}(Ra^2)$$
$$= 1.07870520/\text{trace}(Ra^2)$$

where $$Ra = E[a^{(n)}a^{(n)T}].$$

In accordance with a 16th aspect of the present invention, in the 15th aspect, the step size control method comprises the steps of:

(1) detecting the sign of the sum of the error signal sequence component $e_n$ and the additive noise sequence component $\upsilon_n$;

(2) calculating the absolute value of the sum $(e_n+\upsilon_n)$;

(3) calculating the square root of the absolute value $|e_n+\upsilon_n|$ calculated in the step (2);

(4) calculating the product of the sign $\text{sgn}(e_n+\upsilon_n)$ detected in the step (1) and the square root $(|e_n+\upsilon_n|)^{1/2}$ calculated in the step (3);

(5) multiplying the input signal sequence vector $a^{(n)}$ by the product $\text{sgn}(e_n+\upsilon_n)(|e_n+\upsilon_n|)^{1/2}$ calculated in the step (4);

(6) obtaining the vector $q^{(n)}$ according to the update equation using the leakage coefficient $\rho$ and the product vector $\text{sgn}(e_n+\upsilon_n)(|e_n+\upsilon_n|)^{1/2}a^{(n)}$ obtained in the step (5);

(7) calculating the squared norm of the vector $q^{(n)}$ obtained in the step (6); and (8) multiplying the squared norm $\|q^{(n)}\|^2$ obtained in the step (7) by the coefficient $\beta$ and thereby obtaining the step size $\alpha_c^{(n)}=\beta\|q^{(n)}\|^2$.

In accordance with a 17th aspect of the present invention, in the 12th aspect, a vector $q^{(n)}$ and a scalar quantity $|\sigma|^{(n)}$ are calculated one by one according to the following update equations:

$$q^{(n+1)}=(1-\rho)q^{(n)}+\rho\text{sgn}(e_n+\upsilon_n)a^{(n)}$$

$$|\sigma|^{(n+1)}=(1-\rho_\sigma)|\sigma|^{(n)}+\rho_\sigma|e_n+\upsilon_n|$$

where the $\rho$ and $\rho_\sigma$ are leakage coefficients. And the step size $\alpha_c^{(n)}$ at each time n is set as:

$$\alpha_c^{(n)}=\beta'\|q^{(n)}\|^2|\sigma|^{(n)}$$

where $\beta'=\pi/2/\text{trace}(Ra^2)$ where $Ra=E[a^{(n)}a^{(n)T}]$.

In accordance with an 18th aspect of the present invention, in the 17th aspect, the step size control method comprises the steps of:

(1) detecting the sign of the sum of the error signal sequence component $e_n$ and the additive noise sequence component $\upsilon_n$;

(2) calculating the absolute value of the sum $(e_n+\upsilon_n)$;

(3) multiplying the input signal sequence vector $a^{(n)}$ by the sign $\text{sgn}(e_n+\upsilon_n)$ detected in the step (1);

(4) obtaining the vector $q^{(n)}$ according to the update equation using the leakage coefficient $\rho$ and the product vector $\text{sgn}(e_n+\upsilon_n)a^{(n)}$ obtained in the step (3);

(5) calculating the squared norm of the vector $q^{(n)}$ obtained in the step (4);

(6) obtaining the scalar quantity $|\sigma|^{(n)}$ according to the update equation using the leakage coefficient $\rho_\sigma$ and the absolute value $|e_n+\upsilon_n|$ calculated in the step (2);

(7) multiplying the squared norm $\|q^{(n)}\|^2$ calculated in the step (5) by the scalar quantity $|\sigma|^{(n)}$; and (8) multiplying the product $\|q^{(n)}\|^2|\sigma|^{(n)}$ obtained in the step (7) by the coefficient $\beta'$ and thereby obtaining the step size $\alpha_c^{(n)}=\beta'\|q^{(n)}\|^2|\sigma|^{(n)}$.

In accordance with a 19th aspect of the present invention, in the 12th aspect, a vector $q^{(n)}$ is calculated one by one according to the following update equation:

$$q^{(n+1)}=(1-\rho)q^{(n)}+\rho\text{sgn}(e_n+\upsilon_n)a^{(n)}$$

where the $\rho$ is a leakage coefficient. And the step size $\alpha_c^{(n)}$ at each time n is set as:

$$\alpha_c^{(n)}=\beta'\|q^{(n)}\|^2$$

where $\beta'=\pi/2/\text{trace}(Ra^2)$ where $Ra=E[a^{(n)}a^{(n)T}]$.

In accordance with a 20th aspect of the present invention, in the 19th aspect, the step size control method comprises the steps of:

(1) detecting the sign of the sum of the error signal sequence component $e_n$ and the additive noise sequence component $\upsilon_n$;

(2) multiplying the input signal sequence vector $a^{(n)}$ by the sign $\text{sgn}(e_n+\upsilon_n)$ detected in the step (1);

(3) obtaining the vector $q^{(n)}$ according to the update equation using the leakage coefficient $\rho$ and the product vector $\text{sgn}(e_n+\upsilon_n)a^{(n)}$ obtained in the step (2);

(4) calculating the squared norm of the vector $q^{(n)}$ obtained in the step (3); and (5) multiplying the squared norm $\|q^{(n)}\|^2$ obtained in the step (4) by the coefficient $\beta$ and thereby obtaining the step size $\alpha_c^{(n)}=\beta'\|q^{(n)}\|^2$.

In accordance with a 21st aspect of the present invention, in the 12th aspect, a vector $q^{(n)}$ is calculated one by one according to the following update equation:

$$q^{(n+1)}=(1-\rho)q^{(n)}+\rho\text{sgn}(e_n+\upsilon_n)a^{(n)}$$

where the $\rho$ is a leakage coefficient. And the step size $\alpha_c^{(n)}$ at each time n is set as:

$$\alpha_c^{(n)}=\beta''\|q^{(n)}\|^2$$

where $\beta''=(\pi/2)\sigma_a^2 N/\text{trace}(Ra^2)$ where $Ra=E[a^{(n)}a^{(n)T}]$, N is the number of taps, and $\sigma_a^2$ is the power of the input signal sequence $a^{(n)}$.

In accordance with a 22nd aspect of the present invention, in the 21st aspect, the step size control method comprises the steps of:

(1) detecting the sign of the sum of the error signal sequence component $e_n$ and the additive noise sequence component $\upsilon_n$;

(2) multiplying the input signal sequence vector $a^{(n)}$ by the sign $\text{sgn}(e_n+\upsilon_n)$ detected in the step (1);

(3) obtaining the vector $q^{(n)}$ according to the update equation using the leakage coefficient $\rho$ and the product vector $\text{sgn}(e_n+\upsilon_n)a^{(n)}$ obtained in the step (2);

(4) calculating the squared norm of the vector $q^{(n)}$ obtained in the step (3); and (5) multiplying the squared norm $\|q^{(n)}\|^2$ obtained in the step (4) by the coefficient $\beta''$ and thereby obtaining the step size $\alpha_c^{(n)}=\beta''\|q^{(n)}\|^2$.

Further, in accordance with 23rd through 33rd aspects of the present invention, there are provided computer-readable record mediums storing programs for instructing a computer to execute the step size control methods of the 12th through 22nd aspects of the present invention.

BRIEF DESCRIPTION OF THE DRAWINGS

The objects and features of the present invention will become more apparent from the consideration of the following detailed description taken in conjunction with the accompanying drawings, in which:

FIG. 19 is a block diagram showing an example in which the step size control of the adaptive filter of the third embodiment is executed by a microcomputer;

DESCRIPTION OF THE PREFERRED EMBODIMENTS

Figure 1:
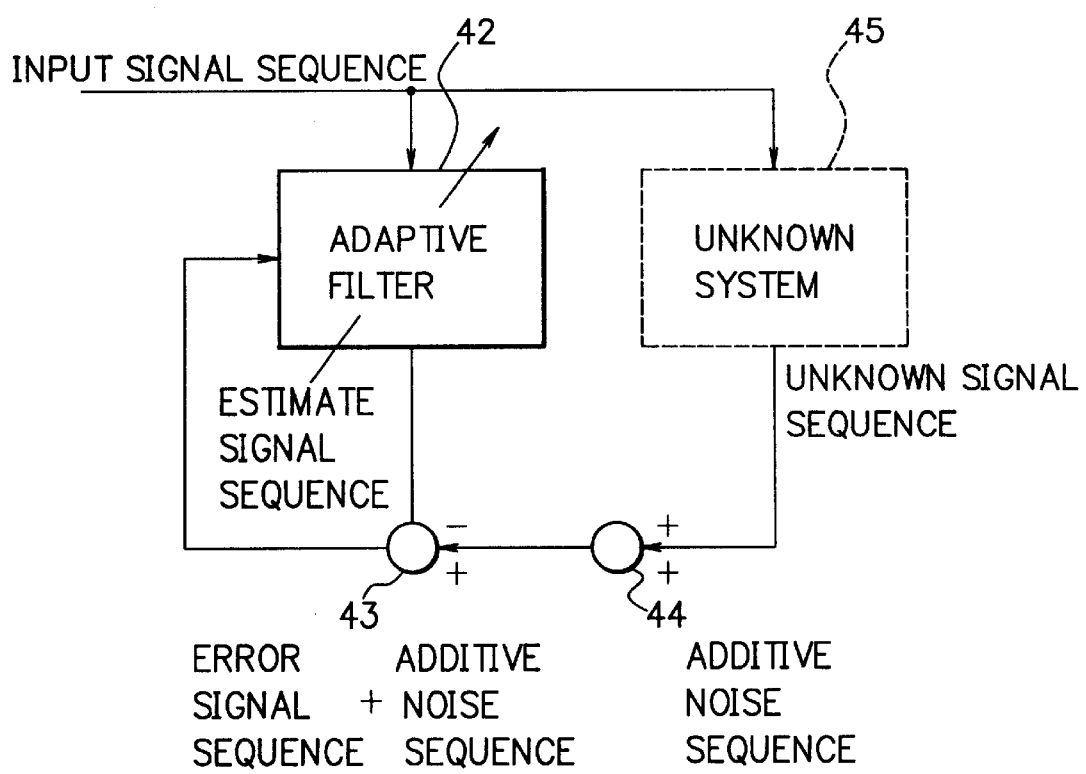
FIG. 1 is a block diagram showing a circuit in which an adaptive filter is used for identifying an unknown system.

Referring now to the drawings, a description will be given in detail of preferred embodiments in accordance with the present invention.

The adaptive filter according to the present invention controls the step size in different way from the conventional adaptive filters. More concretely, approximation of theoretically derived optimum step sizes can be obtained by a step size controller of the adaptive filter according to the present invention.

FIRST EMBODIMENT
(for Stochastic Gradient Algorithm)

In the following, the optimum control of the step size by the adaptive filter according to the first embodiment of the present invention will be explained.

As a preparation to an explanation of the step size control method used by the adaptive filter of the first embodiment, it will be explained first how theoretical optimum step size at each time is determined in the first embodiment. Incidentally, the same symbols as the description of the prior art will be used in the following explanation, in which:

n denotes time, $a_n$ denotes an input signal sequence component at the time n, $\alpha_c^{(n)}$ denotes a step size at the time n, $e_n$ denotes an error signal sequence component at the time n, $v_n$ denotes an additive noise sequence component at the time n, $c_k^{(n)}$ denotes the k-th tap weight at the time n (k: 0, 1, ..., N−1), $c^{(n)}=[c_0^{(n)}, c_1^{(n)}, \ldots, c_{N-1}^{(n)}]^T$ denotes a tap weight vector at the time n, and $a^{(n)}=[a_n, a_{n-1}, \ldots, a_{n-N+1}]^T$ denotes an input signal sequence vector at the time n.

Here, using the tap weight vector $c^{(n)}$, we define the following tap weight error vector:

$$\theta^{(n)}=h-c^{(n)}$$

where h is an N-dimensional response vector of the unknown system to be identified, in which N is the number of taps.

The tap weight error vector $\theta^{(n)}$ is updated according to the following equation:

$$\theta^{(n+1)}=\theta^{(n)}-\alpha_c^{(n)}f(e_n+v_n)g(a^{(n)})$$

where the notation $g(a^{(n)})$ denotes a vector $[g(a_n), g(a_{n-1}), \ldots, g(a_{n-N+1})]^T$. Here, the second moment matrix of the tap weight error vector $\theta^{(n)}$ is defined as $$K^{(n)}=E[\theta^{(n)}\theta^{(n)T}]$$

where E[ ] denotes the expected value of [ ]. According to the above update equation for $\theta^{(n+1)}$, the following difference equation holds with regard to the second moment matrix $K^{(n)}$:

$$K^{(n+1)}=K^{(n)}-\alpha_c^{(n)}(V_1^{(n)}+V_1^{(n)T})+\alpha_c^{(n)2}T_1^{(n)}$$

where $V_1^{(n)}$ and $T_1^{(n)}$ are matrixes given by the following equations.

$$V_1^{(n)}=E[f(e_n+\upsilon_n)g(a^{(n)})\theta^{(n)T}]$$

$$T_1^{(n)}=E[f^2(e_n+\upsilon_n)g(a^{(n)})g(a^{(n)})^T]$$

The MSE (mean squared estimation error) $\epsilon^{(n)}$ at the time n is obtained by the following equation:

$$\epsilon^{(n)}=E[e_n^2]=\text{trace}(RaK^{(n)})$$

where $Ra=E[a^{(n)}a^{(n)T}]$ is the covariance matrix (or correlation matrix) of the input signal sequence vector $a^{(n)}$ and trace(A) denotes the sum of diagonal components of the matrix A.

In order to obtain a step size $\alpha_c^{(n)}$ at the time n by which $\epsilon^{(n+1)}$ can be made the smallest, the following partial derivative of the $\epsilon^{(n+1)}$ is obtained with respect to the step size $\alpha_c^{(n)}$:

$$\delta\epsilon^{(n+1)}/\delta\alpha_c^{(n)} = \text{trace}(Ra\delta K^{(n+1)}/\delta\alpha_c^{(n)})$$
$$= \text{trace}\{Ra(-(V_1^{(n)}+V_1^{(n)T})+2\alpha_c^{(n)}T_1^{(n)})\}.$$

By setting the partial derivative at zero, the theoretical optimum value $\alpha_c^{(n)}{}_{opt}$ of the step size $\alpha_c^{(n)}$ at the time n is obtained as:

$$\alpha_c^{(n)}{}_{opt}=\text{trace}(RaV_1^{(n)})/\text{trace}(RaT_1^{(n)}).$$

When the value of $\theta^{(n)}$ is given, the following equation approximately holds with regard to an expected value with respect to the input signal sequence vector $a^{(n)}$.

$$E_a[f(e_n+\upsilon_n)g(a^{(n)})|\theta^{(n)}]\approx W^{(n)}\theta^{(n)}$$

In the above equation, $W^{(n)}=Ra$ in the case of the LMS algorithm, and $W^{(n)}=(2/\pi)^{1/2}Ra/\sigma_a$ in the case of the signed regressor algorithm ($\sigma_a^2$ is the power of the input signal sequence $\{a_n\}$). Thus, the following equation approximately holds with regard to the matrix $V_1^{(n)}$.

$$V_1^{(n)}\approx W^{(n)}K^{(n)}$$

Thus, the theoretical optimum step size $\alpha_c^{(n)}{}_{opt}$ can be expressed as:

$$\alpha_c^{(n)}{}_{opt}\approx\text{trace}(Ra\ W^{(n)}K^{(n)})/\text{trace}(Ra\ T_1^{(n)}).$$

Therefore, the step size controller employed in the adaptive filter of the first embodiment generates the step size $\alpha_c^{(n)}$ as follows:

$$\alpha_c^{(n)}=q_0^{(n)T}q^{(n)}/\tau^{(n)}$$

where the $q_0^{(n)T}q^{(n)}$ is the inner product of the vectors $q_0^{(n)}$ and $q^{(n)}$, and the vectors $q_0^{(n)}$ and $q^{(n)}$ and the scalar quantity $\tau^{(n)}$ are calculated one by one by corresponding leakage accumulators according to the following update equations:

$$q_0^{(n+1)}=(1-\rho_0)q_0^{(n)}+\rho_0(e_n+\upsilon_n)a^{(n)}$$

$$q^{(n+1)}=(1-\rho)q^{(n)}+\rho f(e_n+\upsilon_n)g(a^{(n)})$$

$$\tau^{(n+1)}=(1-\rho_\tau)\tau^{(n)}+\rho_\tau\{a^{(n-L)T}f(e_n+\upsilon_n)g(a^{(n)})\}^2$$

where the $\rho_0$, $\rho$ and $\rho_\tau$ are leakage coefficients, and the delay time length L is set sufficiently large so that $E[a^{(n-L)T}a^{(n)}]$ will be approximately zero.

When the step size $\alpha_c^{(n)}$ is generated as above, it can be proven that the following equations hold:

$$E[q_0^{(n)T}q^{(n)}]=\text{trace}(Ra\ W^{(n)}K^{(n)})$$

$$E[\tau^{(n)}]=\text{trace}(Ra\ T_1^{(n)})$$

Therefore, the following equation holds.

$$E[\alpha_c^{(n)}]\approx\alpha_c^{(n)}{}_{opt}$$

That is, the step size $\alpha_c^{(n)}$ employed in the first embodiment is approximately equal to the theoretical optimum step size $\alpha_c^{(n)}{}_{opt}$ at each time n.

Figure 3:
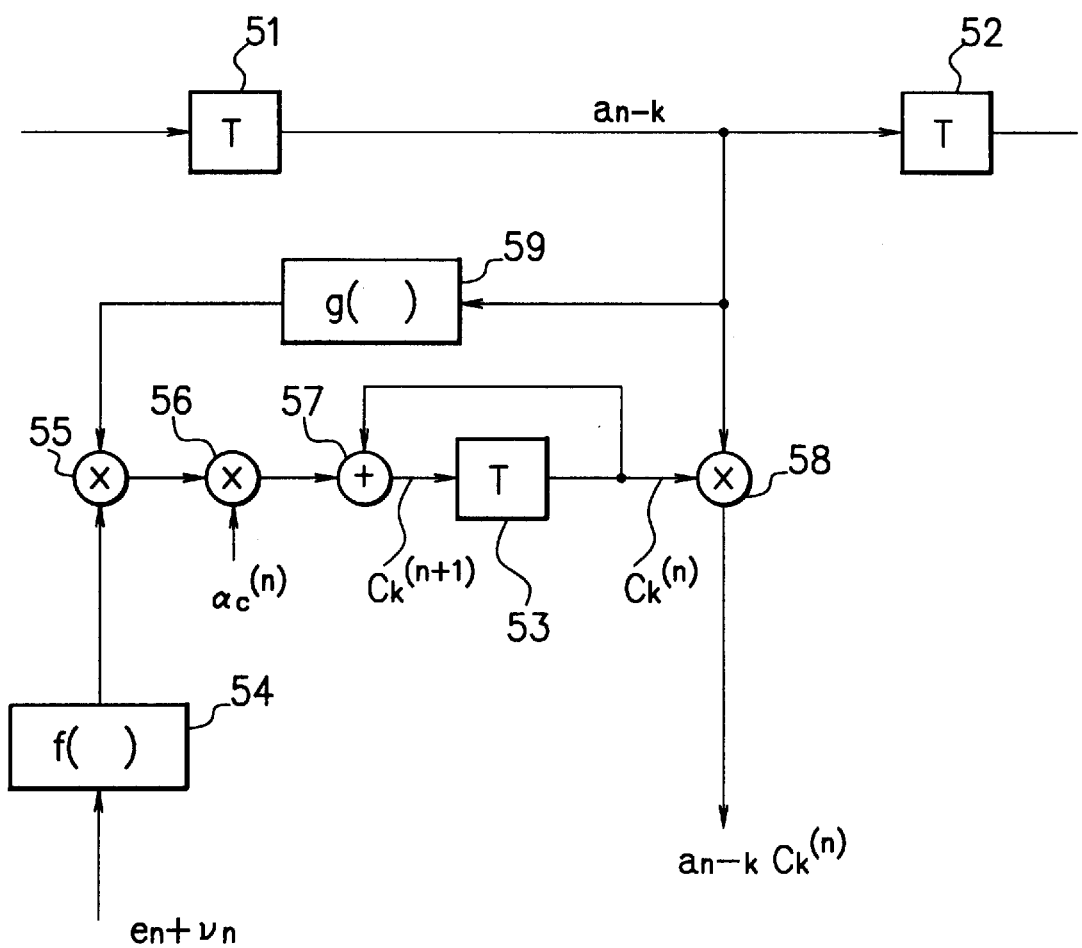
FIG. 3 is a block diagram showing another example of composition of part of an adaptive filter which employs stochastic gradient algorithm as tap weight control algorithm.
Figure 5:
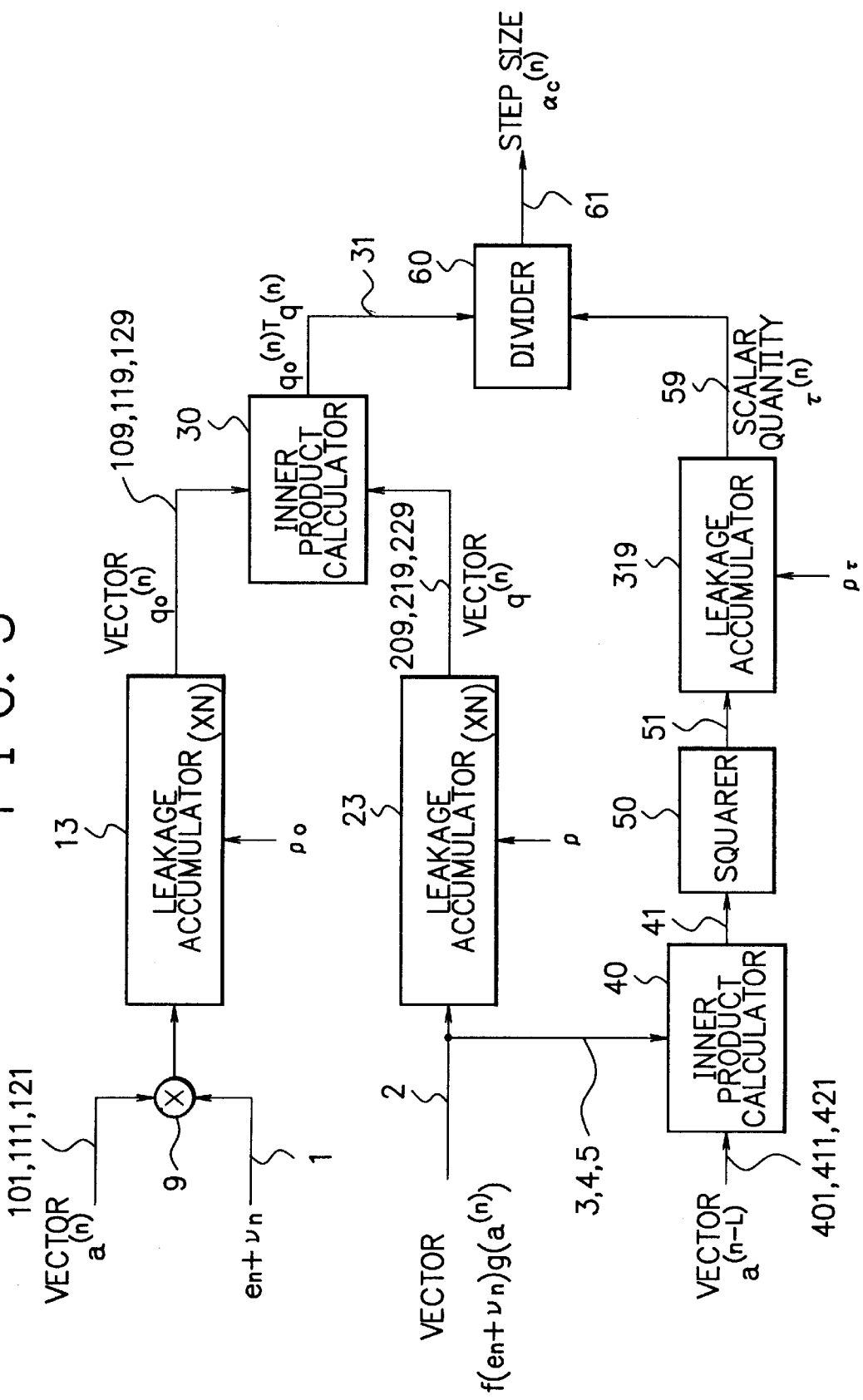
FIG. 5 is a block diagram showing a step size controller employed in an adaptive filter according to the first embodiment of the present invention.
Figure 6:
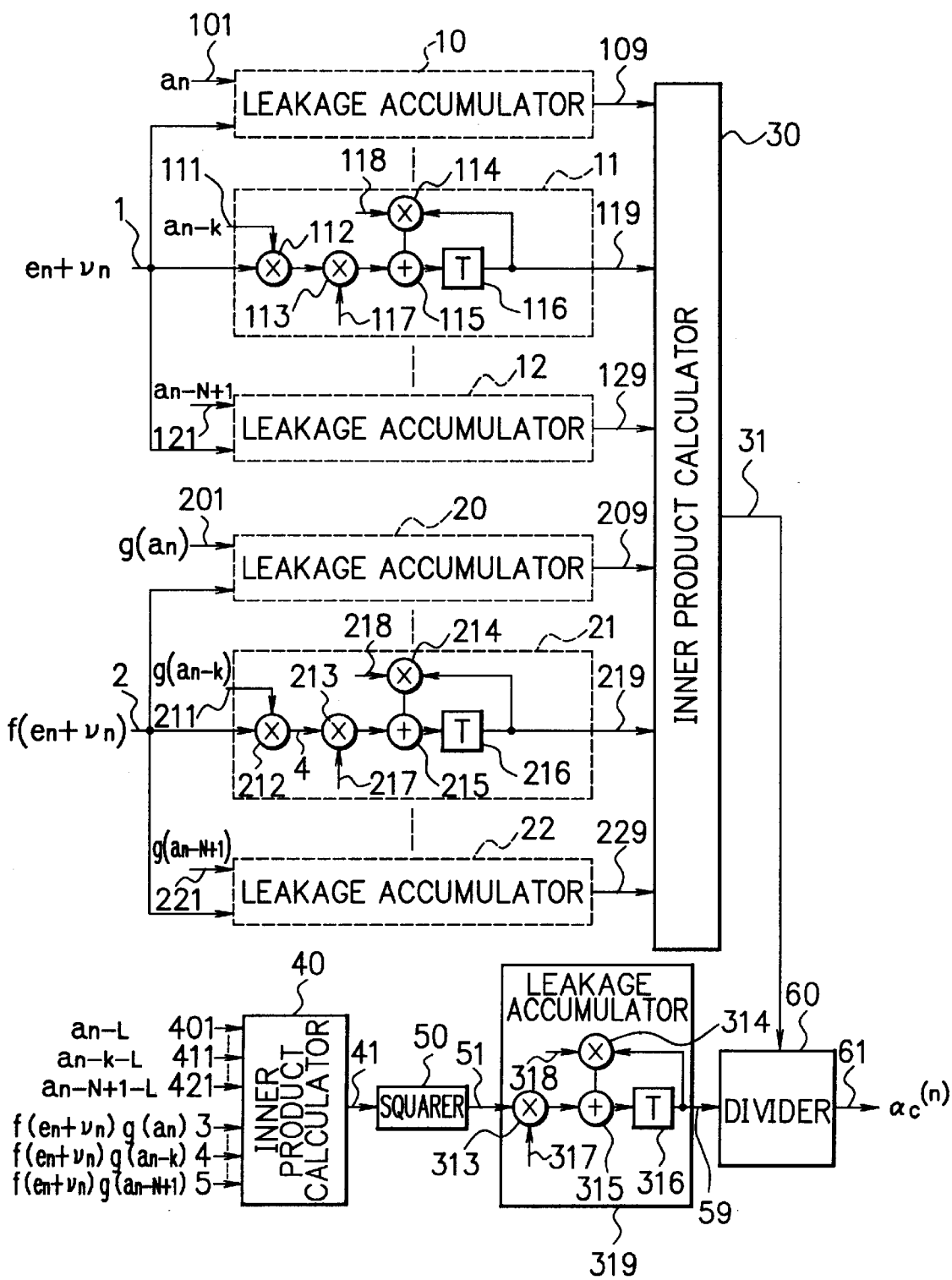
FIG. 6 is a block diagram showing detailed composition of FIG. 5.

In the following, an adaptive filter according to the first embodiment will be described referring to FIG. 5 through FIG. 9. FIG. 5 is a block diagram showing a step size controller employed in the adaptive filter of the first embodiment. FIG. 6 is a block diagram showing detailed composition of FIG. 5. The adaptive filter of the first embodiment is realized as an FIR (Finite Impulse Response) filter (i.e. non-recursive filter). N pieces of tap weights: $\{c_0^{(n)}, c_1^{(n)}, \ldots, C_{N-1}^{(n)}\}$ are controlled in the adaptive filter using the $(e_n+\upsilon_n)$, in which the k-th tap weight $C_k^{(n)}$ is controlled by, for example, a circuit shown in FIG. 3. The resultant output obtained by the adaptive filter is the sum of outputs of such circuits corresponding to each k. In FIG. 5 and FIG. 6, the inner product calculators 30 and 40 are calculators for obtaining the inner product of two vectors (i.e. the sum of products of corresponding components of the two vectors). Each of the vector $q_0^{(n)}$ and the vector $q^{(n)}$ is composed of N components, and thus the number of leakage accumulator which are necessary in FIG. 5 or FIG. 6 is 2N+1.

The step size controller shown in FIG. 5 and FIG. 6 comprises a multiplier 9 for multiplying the input signal sequence vector $a^{(n)}$ by the sum of the error signal sequence component $e_n$ and the additive noise sequence component $\upsilon_n$ (i.e. $(e_n+\upsilon_n)$), a leakage accumulator 13 composed of N pieces of leakage accumulators for obtaining components of the vector $q_0^{(n)}$ (in which only leakage accumulators 10, 11, 12 are shown), a leakage accumulator 23 composed of N pieces of leakage accumulators for obtaining components of the vector $q^{(n)}$ (in which only leakage accumulators 20, 21, 22 are shown), an inner product calculator 30 for obtaining the inner product of the vector $q_0^{(n)}$ and the vector $q^{(n)}$, an inner product calculator 40 for obtaining the inner product $a^{(n-L)T}f(e_n+\upsilon_n)g(a^{(n)})$, a squarer 50 for obtaining the square of the inner product outputted by the inner product calculator 40, a leakage accumulator 319 for obtaining the scalar quantity $\tau^{(n)}$, and a divider 60 for dividing the inner product $q_0^{(n)T}q^{(n)}$ supplied from the inner product calculator 30 by the scalar quantity $\tau^{(n)}$ supplied from the leakage accumulator 319 and thereby outputting the step size $\alpha_c^{(n)}=q_0^{(n)T}q^{(n)}/\tau^{(n)}$.

In FIG. 5 and FIG. 6, the reference number 1 denotes $(e_n+\upsilon_n)$ and the reference number 2 denotes $f(e_n+\upsilon_n)$. The reference numbers 101, 111 and 121 denote $a_n$, $a_{n-k}$ and $a_{n-N+1}$, and the reference numbers 201, 211 and 221 denote $g(a_n)$, $g(a_{n-k})$ and $g(a_{n-N+1})$, respectively. The reference numbers 109, 119, 129, 209, 219 and 229 denote outputs of the leakage accumulators 10, 11, 12, 20, 21 and 22, respectively. The inner product calculator 30 calculates the inner product of the vector [109, . . . , 119, . . . , 129] and the vector [209, . . . , 219, . . . , 229].

In the leakage accumulator 11 for example, the reference numbers 112, 113 and 114 denote multipliers, the reference number 115 C; denotes an adder, the reference number 116 denotes a delay unit for delaying input signals by a predetermined time, the reference numbers 117 and 118 denote the leakage coefficient $\rho_0$ and its complement $(1-\rho_0)$. Therefore, the multiplier 9 shown in FIG. 5 is representing N pieces of multipliers 112 in the leakage accumulators 10, ..., 11, ..., 12 shown in FIG. 6.

In the leakage accumulator 21 for example, the reference numbers 212, 213 and 214 denote multipliers, the reference number 215 denotes an adder, the reference number 216 denotes a delay unit for delaying input signals by a predetermined time, the reference numbers 217 and 218 denote the leakage coefficient $\rho$ and its complement $(1-\rho)$.

In the leakage accumulator 319, the reference numbers 313 and 314 denote multipliers, the reference number 315 denotes an adder, the reference number 316 denotes a delay unit for delaying input signals by a predetermined time, the reference numbers 317 and 318 denote the leakage coefficient $\rho_\tau$ and its complement $(1-\rho_\tau)$ With regard to the inner product calculator 40, the reference numbers 401, 411 and 421 denote $a_{n-L}$, $a_{n-k-L}$ and $a_{n-N+1-L}$ respectively (the $a_n$, $a_{n-k}$ and $a_{n-N+1}$ delayed by L), and the reference numbers 3, 4 and 5 denote $f(e_n+\upsilon_n)g(a_n)$, $f(e_n+\upsilon_n)g(a_{n-k})$ and $f(e_n+\upsilon_n)g(a_{n-N+1})$ respectively. Here, the signal 4 (i.e. $f(e_n+\upsilon_n)g(a_{n-k})$) can be obtained as the output of the multiplier 212 in the leakage accumulator 21, for example. The inner product calculator 40 calculates the inner product of the vector [401, ..., 411, ..., 421] and the vector [3, ..., 4, ..., 5]. The squarer 50 squares the output 41 of the inner product calculator 40 and supplies the squared value 51 to the leakage accumulator 319, and the scalar quantity $\tau^{(n)}$ is obtained by the leakage accumulator 319.

In the divider 60, the inner product $q_0^{(n)T}q^{(n)}$ obtained by the inner product calculator 30 is divided by the scalar quantity $\tau^{(n)}$ obtained by the leakage accumulator 319, and the quotient 61 is outputted as the step size $\alpha_c^{(n)}$.

Figure 7:
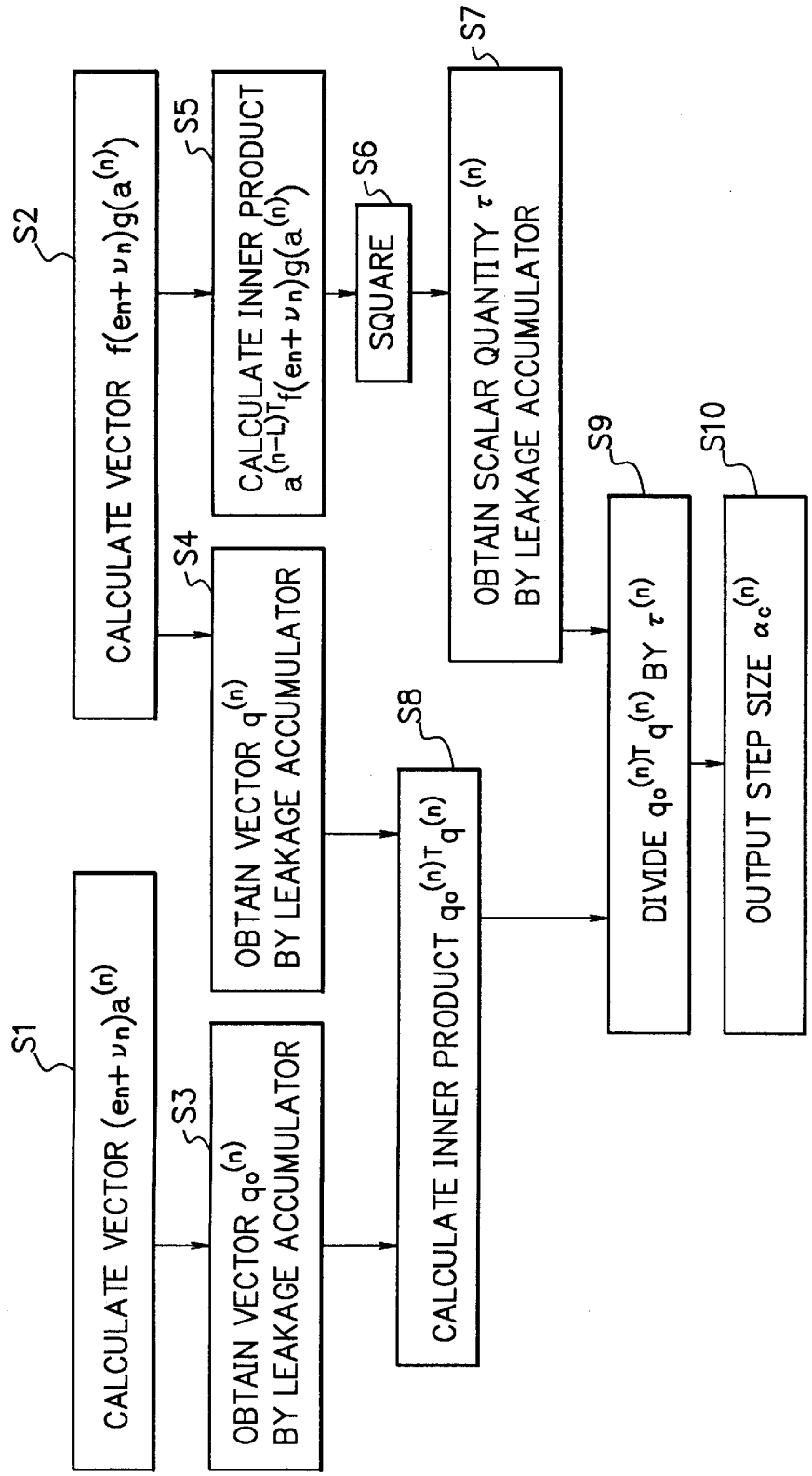
FIG. 7 is a flow chart showing the operation of the step size controller of FIG. 5 and FIG. 6.

FIG. 7 is a flow chart showing the operation of the step size controller of FIG. 5 and FIG. 6. First, a vector $(e_n+\upsilon_n)a^{(n)}$ is calculated in step S1 and a vector $f(e_n+\upsilon_n)g(a^{(n)})$ is calculated in step S2. Subsequently, the vector $q_0^{(n)}$ is obtained by the leakage accumulators 10, ..., 11, ..., 12 (step S3) and the vector $q^{(n)}$ is obtained by the leakage accumulators 20, ..., 21, ..., 22 (step S4). Meanwhile, the inner product of the vector $a^{(n-L)}$ and the vector $f(e_n+\upsilon_n)g(a^{(n)})$ which has been obtained in the step S2 is calculated by the inner product calculator 40 (step S5), and the inner product 41 is squared by the squarer 50 (step S6), and the scalar quantity $\tau^{(n)}$ is obtained by the leakage accumulator 319 (step S7). The inner product of the vector $q_0^{(n)}$ obtained in the step S3 and the vector $q^{(n)}$ obtained in the step S4 is calculated by the inner product calculator 30 (step S8). Then, the step size $\alpha_c^{(n)}$ is obtained by the divider 60 by dividing the inner product $q_0^{(n)T}q^{(n)}$ by the scalar quantity $\tau^{(n)}$ (step S9), and the obtained step size $\alpha_c^{(n)}$ is outputted (step S10).

Figure 8:
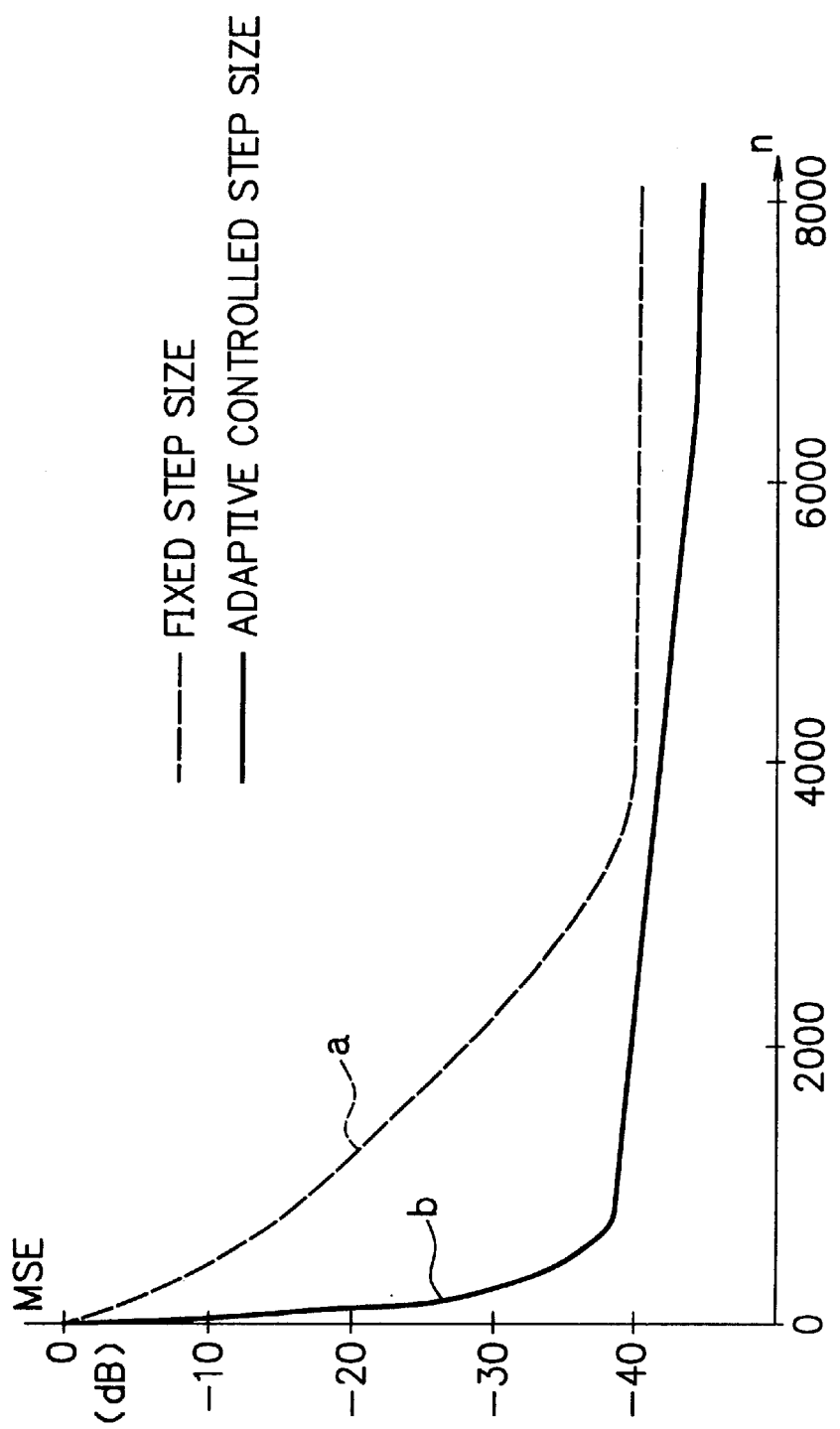
FIG. 8 is a graph showing a simulation result of the adaptive filter of the first embodiment.

FIG. 8 is a graph showing a simulation result of the adaptive filter of the first embodiment. The simulation was executed on the supposition that the input signal sequence follows white Gaussian process and the additive noise is Gaussian noise. The stochastic gradient signed regressor algorithm was adopted for example as the tap weight control algorithm of the adaptive filter. The following parameters were used as typical values.

The number of taps:
N=4
The response vector of the unknown system:
h=[0.05, 0.994, 0.01, −0.1]$^T$
The power of the input signal sequence:
$\sigma_a^2$=1 (0 dB)
The power of the additive noise:

$\sigma_\upsilon^2$=0.01 (−20 dB)

In FIG. 8, the broken line 'a' is showing convergence of the MSE (mean squared estimation error) $\epsilon^{(n)}$ in the case where a fixed step size $\alpha_c=2^{-8}$ was employed, and the solid line 'b' is showing convergence of the MSE in the case of the adaptive filter of the first embodiment in which leakage coefficients $\rho_0=\rho=2^{-8}$ and $\rho_\tau=2^{-10}$ were used. As shown in the solid line 'b' in FIG. 8, convergence speed is remarkably improved, and the MSE after convergence is also lowered by the adaptive filter of the first embodiment. Incidentally, it is theoretically known that the convergence speed gets faster and meanwhile the MSE after convergence gets larger when the leakage coefficients $\rho_0$, $\rho$ and $\rho_\tau$ are set larger.

As is evident from the simulation result, according to the adaptive filter of the first embodiment, the step size $\alpha_c^{(n)}$ is controlled so that the MSE $\epsilon^{(n)}$ will be approximately the smallest at each time n and thereby both higher convergence speed and lower residual MSE after convergence can be attained. Incidentally, although the stochastic gradient signed regressor algorithm was adopted as the tap weight control algorithm in the simulation of FIG. 8 for example, the step size control method of the first embodiment can also be applied generally to other stochastic gradient algorithms and the same effects can be obtained.

Figure 9:
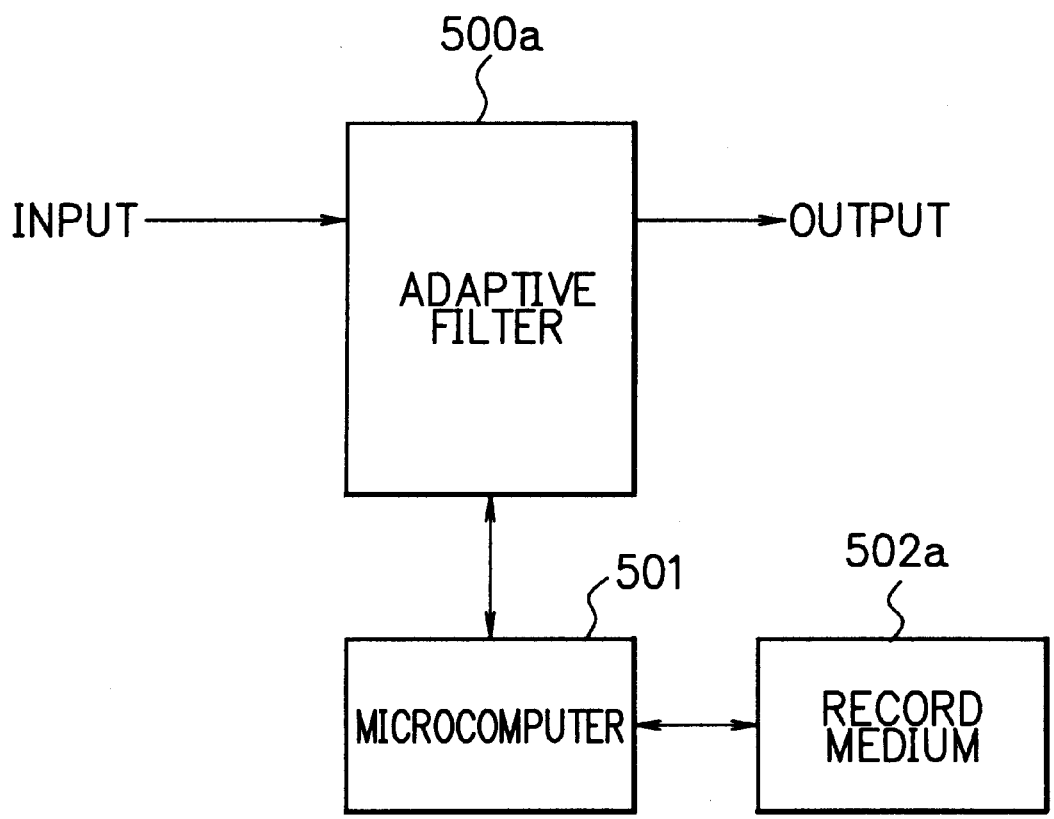
FIG. 9 is a block diagram showing an example in which the step size control of the adaptive filter of the first embodiment is executed by a microcomputer.

FIG. 9 is a block diagram showing an example in which the step size control of the adaptive filter of the first embodiment is executed by a microcomputer. Referring to FIG. 9, the step size $\alpha_c^{(n)}$ of the adaptive filter 500a is controlled by the microcomputer 501. The microcomputer 501 is provided with functions for executing the process shown in FIG. 5, FIG. 6 and FIG. 7. A program for controlling the process is stored in a record medium 502a and the microcomputer 501 executes the process according to the program. As the record medium 502a, a ROM (Read Only Memory), a RAM (Random Access Memory), a flash memory, a memory card, an optical memory disk, a magneto-optical disk, a magnetic recording medium, etc. can be used. Incidentally, the adaptive filter of the first embodiment with the adaptive controlled step size can also be realized by a specific DSP (Digital Signal Processor), an ASIC (Application Specific Integrated Circuit), etc.

As described above, according to the first embodiment, the step size of the adaptive filter employing the stochastic gradient algorithms is controlled to be approximately the same as the theoretically derived optimum step size, thereby both faster convergence of the adaptive filter and smaller residual mean squared estimation error after convergence can be attained.

SECOND EMBODIMENT
(for Stochastic Gradient Sign Algorithm)

The step size control method of the first embodiment could be applied generally to the stochastic gradient algorithms (stochastic gradient LMS algorithm, stochastic gradient normalized LMS algorithm, stochastic gradient signed regressor algorithm, stochastic gradient sign algorithm, stochastic gradient sign-sign algorithm, etc.). In the following, an adaptive filter according to the second embodiment of the present invention will be described. Step size control method of the adaptive filter of the second embodiment specifically employs the stochastic gradient sign algorithm as the tap weight control algorithm.

As a preparation to an explanation of the step size control method of the adaptive filter of the second embodiment, it will be explained first how theoretical optimum step size at each time is determined in the second embodiment. Incidentally, the same symbols as the description of the first embodiment will be used in the following explanation, in which:

n denotes time, $a_n$ denotes an input signal sequence component at the time n, $\alpha_c^{(n)}$ denotes a step size at the time n, $e_n$ denotes an error signal sequence component at the time n, $\upsilon_n$ denotes an additive noise sequence component at the time n, $c_k^{(n)}$ denotes the k-th tap weight at the time n (k: 0, 1, . . . N−1), $c^{(n)}=[c_0^{(n)}, c_1^{(n)}, \ldots, c_{N-1}^{(n)}]^T$ denotes a tap weight vector at the time n, $a^{(n)}=[a_n, a_{n-1}, \ldots, a_{n-N+1}]^T$ denotes an input signal sequence vector at the time n, $\theta^{(n)}=h-c^{(n)}$ denotes a tap weight error vector, in which h is an N-dimensional response vector of the unknown system to be identified and N is the number of taps.

The tap weight error vector $\theta^{(n)}$ in the second embodiment employing the stochastic gradient sign algorithm ($f(e_n+\upsilon_n)=\text{sgn}(e_n+\upsilon_n)$, $g(a^{(n)})=a^{(n)}$) is updated according to the following equation:

$$\theta^{(n+1)}=\theta^{(n)}-\alpha_c^{(n)}\text{sgn}(e_n+\upsilon_n)a^{(n)}.$$

Here, the second moment matrix of the tap weight error vector $\theta^{(n)}$ is defined as $$K^{(n)}=E[\theta^{(n)}\theta^{(n)T}].$$

According to the above update equation for $\theta^{(n+1)}$, the following difference equation holds with regard to the second moment matrix $K^{(n)}$:

$$K^{(n+1)}=K^{(n)}-\alpha_c^{(n)}(V_2^{(n)}+V_2^{(n)T})+\alpha_c^{(n)2}Ra$$

where $V_2^{(n)}$ is a matrix given by the following equation:

$$V_2^{(n)}=E[\text{sgn}(e_n+\upsilon_n)a^{(n)}\theta^{(n)T}]$$

and $$Ra=E[a^{(n)}a^{(n)T}]$$

where $Ra=E[a^{(n)}a^{(n)T}]$ is the covariance matrix (or correlation matrix) of the input signal sequence vector $a^{(n)}$ on the assumption of Gaussian process.

The MSE (mean squared estimation error) $\epsilon^{(n)}$ at the time n is obtained by the following equation:

$$\epsilon^{(n)}=E[e_n^2]=\text{trace}(RaK^{(n)})$$

where trace(A) denotes the sum of diagonal components of the matrix A.

In order to obtain a step size $\alpha_c^{(n)}$ at the time n by which $\epsilon^{(n+1)}$ can be made the smallest, the following partial derivative of the $\epsilon^{(n+1)}$ is obtained with respect to the step size $\alpha_c^{(n)}$:

$$\delta\epsilon^{(n+1)}/\delta\alpha_c^{(n)} = \text{trace}(Ra\delta K^{(n+1)}/\delta\alpha_c^{(n)})$$
$$= \text{trace}\{Ra(-(V_2^{(n)}+V_2^{(n)T})+2\alpha_c^{(n)}Ra)\}.$$

By setting the partial derivative at zero, the theoretical optimum value $\alpha_c^{(n)}{}_{opt}$ of the step size $\alpha_c^{(n)}$ at the time n is obtained as:

$$\alpha_c^{(n)}{}_{opt}=\text{trace}(RaV_2^{(n)})/\text{trace}(Ra^2).$$

When the value of $\theta^{(n)}$ is given, the following equation approximately holds with regard to the expected value with respect to the input signal sequence vector $a^{(n)}$:

$$E_a[\text{sgn}(e_n+\upsilon_n)a^{(n)}|\theta^{(n)}]\fallingdotseq\{2/\rho/(\epsilon^{(n)}+\sigma_\upsilon^2)\}^{1/2}Ra\theta^{(n)}$$

where $\sigma_\upsilon^2$ is the power of the additive noise. Thus, the following equation approximately holds with regard to the matrix $V_2^{(n)}$.

$$V_2^{(n)}\fallingdotseq\{2/\pi/(\epsilon^{(n)}+\sigma_\upsilon^2)\}^{1/2}Ra\ K^{(n)}$$

Therefore, the theoretical optimum step size $\alpha_c^{(n)}{}_{opt}$ can be expressed as:

$$\alpha_c^{(n)}{}_{opt}\fallingdotseq\{2/\pi/(\epsilon^{(n)}+\sigma_\upsilon^2)\}^{1/2}\text{trace}(Ra^2K^{(n)})/\text{trace}(Ra^2)$$

The theoretical optimum step size $\alpha_c^{(n)}{}_{opt}$ can also be expressed as:

$$\alpha_c^{(n)}{}_{opt}\fallingdotseq\{(2/\pi)^{1/2}/\text{trace}(Ra^2)\}\cdot\text{trace}(Ra^2K^{(n)})/\{(\epsilon^{(n)}+\sigma_\upsilon^2)^{1/4}\}^2$$

where the coefficient $(2/\pi)^{1/2}/\text{trace}(Ra^2)$ in front of the $\text{trace}(Ra^2K^{(n)})$ is a coefficient independent of the time n.

Therefore, the step size controller employed in the adaptive filter of the second embodiment generates the step size $\alpha_c^{(n)}$ as follows:

$$\alpha_c^{(n)}=\beta\|q^{(n)}\|^2$$

where the $\|q^{(n)}\|^2$ is the squared norm of the vector $q^{(n)}$ and the vector $q^{(n)}$ is calculated one by one by leakage accumulators according to the following update equation:

$$q^{(n+1)}=(1-\rho)q^{(n)}+\rho\text{sgn}(e_n+\upsilon_n)(|e_n+\upsilon_n|)^{1/2}a^{(n)}$$

where the $\rho$ is a leakage coefficient. And the aforementioned coefficient $\beta$ is expressed as:

$$\beta = (\pi/2)^{1/2}/\Gamma^2(5/4)/\text{trace}(Ra^2)$$
$$= 1.07870520/\text{trace}(Ra^2)$$

where the $\Gamma(x)$ is the gamma function.

When the step size $\alpha_c^{(n)}$ is generated as above, it can be proven that the following equation holds:

$$E[\|q^{(n)}\|^2]\fallingdotseq\gamma^2\text{trace}(Ra^2K^{(n)})/\{(\epsilon^{(n)}+\sigma_\upsilon^2)^{1/4}\}^2$$

where $\gamma=(2/\pi)^{1/2}2^{1/4}\Gamma(5/4)=0.86003999$. Therefore, the following equation holds.

$$E[\alpha_c^{(n)}]\fallingdotseq\alpha_c^{(n)}{}_{opt}$$

That is, the step size $\alpha_c^{(n)}$ employed in the second embodiment is approximately equal to the theoretical optimum step size $\alpha_c^{(n)}{}_{opt}$ at each time n.

In order to generate the step size $\alpha_c^{(n)}$, the value of the coefficient $\beta$ in the above equation $\alpha_c^{(n)}=\beta\|q^{(n)}\|^2$ has to be obtained, and the value of the $\text{trace}(Ra^2)$ is necessary for this. Here, the covariance matrix Ra of the input signal sequence vector $a^{(n)}$ is known, since it has been assumed that the input signal sequence supplied to the filter is known. If the covariance matrix Ra is not known, the following update equation can be used for obtaining the $\text{trace}(Ra^2)$:

$$\tau^{(n+1)}=(1-\rho_\tau)\tau^{(n)}+\rho_\tau(a^{(n-L)T}a^{(n)})^2$$

where the $\rho_\tau$ is a leakage coefficient which is small enough, and the delay time length L is set sufficiently large so that $E[a^{(n-L)T}a^{(n)}]$ will be approximately zero. The $\tau^{(n)}$ is known to converge on $E[(a^{(n-L)T}a^{(n)})^2]=\text{trace}(Ra^2)$ after a sufficient time.

Figure 2:
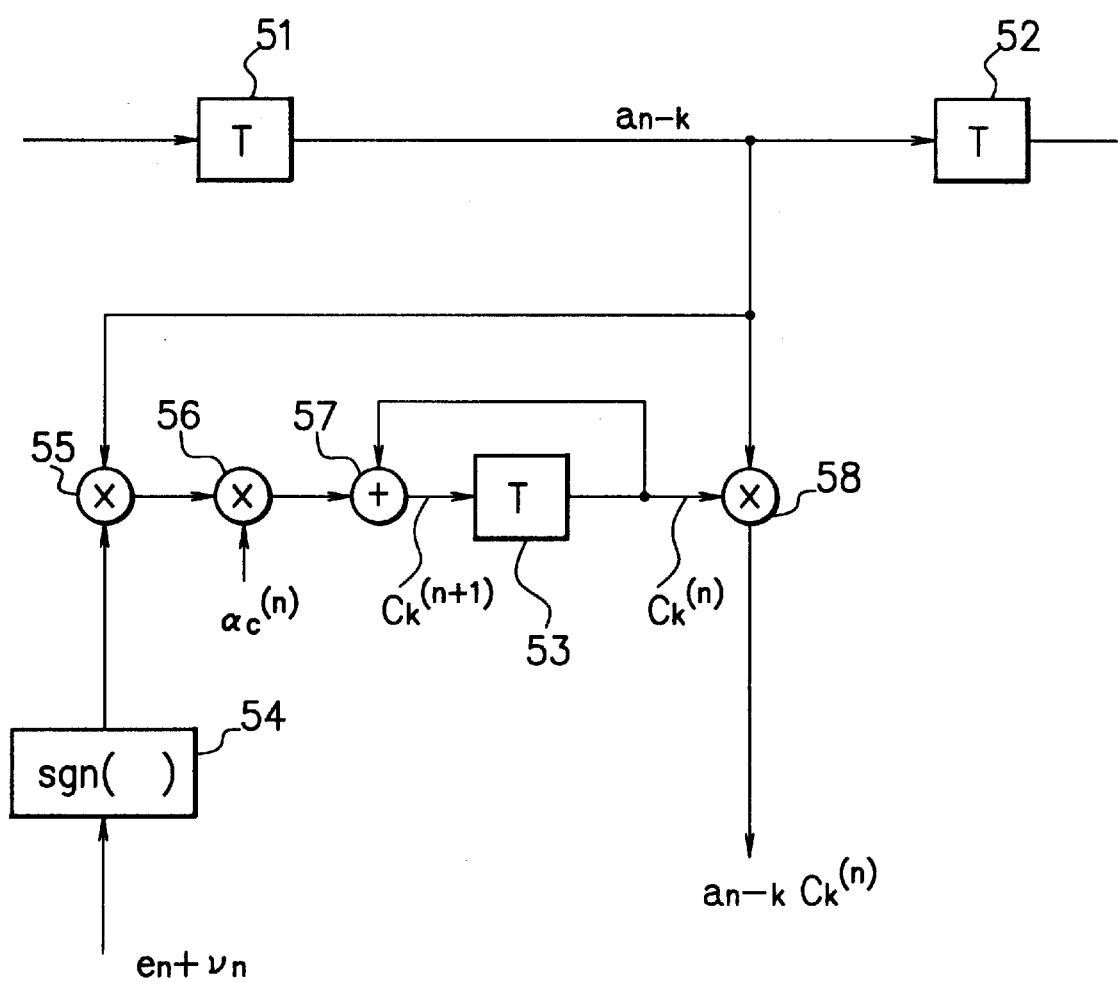
FIG. 2 is a block diagram showing an example of composition of part of an adaptive filter which employs stochastic gradient sign algorithm as tap weight control algorithm.
Figure 10:
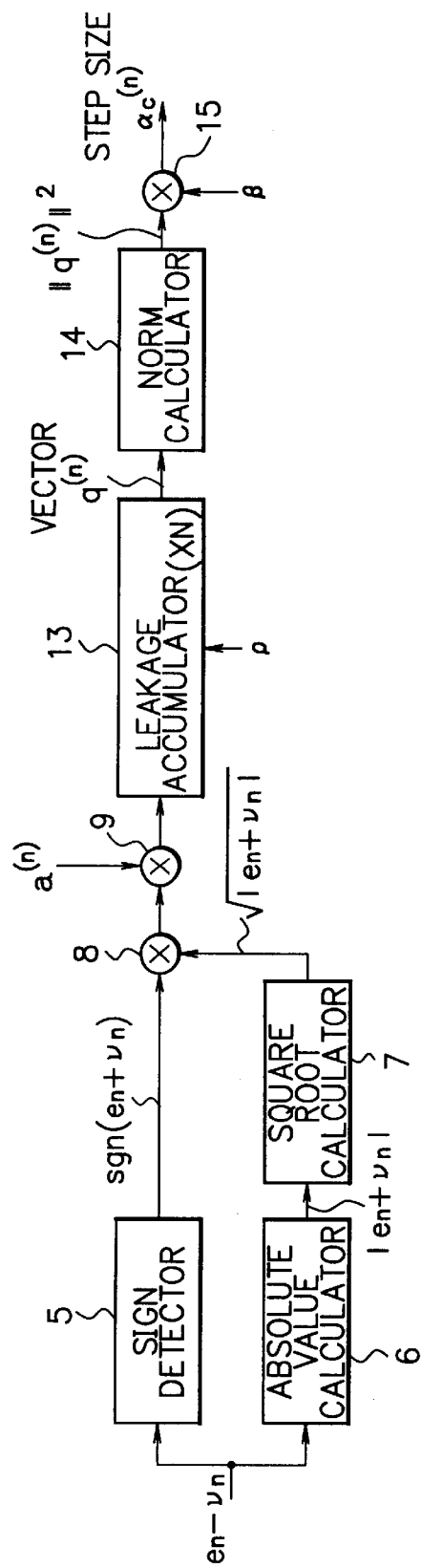
FIG. 10 is a block diagram showing a step size controller employed in an adaptive filter according to the second embodiment of the present invention.
Figure 11:
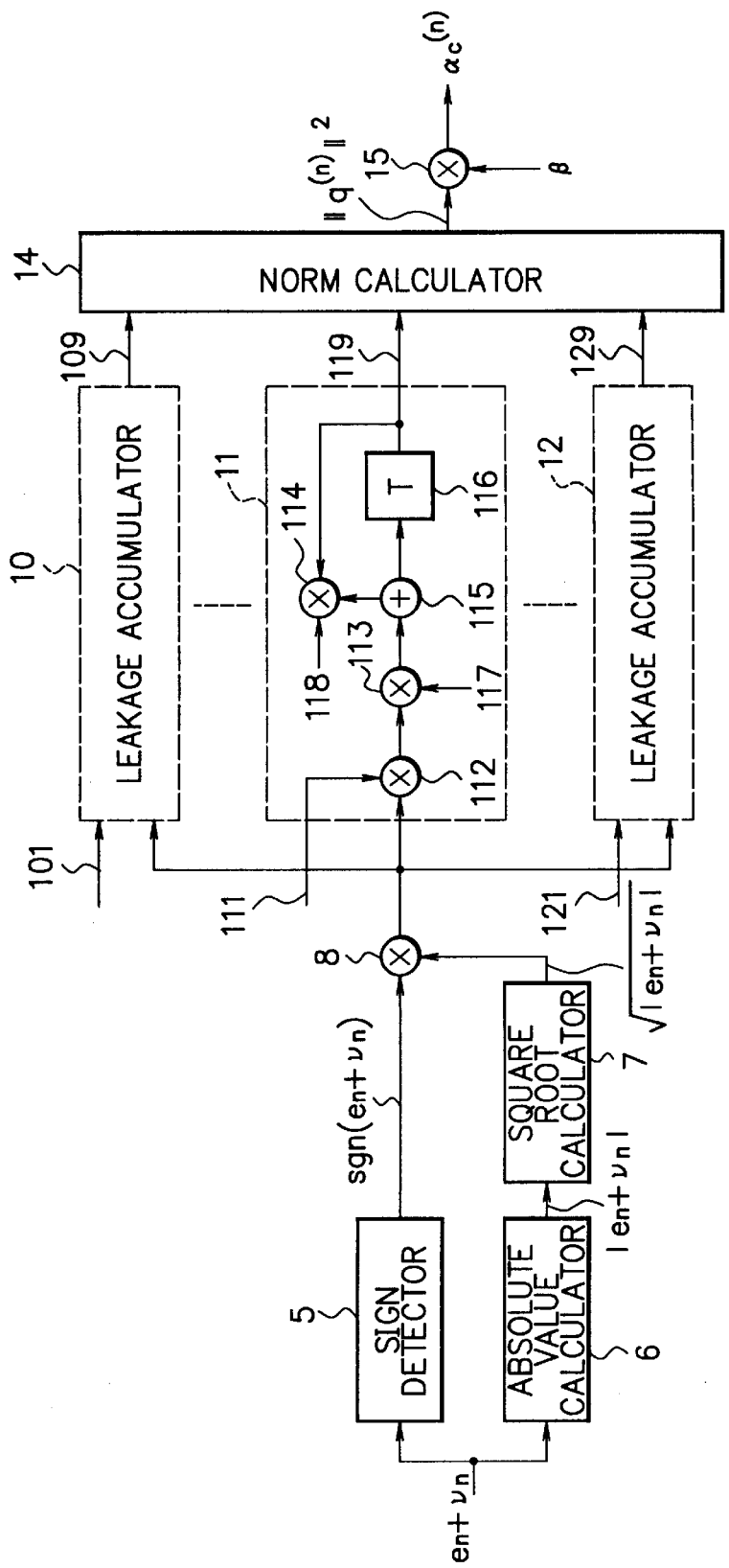
FIG. 11 is a block diagram showing detailed composition of FIG. 10.

In the following, an adaptive filter according to the second embodiment will be described referring to FIG. 10 through FIG. 14. FIG. 10 is a block diagram showing a step size controller employed in the adaptive filter of the second embodiment. FIG. 11 is a block diagram showing detailed composition of FIG. 10. The adaptive filter of the second embodiment is realized as an FIR filter. N pieces of tap weights: $\{c_0^{(n)}, c_1^{(n)}, \ldots, c_{N-1}^{(n)}\}$ are controlled in the adaptive filter using the $(e_n+\upsilon_n)$, in which the k-th tap weight $c_k^{(n)}$ is controlled by, for example, a circuit shown in FIG. 2. The resultant output obtained by the adaptive filter is the sum of outputs of such circuits corresponding to each k.

The step size controller of FIG. 10 and FIG. 11 comprises a sign detector 5 for detecting the sign (polarity) of the sum of the error signal sequence component $e_n$ and the additive noise sequence component $\upsilon_n$ (i.e. $(e_n+\upsilon_n)$) which are supplied thereto, an absolute value calculator 6 for calculating the absolute value of the $(e_n+\upsilon_n)$ which are supplied thereto, a square root calculator 7 for calculating the square root of the absolute value calculated by the absolute value calculator 6, a multiplier 8 for calculating the product of the $\text{sgn}(e_n+\upsilon_n)$ outputted by the sign detector 5 and the square root outputted by the square root calculator 7, a multiplier 9 for multiplying the input signal sequence vector $a^{(n)}$ by the output of the multiplier 8, a leakage accumulator 13 for obtaining components of the vector $q^{(n)}$, a norm calculator 14 for calculating the squared norm $\|q^{(n)}\|^2$ of the vector $q^{(n)}$ outputted by the leakage accumulator 13, and a multiplier 15 for multiplying the squared norm $\|q^{(n)}\|^2$ by the coefficient $\beta$ and thereby outputting the step size $\alpha_c^{(n)}=\beta\|q^{(n)}\|^2$.

Here, the squared norm of a vector means the sum of the squares of vector components. The squared norm of a vector can also be calculated by obtaining the inner product of the vector and itself. The number of components of the vector $q^{(n)}$ outputted by the leakage accumulator 13 is N. Therefore, the number of leakage accumulators which are necessary in the leakage accumulator 13 is N. In FIG. 11, the reference numbers 10, 11 and 12 are denoting three leakage accumulators included in the N pieces of leakage accumulators in the leakage accumulator 13. The reference numbers 101, 111 and 121 denote the input signal sequence components $a_n$, $a_{n-k}$ and $a_{n-N+1}$. The reference numbers 109, 119 and 129 denote outputs of the leakage accumulators 10, 11 and 12 (i.e. components of the obtained vector $q^{(n)}$). In the leakage accumulator 11 for example, the reference numbers 112, 113 and 114 denote multipliers, the reference number 115 denotes an adder, the reference number 116 denotes a delay unit for delaying input signals by a predetermined time, the reference numbers 117 and 118 denote the leakage coefficient $\rho$ and its complement $(1-\rho)$. Therefore, the multiplier 9 shown in FIG. 10 is representing N pieces of multipliers 112 in the leakage accumulators 10, ..., 11, ..., 12 shown in FIG. 11.

Figure 12:
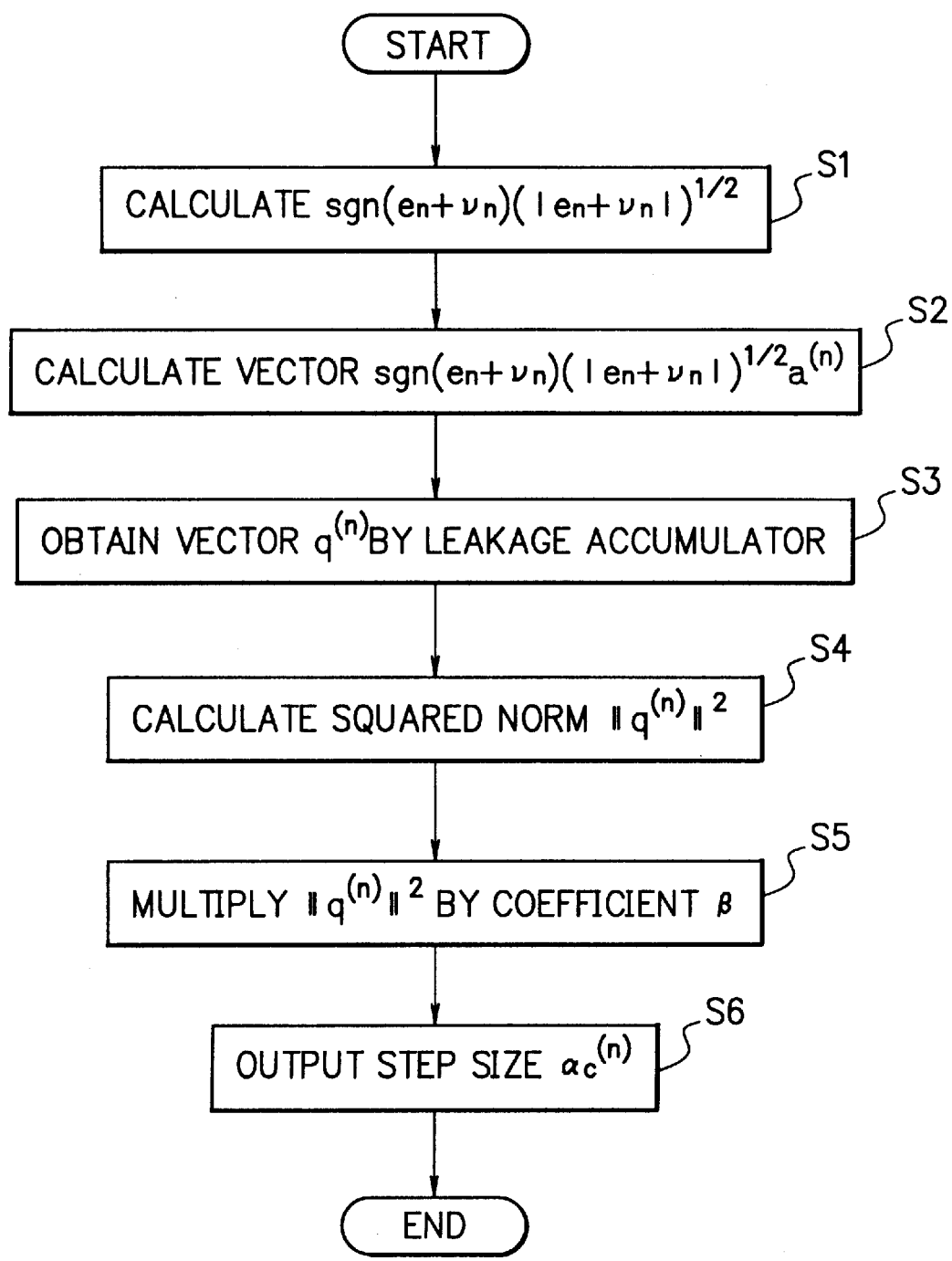
FIG. 12 is a flow chart showing the operation of the step size controller of FIG. 10 and FIG. 11.

FIG. 12 is a flow chart showing the operation of the step size controller of FIG. 10 and FIG. 11. In step S1, using the $e_n+\upsilon_n$ supplied to the step size controller, the product of the $\text{sgn}(e_n+\upsilon_n)$ and the $(|e_n+\upsilon_n|)^{1/2}$ is calculated by the sign detector 5, the absolute value calculator 6, the square root calculator 7 and the multiplier 8. Subsequently, the input signal sequence vector $a^{(n)}$ supplied to the multiplier 9 is multiplied by the product: $\text{sgn}(e_n+\upsilon_n)(|e_n+\upsilon_n|)^{1/2}$ outputted from the multiplier 8 (step S2). Subsequently, the vector $q^{(n)}$ is obtained by the leakage accumulator 13 (step S3). Subsequently, the squared norm $\|q^{(n)}\|^2$ of the vector $q^{(n)}$ is obtained by the norm calculator 14 (step S4). Then, the squared norm $\|q^{(n)}\|^2$ is multiplied by the coefficient $\beta$ by the multiplier 15 (step S5) and the product is outputted as the step size $\alpha_c^{(n)}$ (step S6).

Figure 13:
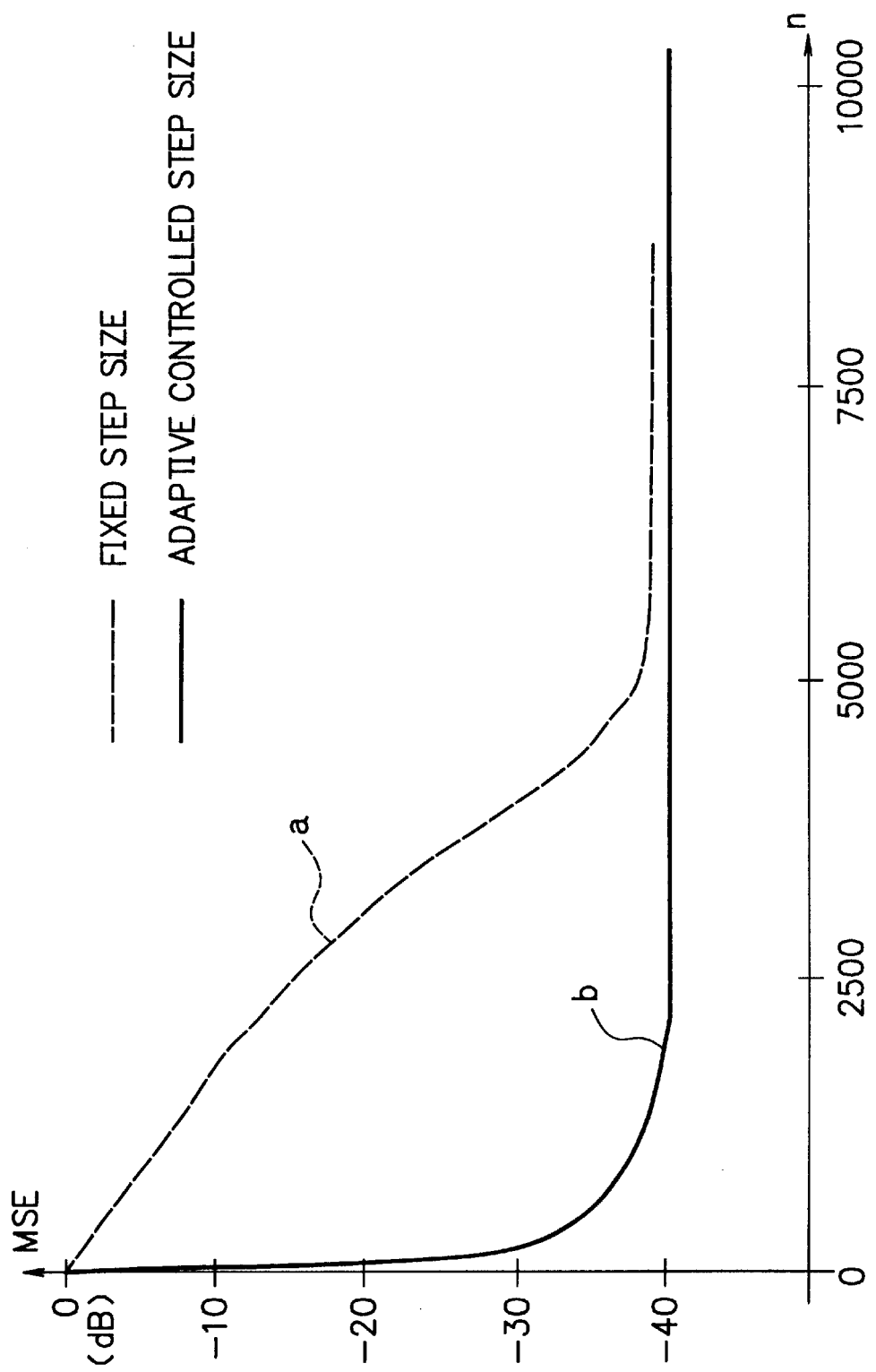
FIG. 13 is a graph showing a simulation result of the adaptive filter of the second embodiment.

FIG. 13 is a graph showing a simulation result of the adaptive filter of the second embodiment. The simulation was executed on the supposition that the input signal sequence follows white Gaussian process and the additive noise is Gaussian noise. The following parameters were used as typical values.

The number of taps:
  N=4

The response vector of the unknown system:
  $h=[0.05, 0.994, 0.01, -0.1]^T$

The power of the input signal sequence:
  $\sigma_a^2=1$ (0 dB)

The power of the additive noise:
  $\sigma_\upsilon^2=0.01$ (−20 dB)

In FIG. 13, the broken line 'a' is showing convergence of the MSE (mean squared estimation error) $\epsilon^{(n)}$ in the case where a fixed step size $\alpha_c=2^{-11}$ was employed, and the solid line 'b' is showing convergence of the MSE in the case of the adaptive filter of the second embodiment in which leakage coefficient $\rho=2^{-7}$ was used. As shown in the solid line 'b' in FIG. 13, convergence speed is remarkably improved and the MSE after convergence is also kept lower than the broken line 'a' by the adaptive filter of the second embodiment. Incidentally, it is theoretically known that the convergence speed gets faster and meanwhile the MSE after convergence gets larger when the leakage coefficient $\rho$ is set larger.

Figure 14:
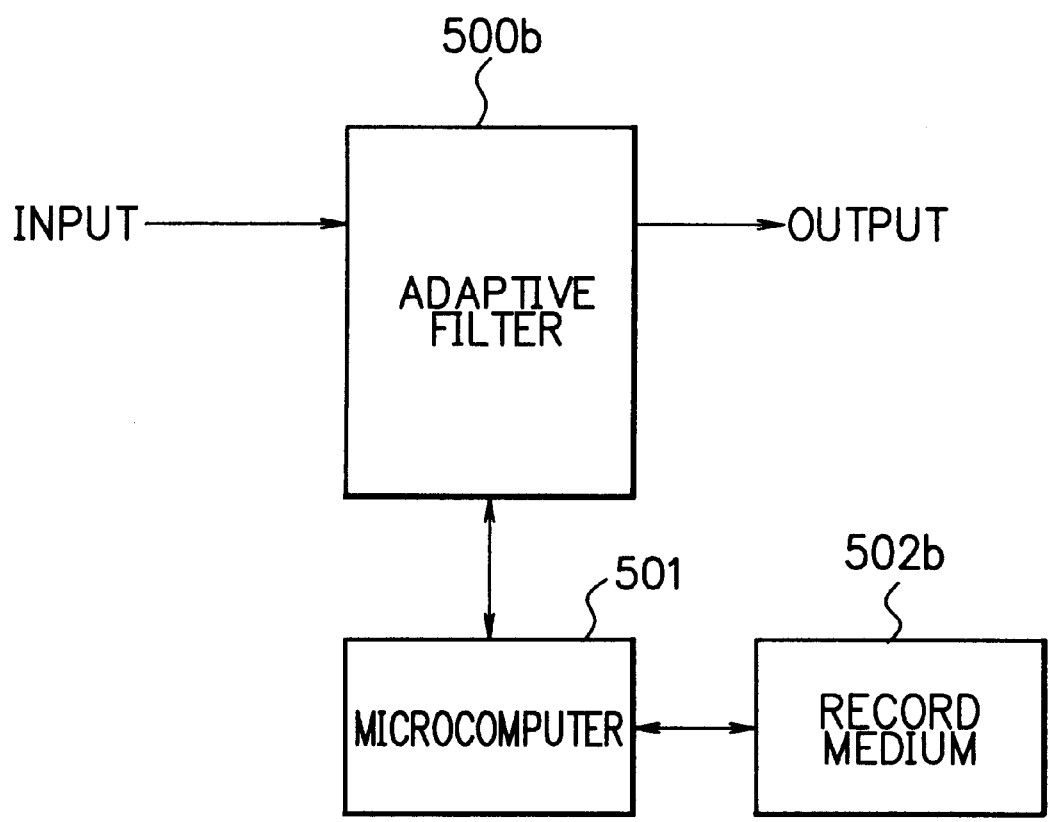
FIG. 14 is a block diagram showing an example in which the step size control of the adaptive filter of the second embodiment is executed by a microcomputer.

FIG. 14 is a block diagram showing an example in which the step size control of the adaptive filter of the second embodiment is executed by a microcomputer. Referring to FIG. 14, the step size $\alpha_c^{(n)}$ of the adaptive filter 500a is controlled by the microcomputer 501. The microcomputer 501 is provided with functions for executing the process shown in FIG. 10, FIG. 11 and FIG. 12. A program for controlling the process is stored in a record medium 502b and the microcomputer 501 executes the process according to the program. As the record medium 502b, a ROM (Read Only Memory), a RAM (Random Access Memory), a flash memory, a memory card, an optical memory disk, a magneto-optical disk, a magnetic recording medium, etc. can be used. Incidentally, the adaptive filter of the second embodiment with the adaptive controlled step size can also be realized by a specific DSP (Digital Signal Processor), an ASIC (Application Specific Integrated Circuit), etc.

As described above, according to the second embodiment, the step size of the adaptive filter employing the stochastic gradient sign algorithm is controlled to be approximately the same as the theoretically derived optimum step size, thereby both faster convergence of the adaptive filter and smaller residual mean squared estimation error after convergence can be attained.

THIRD EMBODIMENT
(for Stochastic Gradient Sign Algorithm)

In the following, an adaptive filter according to the third embodiment of the present invention will be described. Step size control method of the adaptive filter of the third embodiment specifically employs the stochastic gradient sign algorithm as the tap weight control algorithm. The theoretical optimum step size $\alpha_c^{(n)}{}_{opt}$ which has been obtained in the second embodiment:

$$\alpha_c^{(n)}{}_{opt} \doteq \{2/\pi/(\epsilon^{(n)}+\sigma_\upsilon^2)\}^{1/2} \text{trace}(Ra^2 K^{(n)})/\text{trace}(Ra^2)$$

can also be expressed as:

$$\alpha_c^{(n)}{}_{opt} \doteq \{\pi/2/\text{trace}(Ra^2)\} \cdot (2/\pi)\text{trace}(Ra^2 K^{(n)})/(\epsilon^{(n)}+\sigma_\upsilon^2) \cdot \{(2/\pi)(\epsilon^{(n)}+\sigma_\upsilon^2)\}^{1/2}.$$

Therefore, the step size controller employed in the adaptive filter of the third embodiment generates the step size $\alpha_c^{(n)}$ as follows:

$$\alpha_c^{(n)} = \beta' \|q^{(n)}\|^2 |\sigma|^{(n)}$$

where $\beta' = \pi/2/\text{trace}(Ra^2)$, $\|q^{(n)}\|^2$ is the squared norm of the vector $q^{(n)}$ and the vector $q^{(n)}$ is calculated one by one by leakage accumulators according to the following update equation:

$$q^{(n+1)} = (1-\rho)q^{(n)} + \rho \, \text{sgn}(e_n + \upsilon_n) a^{(n)}$$

where the $\rho$ is a leakage coefficient, and the scalar quantity $|\sigma|^{(n)}$ is calculated one by one by a leakage accumulator according to the following update equation:

$$|\sigma|^{(n+1)} = (1-\rho_\sigma)|\sigma|^{(n)} + \rho_\sigma |e_n + \upsilon_n|$$

where the $\rho_\sigma$ is a leakage coefficient.

When the step size $\alpha_c^{(n)}$ is generated as above, it can be proven that the following equations hold:

$$E[\|q^{(n)}\|^2] \approx (2/\pi)\text{trace}(Ra^2 K^{(n)})/(\epsilon^{(n)} + \sigma_\upsilon^2)$$

$$E[|\sigma|^{(n)}] \approx \{(2/\pi)(\epsilon^{(n)} + \sigma_\upsilon^2)\}^{1/2}$$

therefore, $$E[\alpha_c^{(n)}] \approx \alpha_c^{(n)}{}_{opt}.$$

That is, the step size $\alpha_c^{(n)}$ employed in the third embodiment is approximately equal to the theoretical optimum step size $\alpha_c^{(n)}{}_{opt}$ at each time n.

In order to generate the step size $\alpha_c^{(n)}$, the value of the coefficient $\beta$ in the above equation $\alpha_c^{(n)} = \beta' \|q^{(n)}\|^2 |\sigma|^{(n)}$ has to be obtained, and the value of the trace($Ra^2$) is necessary for this. Here, the covariance matrix Ra of the input signal sequence vector $a^{(n)}$ is known, since it has been assumed that the input signal sequence supplied to the filter is known. If the covariance matrix Ra is not known, the following update equation can be used for obtaining the trace($Ra^2$):

$$\tau^{(n+1)} = (1-\rho_\tau)\tau^{(n)} + \rho_\tau (a^{(n-L)T} a^{(n)})^2$$

where the $\rho_\tau$ is a leakage coefficient which is small enough, and the delay time length L is set sufficiently large so that $E[a^{(n-L)T} a^{(n)}]$ will be approximately zero. The $\tau^{(n)}$ is known to converge on $E[(a^{(n-L)T} a^{(n)})^2] = \text{trace}(Ra^2)$ after a sufficient time.

Figure 15:
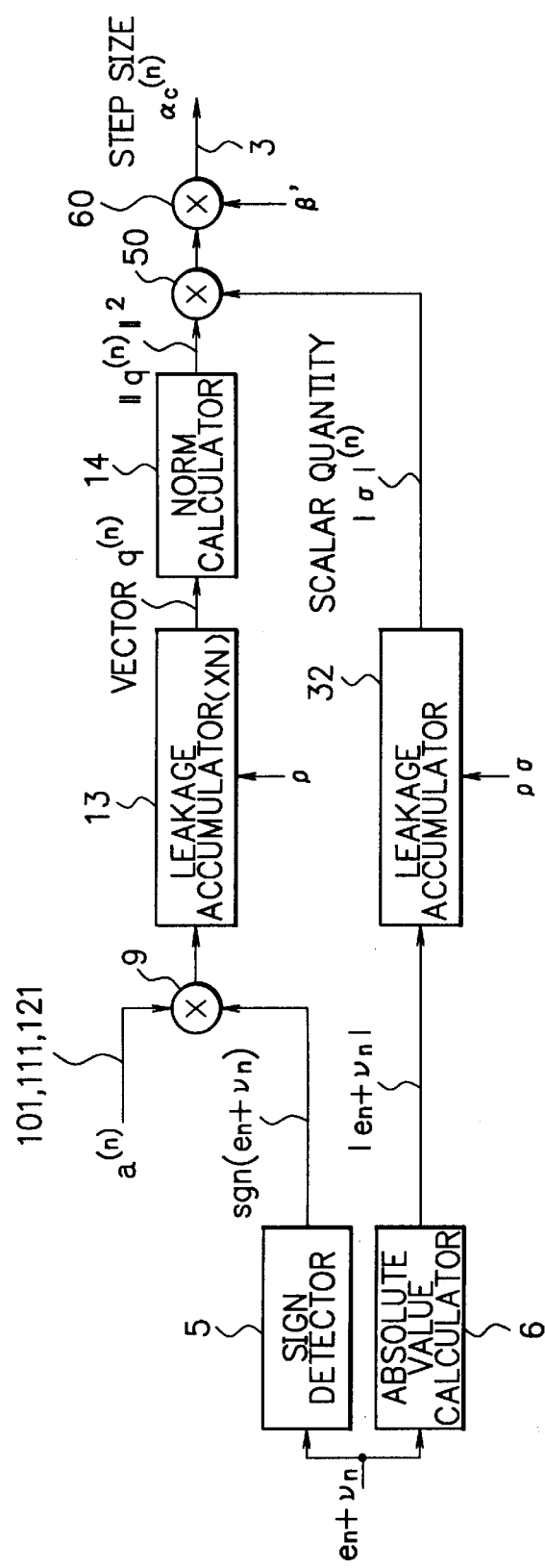
FIG. 15 is a block diagram showing a step size controller employed in an adaptive filter according to the third embodiment of the present invention.
Figure 16:
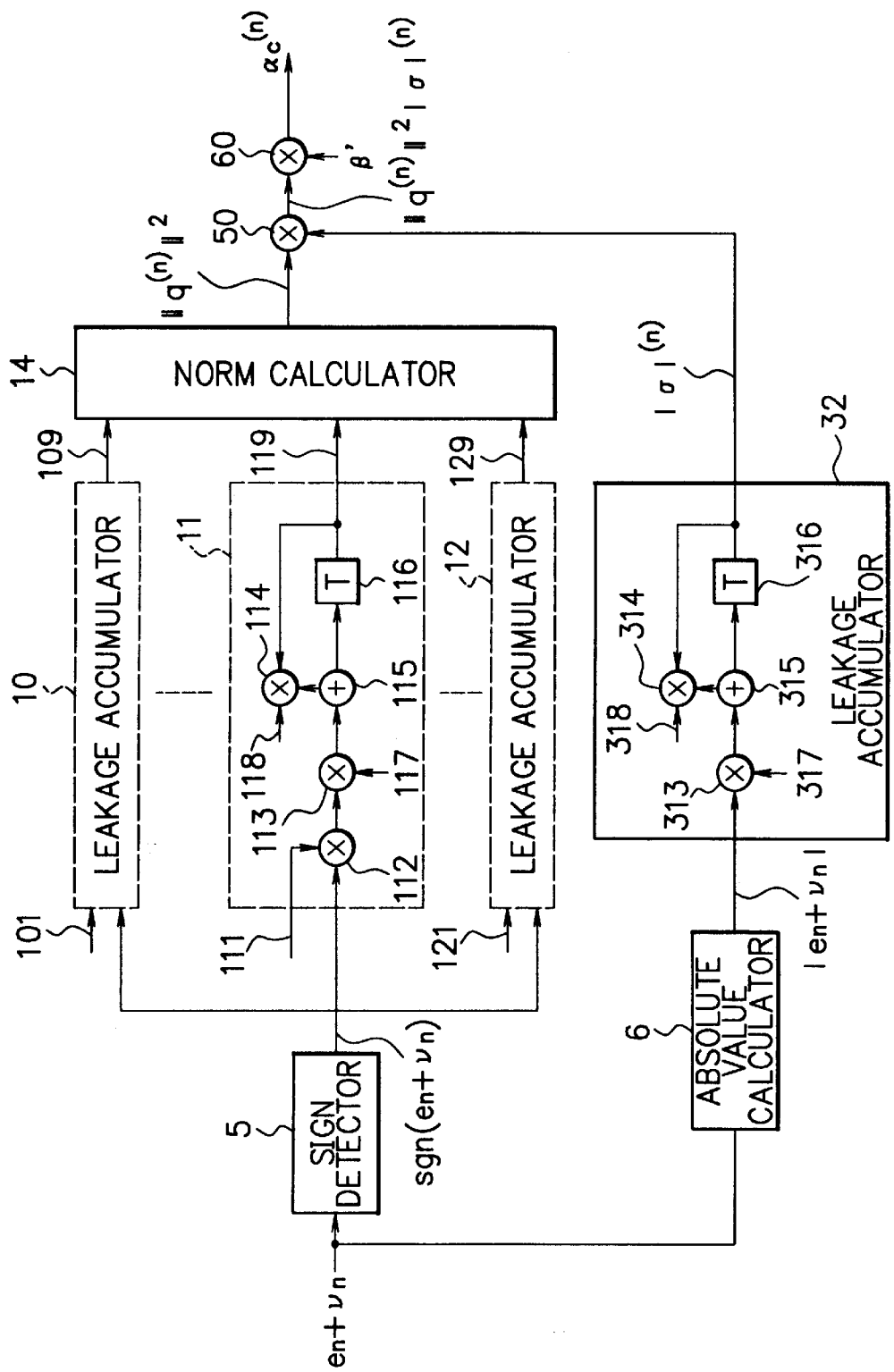
FIG. 16 is a block diagram showing detailed composition of FIG. 15.

In the following, an adaptive filter according to the third embodiment will be described referring to FIG. 15 through FIG. 19. FIG. 15 is a block diagram showing a step size controller employed in the adaptive filter of the third embodiment. FIG. 16 is a block diagram showing detailed composition of FIG. 15. The adaptive filter of the third embodiment is realized as an FIR filter. N pieces of tap weights: $\{c_0^{(n)}, c_1^{(n)}, \ldots, c_{N-1}^{(n)}\}$ are controlled in the adaptive filter using the $(e_n + \upsilon_n)$, in which the k-th tap weight $c_k^{(n)}$ is controlled by, for example, a circuit shown in FIG. 2. The resultant output obtained by the adaptive filter is the sum of outputs of such circuits corresponding to each k.

The step size controller of FIG. 15 and FIG. 16 comprises a sign detector 5 for detecting the sign (polarity) of $(e_n + \upsilon_n)$ which are supplied thereto, an absolute value calculator 6 for calculating the absolute value of the $(e_n + \upsilon_n)$ which are supplied thereto, a multiplier 9 for multiplying the input signal sequence vector $a^{(n)}$ by the $\text{sgn}(e_n + \upsilon_n)$ outputted by the sign detector 5, a leakage accumulator 13 for obtaining components of the vector $q^{(n)}$, a norm calculator 14 for calculating the squared norm $\|q^{(n)}\|^2$ of the vector $q^{(n)}$ outputted by the leakage accumulator 13, a leakage accumulator 32 for obtaining the scalar quantity $|\sigma|^{(n)}$, a multiplier 50 for multiplying the squared norm $\|q^{(n)}\|^2$ by the scalar quantity $|\sigma|^{(n)}$, and a multiplier 60 for multiplying the $\|q^{(n)}\|^2 |\sigma|^{(n)}$ supplied from the multiplier 50 by the coefficient $\beta'$ and thereby outputting the step size $\alpha_c^{(n)} = \beta' \|q^{(n)}\|^2 |\sigma|^{(n)}$.

Here, the number of components of the vector $q^{(n)}$ outputted by the leakage accumulator 13 is N. Therefore, the number of leakage accumulators which are necessary in the leakage accumulator 13 is N. In FIG. 16, the reference numbers 10, 11 and 12 are denoting three leakage accumulators included in the N pieces of leakage accumulators in the leakage accumulator 13. The reference numbers 101, 111 and 121 denote the input signal sequence components $a_n$, $a_{n-k}$ and $a_{n-N+1}$. The reference numbers 109, 119 and 129 denote outputs of the leakage accumulators 10, 11 and 12 (i.e. components of the obtained vector $q^{(n)}$). That is, the norm calculator 14 calculates the squared norm of a vector $[109, \ldots, 119, \ldots, 129]$. In the leakage accumulator 11 for example, the reference numbers 112, 113 and 114 denote multipliers, the reference number 115 denotes an adder, the reference number 116 denotes a delay unit for delaying input signals by a predetermined time, the reference numbers 117 and 118 denote the leakage coefficient $\rho$ and its complement $(1-\rho)$. Therefore, the multiplier 9 shown in FIG. 15 is representing N pieces of multipliers 112 in the leakage accumulators $10, \ldots, 11, \ldots, 12$ shown in FIG. 16. In the leakage accumulator 32, the reference numbers 313 and 314 denote multipliers, the reference number 315 denotes an adder, the reference number 316 denotes a delay unit for delaying input signals by a predetermined time, the reference numbers 317 and 318 denote the leakage coefficient $\rho_\sigma$ and its complement $(1-\rho_\sigma)$.

Figure 17:
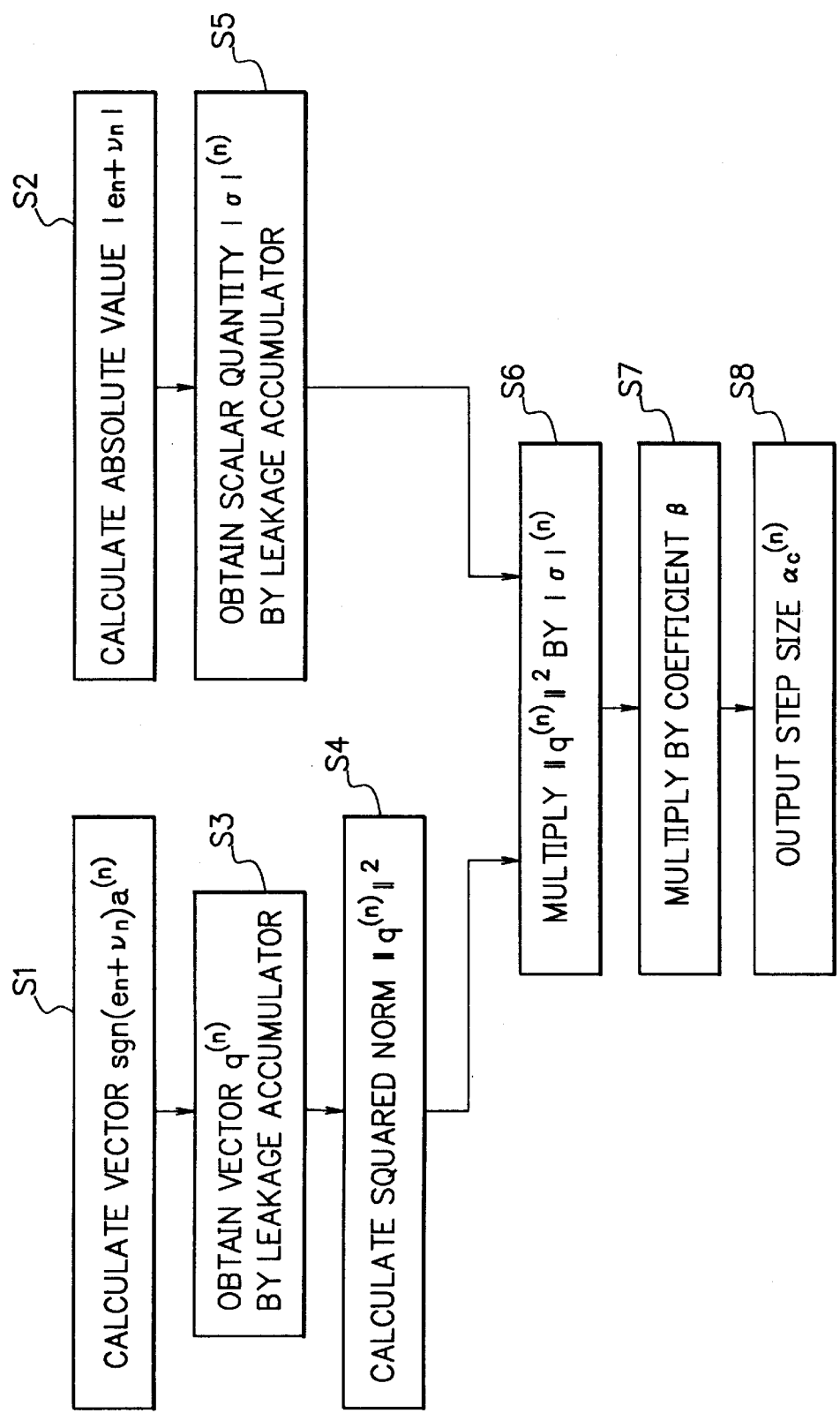
FIG. 17 is a flow chart showing the operation of the step size controller of FIG. 15 and FIG. 16.

FIG. 17 is a flow chart showing the operation of the step size controller of FIG. 15 and FIG. 16. First, using the $e_n + \upsilon_n$ and the $a^{(n)}$ supplied to the step size controller, a vector $\text{sgn}(e_n + \upsilon_n) a^{(n)}$ is calculated by the sign detector 5 and the multiplier 9 (step S1), and the absolute value $|e_n + \upsilon_n|$ is calculated by the absolute value calculator 6 (step S2). Subsequently, the vector $q^{(n)}$ is obtained by the leakage accumulator 13 (step S3), and the squared norm $\|q^{(n)}\|^2$ of the vector $q^{(n)}$ is obtained by the norm calculator 14 (step S4). Meanwhile, the scalar quantity $|\sigma|^{(n)}$ is obtained by the leakage accumulator 32 using the absolute value $|e_n + \upsilon_n|$ (step S5). Subsequently, the squared norm $\|q^{(n)}\|^2$ is multiplied by the scalar quantity $|\sigma|^{(n)}$ by the multiplier 50 (step S6). Then, the $\|q^{(n)}\|^2 |\sigma|^{(n)}$ outputted by the multiplier 50 is multiplied by the coefficient $\beta$ and thereby the step size $\alpha_c^{(n)}$ is obtained by the multiplier 60 (step S7), and the obtained step size $\alpha_c^{(n)} = \beta' \|q^{(n)}\|^2 |\sigma|^{(n)}$ is outputted (step S8).

Figure 18:
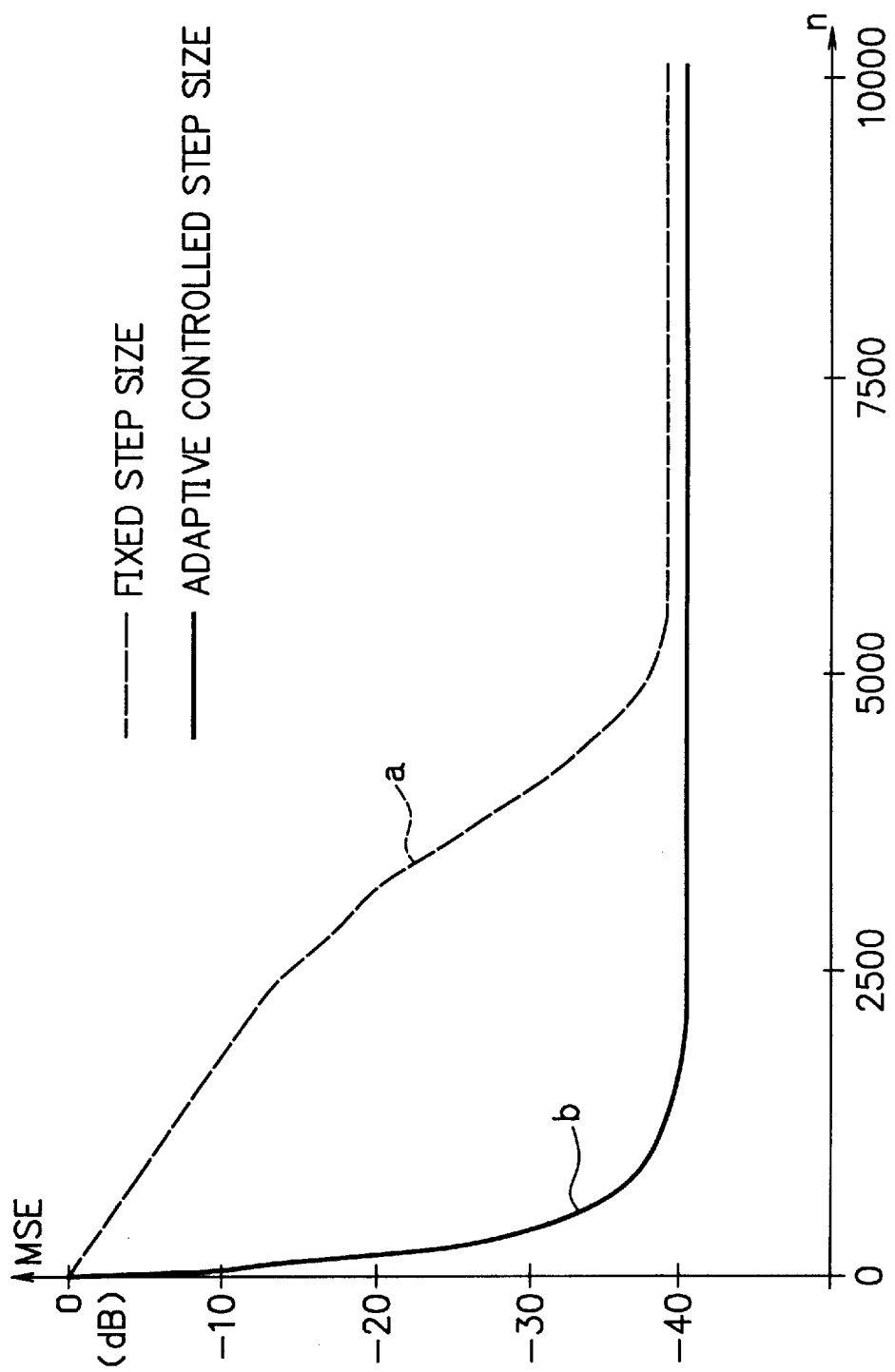
FIG. 18 is a graph showing a simulation result of the adaptive filter of the third embodiment.

FIG. 18 is a graph showing a simulation result of the adaptive filter of the third embodiment. The simulation was executed on the supposition that the input signal sequence follows white Gaussian process and the additive noise is Gaussian noise. The following parameters were used as typical values.

The number of taps:
  N=4
The response vector of the unknown system:
  h=[0.05, 0.994, 0.01, −0.1]$^T$
The power of the input signal sequence:
  $\sigma_a^2 = 1$ (0 dB)
The power of the additive noise:
  $\sigma_\upsilon^2 = 0.01$ (−20 dB)

In FIG. 18, the broken line 'a' is showing convergence of the MSE (mean squared estimation error) $\epsilon^{(n)}$ in the case where a fixed step size $\alpha_c = 2^{-11}$ was employed, and the solid line 'b' is showing convergence of the MSE in the case of the adaptive filter of the third embodiment in which leakage coefficients $\rho = \rho_\sigma = 2^{-7}$ were used. As shown in the solid line 'b' in FIG. 18, convergence speed is remarkably improved and the MSE after convergence is also kept lower than the broken line 'a' by the adaptive filter of the third embodiment. Incidentally, it is theoretically known that the convergence speed gets faster and meanwhile the MSE after convergence gets larger when the leakage coefficients ρ and $ρ_{94}$ a are set larger.

FIG. 19 is a block diagram showing an example in which the step size control of the adaptive filter of the third embodiment is executed by a microcomputer. Referring to FIG. 19, the step size $α_c^{(n)}$ of the adaptive filter 500c is controlled by the microcomputer 501. The microcomputer 501 is provided with functions for executing the process shown in FIG. 15, FIG. 16 and FIG. 17. A program for controlling the process is stored in a record medium 502c and the microcomputer 501 executes the process according to the program. As the record medium 502c, a ROM (Read Only Memory), a RAM (Random Access Memory), a flash memory, a memory card, an optical memory disk, a magneto-optical disk, a magnetic recording medium, etc. can be used. Incidentally, the adaptive filter of the third embodiment with the adaptive controlled step size can also be realized by a specific DSP (Digital Signal Processor), an ASIC (Application Specific Integrated Circuit), etc.

As described above, according to the third embodiment, the step size of the adaptive filter employing the stochastic gradient sign algorithm is controlled to be approximately the same as the theoretically derived optimum step size, thereby both faster convergence of the adaptive filter and smaller residual mean squared estimation error after convergence can be attained.

FOURTH EMBODIMENT
(for Stochastic Gradient (normalized) LMS Algorithm)

In the following, an adaptive filter according to the fourth embodiment of the present invention will be described. Step size control method of the adaptive filter of the fourth embodiment specifically employs the stochastic gradient (normalized) LMS algorithm as the tap weight control algorithm.

As a preparation to an explanation of the step size control method of the adaptive filter of the fourth embodiment, it will be explained first how theoretical optimum step size at each time is determined in the fourth embodiment. Incidentally, the same symbols as the description of the first to third embodiments will be used in the following explanation, in which:

n denotes time, $a_n$ denotes an input signal sequence component at the time n, $α_c^{(n)}$ denotes a step size at the time n, $e_n$ denotes an error signal sequence component at the time n, $υ_n$ denotes an additive noise sequence component at the time n, $c_k^{(n)}$ denotes the k-th tap weight at the time n (k: 0, 1, ... N−1), $c^{(n)} = [c_0^{(n)}, c_1^{(n)}, \ldots, c_{N-1}^{(n)}]^T$ denotes a tap weight vector at the time n, $a^{(n)} = [a_n, a_{n-1}, \ldots, a_{n-N+1}]^T$ denotes an input signal sequence vector at the time n, $θ^{(n)} = h - c^{(n)}$ denotes a tap weight error vector, in which h is an N-dimensional response vector of the unknown system to be identified and N is the number of taps.

The tap weight error vector $θ^{(n)}$ in the fourth embodiment employing the stochastic gradient LMS algorithm ($f(e_n + υ_n) = e_n + υ_n$, $g(a^{(n)}) = a^{(n)}$) is updated according to the following equation:

$$θ^{(n+1)} = θ^{(n)} - α_c^{(n)}(e_n + υ_n)a^{(n)}.$$

Here, the second moment matrix of the tap weight error vector $θ^{(n)}$ is defined as $$K^{(n)} = E[θ^{(n)}θ^{(n)T}]$$

According to the above update equation for $θ^{(n+1)}$, the following difference equation holds with regard to the second moment matrix $K^{(n)}$:

$$K^{(n+1)} = K^{(n)} - α_c^{(n)}(V_3^{(n)} + V_3^{(n)T}) + α_c^{(n)2}T_3^{(n)}$$

where $V_3^{(n)}$ and $T_3^{(n)}$ are matrixes given by the following equations.

$$V_3^{(n)} = E[(e_n + υ_n)a^{(n)}θ^{(n)T}]$$

$$T_3^{(n)} = E[(e_n + υ_n)^2 a^{(n)} a^{(n)T}]$$

The MSE (mean squared estimation error) $ε^{(n)}$ at the time n is obtained by the following equation:

$$ε^{(n)} = E[e_n^2] = \text{trace}(Ra K^{(n)})$$

where $Ra = E[a^{(n)} a^{(n)T}]$ is the covariance matrix (or correlation matrix) of the input signal sequence vector $a^{(n)}$.

In order to obtain a step size $α_c^{(n)}$ at the time n by which $ε^{(n+1)}$ can be made the smallest, the following partial derivative of the $ε^{(n+1)}$ is obtained with respect to the step size $α_c^{(n)}$:

$$δε^{(n+1)}/δα_c^{(n)} = \text{trace}(Ra\,δK^{(n+1)}/δα_c^{(n)})$$
$$= \text{trace}\{Ra(-(V_3^{(n)} + V_3^{(n)T}) + 2α_c^{(n)} T_3^{(n)})\}.$$

By setting the partial derivative at zero, the theoretical optimum value $α_c^{(n)}{}_{opt}$ of the step size $α_c^{(n)}$ at the time n is obtained as:

$$α_c^{(n)}{}_{opt} = \text{trace}(Ra V_3^{(n)})/\text{trace}(Ra T_3^{(n)}).$$

When the value of $θ^{(n)}$ is given, the following equation approximately holds with regard to an expected value with respect to the input signal sequence vector $a^{(n)}$.

$$E_a[(e_n + υ_n)a^{(n)}|θ^{(n)}] \approx Ra θ^{(n)}$$

Thus, the following equation approximately holds with regard to the matrix $V_3^{(n)}$.

$$V_3^{(n)} \approx Ra K^{(n)}$$

Thus, the theoretical optimum step size $α_c^{(n)}{}_{opt}$ can be expressed as:

$$α_c^{(n)}{}_{opt} \approx \text{trace}(Ra^2 K^{(n)})/\text{trace}(Ra T_3^{(n)}).$$

In the case where the number of taps is relatively large (20 or more for example), the $T_3^{(n)}$ can be made approximation as:

$$T_3^{(n)} \approx E[(e_n + v_n)^2] E[a^{(n)} a^{(n)T}]$$
$$\approx (ε^{(n)} + σ_v^2) Ra$$

where $σ_υ^2$ is the power of the additive noise. Therefore, the theoretical optimum step size $α_c^{(n)}{}_{opt}$ is made approximation as follows.

$$\alpha_{c\ opt}^{(n)} \approx trace(Ra^2 K^{(n)}) / trace(Ra^2) / (\varepsilon^{(n)} + \sigma_v^2)$$

$$\approx (\pi/2 / trace(Ra^2)) \times (2/\pi) trace(Ra^2 K^{(n)}) / (\varepsilon^{(n)} + \sigma_v^2)$$

Therefore, the step size controller employed in the adaptive filter of the fourth embodiment generates the step size $\alpha_c^{(n)}$ as follows:

$$\alpha_c^{(n)} = \beta' \|q^{(n)}\|^2$$

where $\beta' = \pi/2/trace(Ra^2)$, $\|q^{(n)}\|^2$ is the squared norm of the vector $q^{(n)}$ and the vector $q^{(n)}$ is calculated one by one by leakage accumulators according to the following update equation:

$$q^{(n+1)} = (1-\rho) q^{(n)} + \rho \, sgn(e_n + \upsilon_n) a^{(n)}$$

where the $\rho$ is a leakage coefficient.

When the step size $\alpha_c^{(n)}$ is generated as above, it can be proven that the following equation holds:

$$E[\|q^{(n)}\|^2] = (2/\pi) trace(Ra^2 K^{(n)}) / (\epsilon^{(n)} + \sigma_v^2),$$

therefore, $$E[\alpha_c^{(n)}] = \alpha_{c\ opt}^{(n)}.$$

That is, the step size $\alpha_c^{(n)}$ employed in the fourth embodiment is approximately equal to the theoretical optimum step size $\alpha_{c\ opt}^{(n)}$ at each time n.

Incidentally, the step size control method of the fourth embodiment can be applied to adaptive filters which employ the stochastic gradient normalized LMS algorithm as the tap weight control algorithm. In such cases, $\beta'' = (\pi/2)\sigma_a^2 N / trace(Ra^2)$ is used as the coefficient $\beta'$.

In order to generate the step size $\alpha_c^{(n)}$, the value of the coefficient $\beta'$ in the above equation $\alpha_c^{(n)} = \beta' \|q^{(n)}\|^2$ has to be obtained, and the value of the $trace(Ra^2)$ is necessary for this. Here, the covariance matrix Ra of the input signal sequence vector $a^{(n)}$ is known, since it has been assumed that the input signal sequence supplied to the filter is known. If the covariance matrix Ra is not known, the following update equation can be used for obtaining the $trace(Ra^2)$:

$$\tau^{(n+1)} = (1 - \rho_\tau) \tau^{(n)} + \rho_\tau (a^{(n-L)T} a^{(n)})^2$$

where the $\rho_\tau$ is a leakage coefficient which is small enough, and the delay time length L is set sufficiently large so that $E[a^{(n-L)T} a^{(n)}]$ will be approximately zero. The $\tau^{(n)}$ is known to converge on $E[(a^{(n-L)T} a^{(n)})^2] = trace(Ra^2)$ after a sufficient time.

Figure 4:
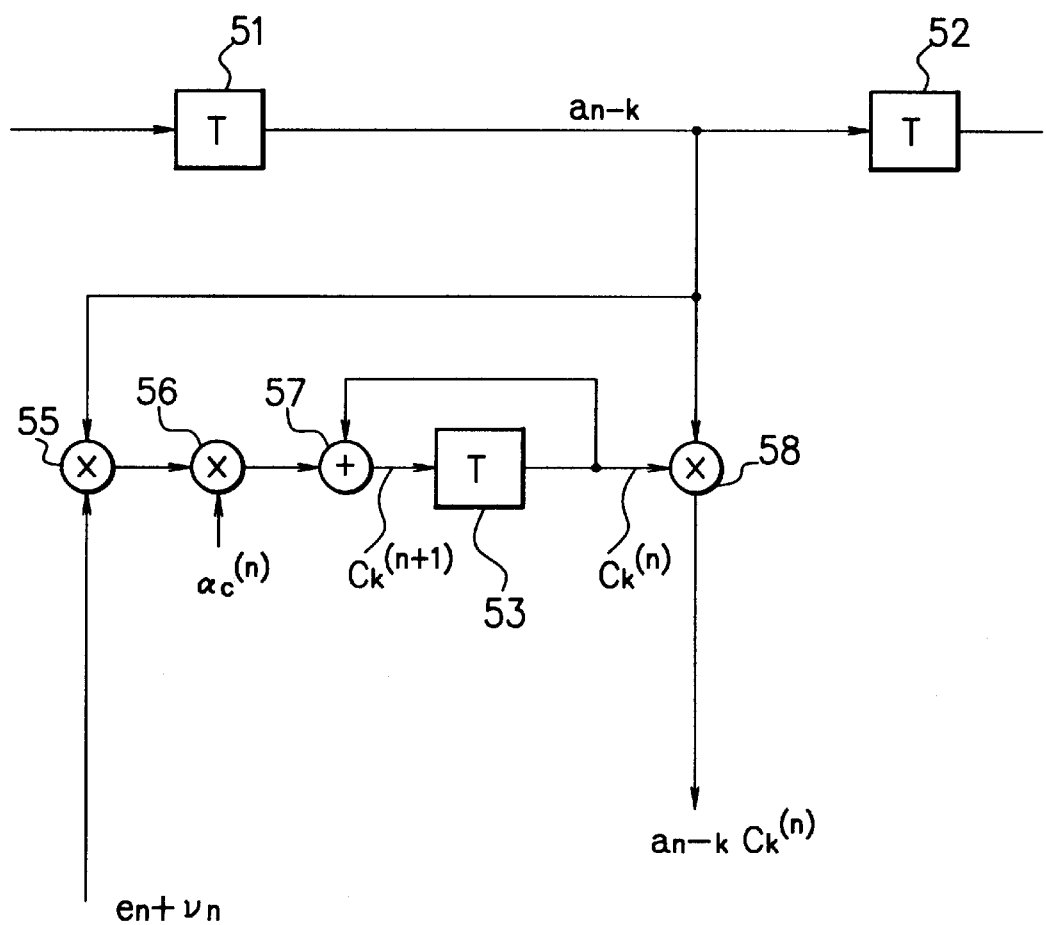
FIG. 4 is a block diagram showing another example of composition of part of an adaptive filter which employs stochastic gradient LMS algorithm as tap weight control algorithm.
Figure 20:
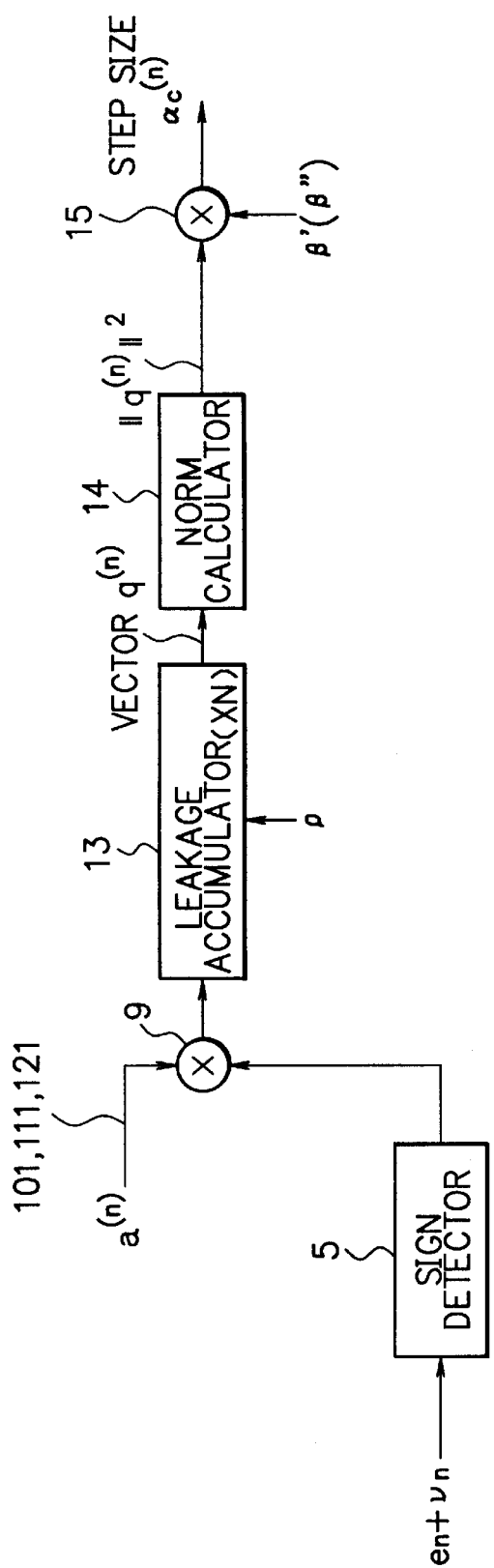
FIG. 20 is a block diagram showing a step size controller employed in an adaptive filter according to the fourth embodiment of the present invention.
Figure 21:
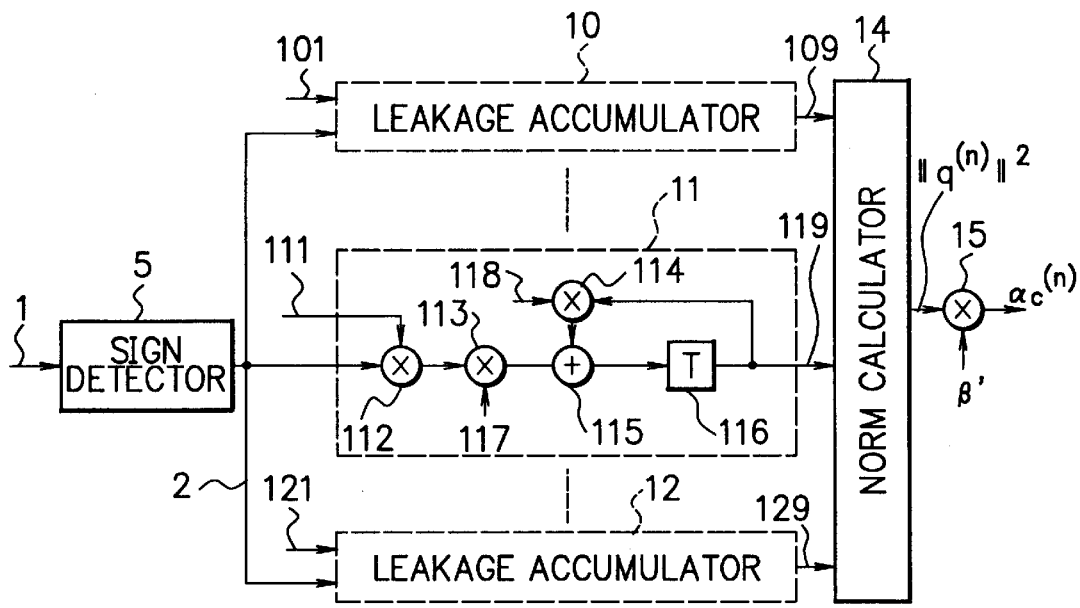
FIG. 21 is a block diagram showing detailed composition of FIG. 20.

In the following, an adaptive filter according to the fourth embodiment will be described referring to FIG. 20 through FIG. 24. FIG. 20 is a block diagram showing a step size controller employed in the adaptive filter of the fourth embodiment. FIG. 21 is a block diagram showing detailed composition of FIG. 20. The adaptive filter of the third embodiment is realized as an FIR filter. N pieces of tap weights: $\{c_0^{(n)}, c_1^{(n)}, \ldots, c_{N-1}^{(n)}\}$ are controlled in the adaptive filter using the $(e_n + \upsilon_n)$, in which the k-th tap weight $c_k^{(n)}$ is controlled by, for example, a circuit shown in FIG. 4. The resultant output obtained by the adaptive filter is the sum of outputs of such circuits corresponding to each k.

The step size controller of FIG. 20 and FIG. 21 comprises a sign detector 5 for detecting the sign (polarity) of the $(e_n + \upsilon_n)$ which are supplied thereto, a multiplier 9 for multiplying the input signal sequence vector $a^{(n)}$ by the $sgn(e_n + \upsilon_n)$ outputted by the sign detector 5, a leakage accumulator 13 for obtaining components of the vector $q^{(n)}$, a norm calculator 14 for calculating the squared norm $\|q^{(n)}\|^2$ of the vector $q^{(n)}$ outputted by the leakage accumulator 13, and a multiplier 15 for multiplying the squared norm $\|q^{(n)}\|^2$ by the coefficient $\beta'$ and thereby outputting the step size $\alpha_c^{(n)} = \beta' \|q^{(n)}\|^2$.

Here, the squared norm of a vector means the sum of the squares of vector components. The squared norm of a vector can also be calculated by obtaining the inner product of the vector and itself. The number of components of the vector $q^{(n)}$ outputted by the leakage accumulator 13 is N. Therefore, the number of leakage accumulators which are necessary in the leakage accumulator 13 is N. In FIG. 21, the reference numbers 10, 11 and 12 are denoting three leakage accumulators included in the N pieces of leakage accumulators in the leakage accumulator 13. The reference numbers 101, 111 and 121 denote the input signal sequence components $a_n$, $a_{n-k}$ and $a_{n-N+1}$. The reference numbers 109, 119 and 129 denote outputs of the leakage accumulators 10, 11 and 12 (i.e. components of the obtained vector $q^{(n)}$). In the leakage accumulator 11 for example, the reference numbers 112, 113 and 114 denote multipliers, the reference number 115 denotes an adder, the reference number 116 denotes a delay unit for delaying input signals by a predetermined time, the reference numbers 117 and 118 denote the leakage coefficient $\rho$ and its complement $(1-\rho)$. Therefore, the multiplier 9 in shown FIG. 20 is representing N pieces of multipliers 112 in the leakage accumulators $10, \ldots, 11, \ldots, 12$ shown in FIG. 21.

Figure 22:
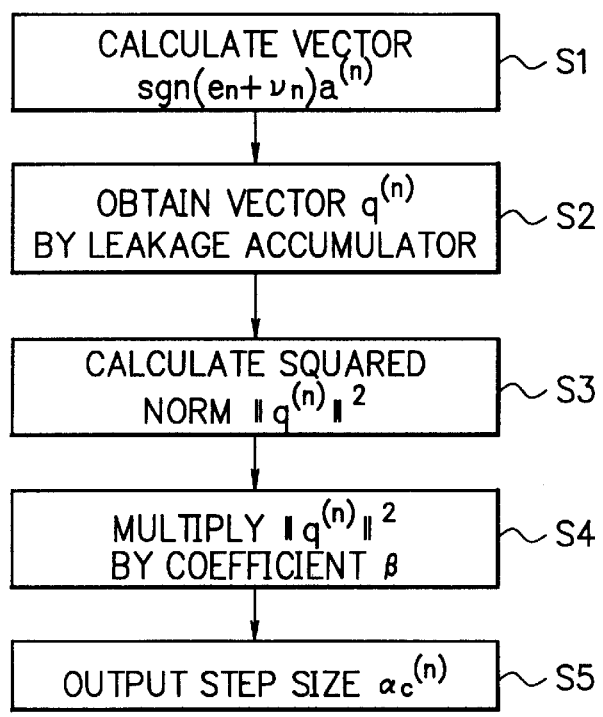
FIG. 22 is a flow chart showing the operation of the step size controller of FIG. 20 and FIG. 21.

FIG. 22 is a flow chart showing the operation of the step size controller of FIG. 20 and FIG. 21. First, using the $e_n + \upsilon_n$ and the $a^{(n)}$ supplied to the step size controller, a vector $sgn(e_n + \upsilon_n) a^{(n)}$ is calculated by the sign detector 5 and the multiplier 9 (step S1). Subsequently, the vector $q^{(n)}$ is obtained by the leakage accumulator 13 using the vector obtained in the step S1 (step S2), and the squared norm $\|q^{(n)}\|^2$ of the vector $q^{(n)}$ is obtained by the norm calculator 14 (step S3). Then, the squared norm $\|q^{(n)}\|^2$ obtained by the norm calculator 14 is multiplied by the coefficient $\beta'$ and thereby the step size $\alpha_c^{(n)}$ is obtained by the multiplier 15 (step S4), and the obtained step size $\alpha_c^{(n)} = \beta' \|q^{(n)}\|^2$ is outputted (step S5).

Figure 23:
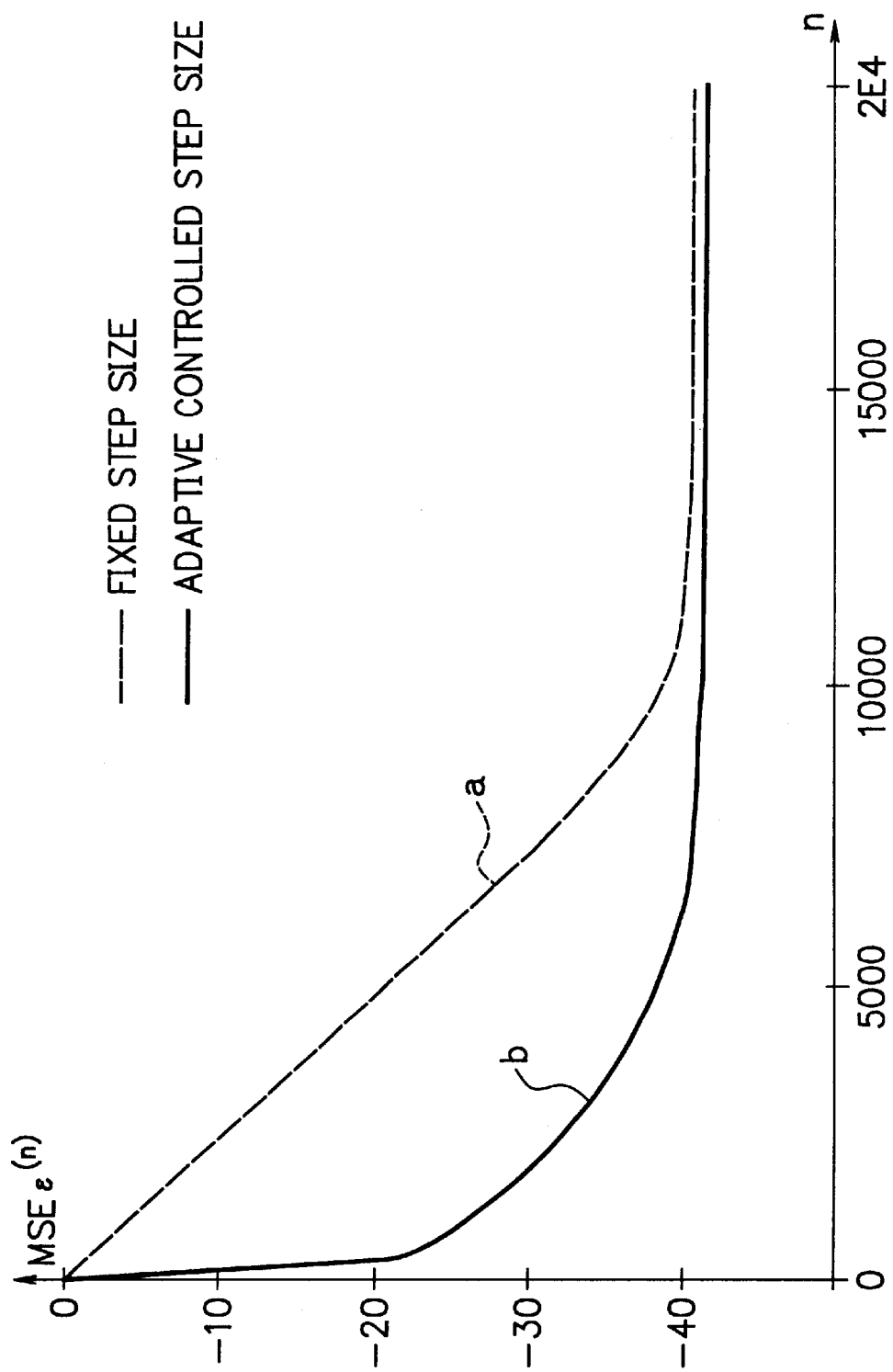
FIG. 23 is a graph showing a simulation result of the adaptive filter of the fourth embodiment.

FIG. 23 is a graph showing a simulation result of the adaptive filter of the fourth embodiment. The simulation was executed on the supposition that the input signal sequence follows white Gaussian process and the additive noise is Gaussian noise. The following parameters were used as typical values.

The number of taps:

N=32

The response vector of the unknown system:

$h = [0.05, 0.994, 0.01, -0.1]^T$ $h^T h \approx 1$

The power of the input signal sequence:

$\sigma_a^2 = 1$ (0 dB)

The power of the additive noise:

$\sigma_\upsilon^2 = 0.01$ (−20 dB)

In FIG. 23, the broken line 'a' is showing convergence of the MSE (mean squared estimation error) $\epsilon^{(n)}$ in the case where a fixed step size $\alpha_c = 2^{-11}$ was employed, and the solid line 'b' is showing convergence of the MSE in the case of the adaptive filter of the fourth embodiment in which leakage coefficients $\rho = 2^{-11}$ was used. As shown in the solid line 'b' in FIG. 23, convergence speed is remarkably improved and the MSE after convergence is also kept lower than the broken line 'a' by the adaptive filter of the fourth embodiment. Incidentally, it is theoretically known that the convergence speed gets faster and meanwhile the MSE after convergence gets larger when the leakage coefficient ρ is set larger. In addition, although relatively large number of taps was employed in the above embodiment, the effects shown in FIG. 23 can actually be obtained even when smaller number of taps are employed.

Figure 24:
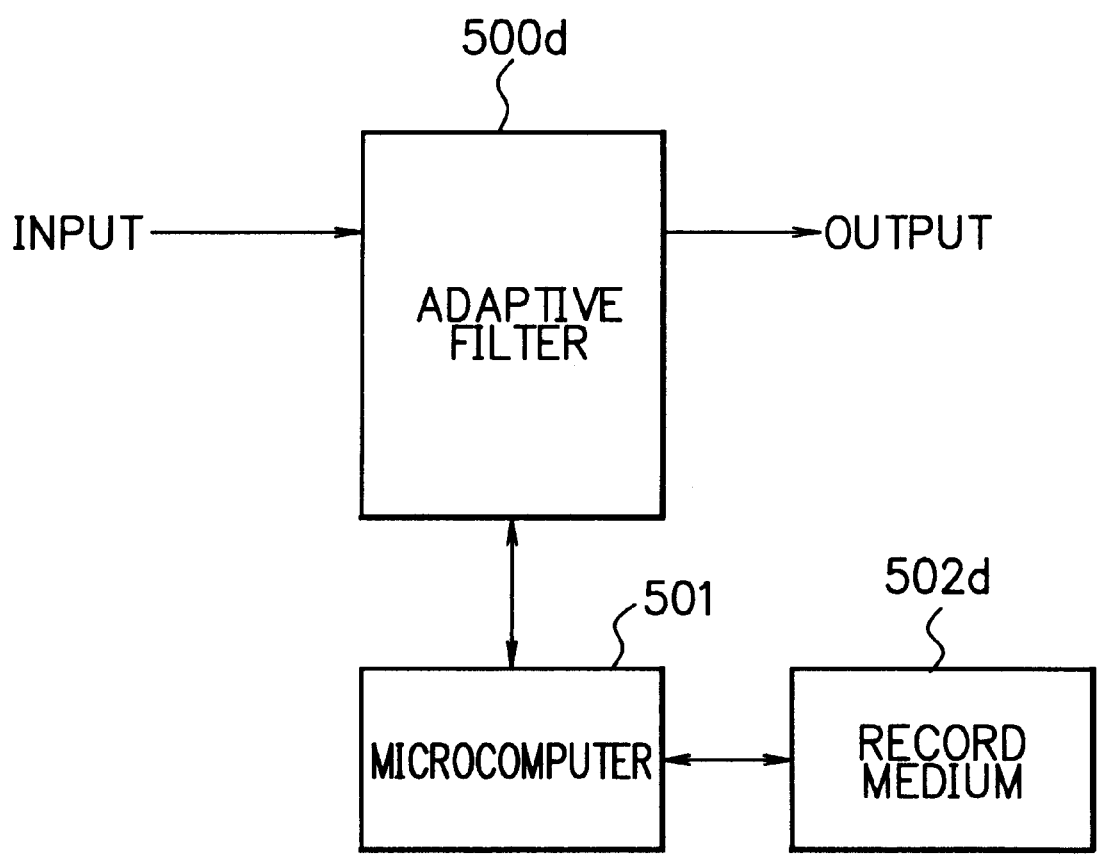
FIG. 24 is a block diagram showing an example in which the step size control of the adaptive filter of the fourth embodiment is executed by a microcomputer.

FIG. 24 is a block diagram showing an example in which the step size control of the adaptive filter of the fourth embodiment is executed by a microcomputer. Referring to FIG. 24, the step size $\alpha_c^{(n)}$ of the adaptive filter 500d is controlled by the microcomputer 501. The microcomputer 501 is provided with functions for executing the process shown in FIG. 20, FIG. 21 and FIG. 22. A program for controlling the process is stored in a record medium 502d and the microcomputer 501 executes the process according to the program. As the record medium 502d, a ROM (Read Only Memory), a RAM (Random Access Memory), a flash memory, a memory card, an optical memory disk, a magneto-optical disk, a magnetic recording medium, etc. can be used. Incidentally, the adaptive filter of the fourth embodiment with the adaptive controlled step size can also be realized by a specific DSP (Digital Signal Processor), an ASIC (Application Specific Integrated Circuit), etc.

As described above, according to the fourth embodiment, the step size of the adaptive filter employing the stochastic gradient LMS algorithm is controlled to be approximately the same as the theoretically derived optimum step size, thereby both faster convergence of the adaptive filter and smaller residual mean squared estimation error after convergence can be attained. The step size control method of the fourth embodiment can also be applied to adaptive filters which employ the stochastic gradient normalized LMS algorithm as the tap weight control algorithm.

As set forth hereinabove, according to the present invention, the step size of adaptive filters employing the stochastic gradient algorithm is controlled to be approximately the same as theoretically derived optimum step size $\alpha_c^{(n)}{}_{opt}$ which satisfies $\delta\epsilon^{(n+1)}/\delta\alpha_c^{(n)}{}_{opt}=0$ at each time n, thereby both faster convergence of the adaptive filter and smaller residual mean squared estimation error after convergence can be attained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An adaptive filter which is realized as a finite impulse response filter employing stochastic gradient algorithm expressed by the following equation as tap weight control algorithm:

$$c^{(n+1)}=c^{(n)}+\alpha_c^{(n)}f(e_n+\upsilon_n)g(a^{(n)})$$

where:

n is time, $c^{(n)}$ is an N dimensional tap weight vector at the time n, $\alpha_c^{(n)}$ is a step size at the time n, $e_n$ is an error signal sequence component at the time n, $\upsilon_n$ is an additive noise sequence component at the time n, and $a^{(n)}$ is an input signal sequence vector at the time n, comprising a step size controller means for controlling the step size $\alpha_c^{(n)}$ so as to minimize the mean squared estimation error $\epsilon^{(n)}=E[e_n^2]$ at each time n, wherein the step size controller means regards a step size $\alpha_c^{(n)}{}_{opt}$ which satisfies $\delta\epsilon^{(n+1)}/\delta\alpha_c^{(n)}{}_{opt}=0$ at each time n as a theoretical optimum step size, and sets the step size $\alpha_c^{(n)}$ at each time n so as to be approximately equal to the theoretical optimum step size $\alpha_c^{(n)}{}_{opt}$.

2. An adaptive filter as claimed in claim 1, wherein the step size controller means calculates vectors $q_0^{(n)}$ and $q^{(n)}$ and a scalar quantity $\tau^{(n)}$ one by one according to the following update equations:

$$q_0^{(n+1)}=(1-\rho_0)q_0^{(n)}+\rho_0(e_n+\upsilon_n)a^{(n)}$$

$$q^{(n+1)}=(1-\rho)q^{(n)}+\rho f(e_n+\upsilon_n)g(a^{(n)})$$

$$\tau^{(n+1)}=(1-\rho_\tau)\tau^{(n)}+\rho_\tau\{a^{(n-L)T}f(e_n+\upsilon_n)g(a^{(n)})\}^2$$

where the $\rho_0$, $\rho$ and $\rho_\tau$ are leakage coefficients, and the L is a delay time length which is sufficiently large so that $E[a^{(n-L)T}a^{(n)}]$ will be approximately zero, and sets the step size $\alpha_c^{(n)}$ at each time n as:

$$\alpha_c^{(n)}=q_0^{(n)T}q^{(n)}/\tau^{(n)}$$

where the $q_0^{(n)T}q^{(n)}$ is the inner product of the vectors $q_0^{(n)}$ and $q^{(n)}$.

3. An adaptive filter as claimed in claim 2, wherein the step size controller means includes:

a multiplier means for multiplying the input signal sequence vector $a^{(n)}$ by the sum of the error signal sequence component $e_n$ and the additive noise sequence component $\upsilon_n$;

a first leakage accumulator means for obtaining the vector $q_0^{(n)}$ according to the update equation using the leakage coefficient $\rho_0$ and the product vector $(e_n+\upsilon_n)a^{(n)}$ obtained by the multiplier means;

a second leakage accumulator means for obtaining the vector $q^{(n)}$ according to the update equation using the leakage coefficient $\rho$ and the vector $f(e_n+\upsilon_n)g(a^{(n)})$ which is used for controlling the tap weight. vector $c^{(n)}$;

a first inner product calculator means for obtaining the inner product of the vector $q_0^{(n)}$ and the vector $q^{(n)}$;

a second inner product calculator means for obtaining the inner product of the vector $f(e_n+\upsilon_n)g(a^{(n)})$ and a vector $a^{(n-L)}$ which is the input signal sequence vector $a^{(n)}$ delayed by the delay time length L;

a squarer means for obtaining the square of the inner product $a^{(n-L)T}f(e_n+\upsilon_n)g(a^{(n)})$ obtained by the second inner product calculator means;

a third leakage accumulator means for obtaining the scalar quantity $\tau^{(n)}$ according to the update equation using the leakage coefficient $\rho_\tau$ and the square $\{a^{(n-L)T}f(e_n+\upsilon_n)g(a^{(n)})\}^2$ obtained by the squarer means; and a divider means for dividing the inner product $q_0^{(n)T}q^{(n)}$ obtained by the first inner product calculator means by the scalar quantity $\tau^{(n)}$ obtained by the third leakage accumulator means and thereby obtaining the step size $\alpha_c^{(n)}=q_0^{(n)T}q^{(n)}/\tau^{(n)}$.

4. An adaptive filter as claimed in claim 1, wherein:

the adaptive filter employs stochastic gradient sign algorithm in which the $f(e_n+\upsilon_n)$ is $sgn(e_n+\upsilon_n)$ and the $g(a^{(n)})$ is $a^{(n)}$ as the tap weight control algorithm, and the step size controller means calculates a vector $q^{(n)}$ one by one according to the following update equation:

$$q^{(n+1)}=(1-\rho)q^{(n)}+\rho sgn(e_n+\upsilon_n)(|e_n+\upsilon_n|)^{1/2}a^{(n)}$$

where the ρ is a leakage coefficient, and sets the step size $\alpha_c^{(n)}$ at each time n as:

$$\alpha_c^{(n)} = \beta \|q^{(n)}\|^2$$

where $$\beta = (\pi/2)^{1/2}/\Gamma^2(5/4)/\text{trace}(Ra^2)$$
$$= 1.07870520/\text{trace}(Ra^2)$$

where $$Ra = E[a^{(n)}a^{(n)T}].$$

5. An adaptive filter as claimed in claim 4, wherein the step size controller means includes:
- a sign detector means for detecting the sign of the sum of the error signal sequence component $e_n$ and the additive noise sequence component $\upsilon_n$;
- an absolute value calculator means for calculating the absolute value of the sum $(e_n+\upsilon_n)$;
- a square root calculator means for calculating the square root of the absolute value $|e_n+\upsilon_n|$ calculated by the absolute value calculator means;
- a first multiplier means for calculating the product of the sign $\text{sgn}(e_n+\upsilon_n)$ detected by the sign detector means and the square root $(|e_n+\upsilon_n|)^{1/2}$ calculated by the square root calculator means;
- a second multiplier means for multiplying the input signal sequence vector $a^{(n)}$ by the product $\text{sgn}(e_n+\upsilon_n)(|e_n+\upsilon_n|)^{1/2}$ calculated by the first multiplier means;
- a leakage accumulator means for obtaining the vector $q^{(n)}$ according to the update equation using the leakage coefficient $\rho$ and the product vector $\text{sgn}(e_n+\upsilon_n)(|e_n+\upsilon_n|)^{1/2} a^{(n)}$ obtained by the second multiplier means;
- a norm calculator means for calculating the squared norm of the vector $q^{(n)}$ obtained by the leakage accumulator means; and
- a third multiplier means for multiplying the squared norm $\|q^{(n)}\|^2$ obtained by the norm calculator means by the coefficient $\beta$ and thereby obtaining the step size $\alpha_c^{(n)}=\beta\|q^{(n)}\|^2$.

6. An-adaptive filter as claimed in claim 1, wherein:
the adaptive filter employs stochastic gradient sign algorithm in which the $f(e_n+\upsilon_n)$ is $\text{sgn}(e_n+\upsilon_n)$ and the $g(a^{(n)})$ is $a^{(n)}$ as the tap weight control algorithm, and
the step size controller means calculates a vector $q^{(n)}$ and a scalar quantity $|\sigma|^{(n)}$ one by one according to the following update equations:

$$q^{(n+1)}=(1-\rho)q^{(n)}+\rho\text{sgn}(e_n+\upsilon_n)a^{(n)}$$
$$|\sigma|^{(n+1)}=(1-\rho_\sigma)|\sigma|^{(n)}+\rho_\sigma|e_n+\upsilon_n|$$

where the $\rho$ and $\rho_\sigma$ are leakage coefficients, and sets the step size $\alpha_c^{(n)}$ at each time n as:

$$\alpha_c^{(n)}=\beta'\|q^{(n)}\|^2|\sigma|^{(n)}$$

where $\beta'=\pi/2/\text{trace}(Ra^2)$
where $Ra=E[a^{(n)}a^{(n)T}]$.

7. An adaptive filter as claimed in claim 6, wherein the step size controller means includes:
- a sign detector means for detecting the sign of the sum of the error signal sequence component $e_n$ and the additive noise sequence component $\upsilon_n$;
- an absolute value calculator means for calculating the absolute value of the sum $(e_n+\upsilon_n)$;
- a first multiplier means for multiplying the input signal sequence vector $a^{(n)}$ by the sign $\text{sgn}(e_n+\upsilon_n)$ detected by the sign detector means;
- a first leakage accumulator means for obtaining the vector $q^{(n)}$ according to the update equation using the leakage coefficient $\rho$ and the product vector $\text{sgn}(e_n+\upsilon_n) a^{(n)}$ obtained by the first multiplier means;
- a norm calculator means for calculating the squared norm of the vector $q^{(n)}$ obtained by the first leakage accumulator means;
- a second leakage accumulator means for obtaining the scalar quantity $|\sigma|^{(n)}$ according to the update equation using the leakage coefficient $\rho_\sigma$ and the absolute value $|e_n+\upsilon_n|$ calculated by the absolute value calculator means;
- a second multiplier means for multiplying the squared norm $\|q^{(n)}\|^2$ calculated by the norm calculator means by the scalar quantity $|\sigma|^{(n)}$; and
- a third multiplier means for multiplying the product $\|q^{(n)}\|^2|\sigma|^{(n)}$ obtained by the second multiplier means by the coefficient $\beta'$ and thereby obtaining the step size $\alpha_c^{(n)}=\beta'\|q^{(n)}\|^2|\sigma|^{(n)}$.

8. An adaptive filter as claimed in claim 1, wherein:
the adaptive filter employs stochastic gradient LMS algorithm in which the $f(e_n+\upsilon_n)$ is $e_n+\upsilon_n$ and the $g(a^{(n)})$ is $a^{(n)}$ as the tap weight control algorithm, and
the step size controller means calculates a vector $q^{(n)}$ one by one according to the following update equation:

$$q^{(n+1)}=(1-\rho)q^{(n)}+\rho\text{sgn}(e_n+\upsilon_n)a^{(n)}$$

where the $\rho$ is a leakage coefficient, and sets the step size $\alpha_c^{(n)}$ at each time n as:

$$\alpha_c^{(n)}=\beta'\|q^{(n)}\|^2$$

where $\beta'=\pi/2/\text{trace}(Ra^2)$
where $Ra=E[a^{(n)}a^{(n)T}]$.

9. An adaptive filter as claimed in claim 8, wherein the step size controller means includes:
- a sign detector means for detecting the sign of the sum of the error signal sequence component $e_n$ and the additive noise sequence component $\upsilon_n$;
- a first multiplier means for multiplying the input signal sequence vector $a^{(n)}$ by the sign $\text{sgn}(e_n+\upsilon_n)$ detected by the sign detector means;
- a leakage accumulator means for obtaining the vector $q^{(n)}$ according to the update equation using the leakage coefficient $\rho$ and the product vector $\text{sgn}(e_n+\upsilon_n) a^{(n)}$ obtained by the first multiplier means;
- a norm calculator means for calculating the squared norm of the vector $q^{(n)}$ obtained by the leakage accumulator means; and
- a second multiplier means for multiplying the squared norm $\|q^{(n)}\|^2$ obtained by the norm calculator means by the coefficient $\beta'$ and thereby obtaining the step size $\alpha_c^{(n)}=\beta'\|q^{(n)}\|^2$.

10. An adaptive filter as claimed in claim 1, wherein:
the adaptive filter employs stochastic gradient normalized LMS algorithm in which the $f(e_n+\upsilon_n)$ is $e_n+\upsilon_n$ and the $g(a^{(n)})$ is $a^{(n)}/Pa$ $(Pa=a^{(n)T}a^{(n)})$ as the tap weight control algorithm, and
the step size controller means calculates a vector $q^{(n)}$ one by one according to the following update equation:

$$q^{(n+1)}=(1-\rho)q^{(n)}+\rho\text{sgn}(e_n+\upsilon_n)a^{(n)}$$

where the $\rho$ is a leakage coefficient, and sets the step size $\alpha_c^{(n)}$ at each time n as:

$\alpha_c^{(n)} = \beta''\|q^{(n)}\|^2$ where $\beta'' = (\pi/2)\sigma_a^2 N/\text{trace}(Ra^2)$
where $Ra = E[a^{(n)}a^{(n)T}]$,
N is the number of taps, and
$\sigma_a^2$ is the power of the input signal sequence $a^{(n)}$.

11. An adaptive filter as claimed in claim 10, wherein the step size controller means includes:
a sign detector means for detecting the sign of the sum of the error signal sequence component $e_n$ and the additive noise sequence component $\upsilon_n$;
a first multiplier means for multiplying the input signal sequence vector $a^{(n)}$ by the sign $\text{sgn}(e_n+\upsilon_n)$ detected by the sign detector means;
a leakage accumulator means for obtaining the vector $q^{(n)}$ according to the update equation using the leakage coefficient $\rho$ and the product vector $\text{sgn}(e_n+\upsilon_n) a^{(n)}$ obtained by the first multiplier means;
a norm calculator means for calculating the squared norm of the vector $q^{(n)}$ obtained by the leakage accumulator means; and
a second multiplier means for multiplying the squared norm $\|q^{(n)}\|^2$ obtained by the norm calculator means by the coefficient $\beta''$ and thereby obtaining the step size $\alpha_c^{(n)} = \beta''\|q^{(n)}\|^2$.

12. A step size control method for an adaptive filter which is realized as a finite impulse response filter employing stochastic gradient algorithm expressed by the following equation as tap weight control algorithm:

$$c^{(n+1)} = c^{(n)} + \alpha_c^{(n)} f(e_n+\upsilon_n)g(a^{(n)})$$

where:
n is time,
$c^{(n)}$ is an N dimensional tap weight vector at the time n,
$\alpha_c^{(n)}$ is a step size at the time n,
$e_n$ is an error signal sequence component at the time n,
$\upsilon_n$ is an additive noise sequence component at the time n, and
$a^{(n)}$ is an input signal sequence vector at the time n,
wherein the step size $\alpha_c^{(n)}$ is controlled so as to minimize the mean squared estimation error $\epsilon^{(n)} = E[e_n^2]$ at each time n, in which a step size $\alpha_{c\ opt}^{(n)}$ which satisfies $\delta\epsilon^{(n+1)}/\delta\alpha_{c\ opt}^{(n)} = 0$ at each time n is regarded as a theoretical optimum step size, and the step size $\alpha_c^{(n)}$ at each time n is set so as to be approximately equal to the theoretical optimum step size $\alpha_{c\ opt}^{(n)}$.

13. A step size control method as claimed in claim 12, wherein vectors $q_0^{(n)}$ and $q^{(n)}$ and a scalar quantity $\tau^{(n)}$ are calculated one by one according to the following update equations:

$$q_0^{(n+1)} = (1-\rho_0)q_0^{(n)} + \rho_0(e_n+\upsilon_n)a^{(n)}$$

$$q^{(n+1)} = (1-\rho)q^{(n)} + \rho f(e_n+\upsilon_n)g(a^{(n)})$$

$$\tau^{(n+1)} = (1-\rho_\tau)\tau^{(n)} + \rho_\tau\{a^{(n-L)T}f(e_n+\upsilon_n)g(a^{(n)})\}^2$$

where the $\rho_0$, $\rho$ and $\rho_\tau$ are leakage coefficients, and the L is a delay time length which is sufficiently large so that $E[a^{(n-L)T}a^{(n)}]$ will be approximately zero,
and the step size $\alpha_c^{(n)}$ at each time n is set as:

$$\alpha_c^{(n)} = q_0^{(n)T}q^{(n)}/\tau^{(n)}$$

where the $q_0^{(n)T}q^{(n)}$ is the inner product of the vectors $q_0^{(n)}$ and $q^{(n)}$.

14. A step size control method as claimed in claim 13, comprising the steps of:
(1) multiplying the input signal sequence vector $a^{(n)}$ by the sum of the error signal sequence component $e_n$ and the additive noise sequence component $\upsilon_n$;
(2) obtaining the vector $q_0^{(n)}$ according to the update equation using the leakage coefficient $\rho_0$ and the product vector $(e_n+\upsilon_n)a^{(n)}$ obtained in the step (1);
(3) obtaining the vector $q^{(n)}$ according to the update equation using the leakage coefficient $\rho$ and the vector $f(e_n+\upsilon_n)g(a^{(n)})$ which is used for controlling the tap weight vector $c^{(n)}$;
(4) obtaining the inner product of the vector $q_0^{(n)}$ and the vector $q^{(n)}$;
(5) obtaining the inner product of the vector $f(e_n+\upsilon_n)g(a^{(n)})$ and a vector $a^{(n-L)}$ which is the input signal sequence vector $a^{(n)}$ delayed by the delay time length L;
(6) obtaining the square of the inner product $a^{(n-L)T}f(e_n+\upsilon_n)g(a^{(n)})$ obtained in the step (5);
(7) obtaining the scalar quantity $\tau^{(n)}$ according to the update equation using the leakage coefficient $\rho_\tau$ and the square $\{a^{(n-L)T}f(e_n+\upsilon_n)g(a^{(n)})\}^2$ obtained in the step (6); and
(8) dividing the inner product $q_0^{(n)T}q^{(n)}$ obtained in the step (4) by the scalar quantity $\tau^{(n)}$ obtained in the step (7) and thereby obtaining the step size $\alpha_c^{(n)} = q_0^{(n)T}q^{(n)}/\tau^{(n)}$.

15. A step size control method as claimed in claim 12, wherein a vector $q^{(n)}$ is calculated one by one according to the following update equation:

$$q^{(n+1)} = (1-\rho)q^{(n)} + \rho\,\text{sgn}(e_n+\upsilon_n)(|e_n+\upsilon_n|)^{1/2}a^{(n)}$$

where the $\rho$ is a leakage coefficient, and the step size $\alpha_c^{(n)}$ at each time n is set as:

$$\alpha_c^{(n)} = \beta\|q^{(n)}\|^2$$

where $$\beta = (\pi/2)^{1/2}/\Gamma^2(5/4)/\text{trace}(Ra^2)$$
$$= 1.07870520/\text{trace}(Ra^2)$$

where $$Ra = E[a^{(n)}a^{(n)T}].$$

16. A step size control method as claimed in claim 15, comprising the steps of:
(1) detecting the sign of the sum of the error signal sequence component $e_n$ and the additive noise sequence component $\upsilon_n$;
(2) calculating the absolute value of the sum $(e_n+\upsilon_n)$;
(3) calculating the square root of the absolute value $|e_n+\upsilon_n|$ calculated in the step (2);
(4) calculating the product of the sign $\text{sgn}(e_n+\upsilon_n)$ detected in the step (1) and the square root $(|e_n+\upsilon_n|)^{1/2}$ calculated in the step (3);
(5) multiplying the input signal sequence vector $a^{(n)}$ by the product $\text{sgn}(e_n+\upsilon_n)(|e_n+\upsilon_n|)^{1/2}$ calculated in the step (4);
(6) obtaining the vector $q^{(n)}$ according to the update equation using the leakage coefficient $\rho$ and the product vector $\text{sgn}(e_n+\upsilon_n)(|e_n+\upsilon_n|)^{1/2} a^{(n)}$ obtained in the step (5);
(7) calculating the squared norm of the vector $q^{(n)}$ obtained in the step (6); and (8) multiplying the squared norm $\|q^{(n)}\|^2$ obtained in the step (7) by the coefficient $\beta$ and thereby obtaining the step size $\alpha_c^{(n)} = \beta\|q^{(n)}\|^2$.

17. A step size control method as claimed in claim 12, wherein a vector $q^{(n)}$ and a scalar quantity $|\sigma|^{(n)}$ share calculated one by one according to the following update equations:

$$q^{(n+1)} = (1-\rho)q^{(n)} + \rho\,\mathrm{sgn}(e_n + \upsilon_n)a^{(n)}$$

$$|\sigma|^{(n+1)} = (1-\rho_\sigma)|\sigma|^{(n)} + \rho_\sigma|e_n + \upsilon_n|$$

where the $\rho$ and $\rho_\sigma$ are leakage coefficients, and the step size $\alpha_c^{(n)}$ at each time n is set as:

$$\alpha_c^{(n)} = \beta'\|q^{(n)}\|^2|\sigma|^{(n)}$$

where $\beta' = \pi/2/\mathrm{trace}(Ra^2)$
where $Ra = E[a^{(n)}a^{(n)T}]$.

18. A step size control method as claimed in claim 17, comprising the steps of:
(1) detecting the sign of the sum of the error signal sequence component $e_n$ and the additive noise sequence component $\upsilon_n$;
(2) calculating the absolute value of the sum $(e_n + \upsilon_n)$;
(3) multiplying the input signal sequence vector $a^{(n)}$ by the sign $\mathrm{sgn}(e_n + \upsilon_n)$ detected in the step (1);
(4) obtaining the vector $q^{(n)}$ according to the update equation using the leakage coefficient $\rho$ and the product vector $\mathrm{sgn}(e_n + \upsilon_n)a^{(n)}$ obtained in the step (3);
(5) calculating the squared norm of the vector $q^{(n)}$ obtained in the step (4);
(6) obtaining the scalar quantity $|\sigma|^{(n)}$ according to the update equation using the leakage coefficient $\rho_\sigma$ and the absolute value $|e_n + \upsilon_n|$ calculated in the step (2);
(7) multiplying the squared norm $\|q^{(n)}\|^2$ calculated in the step (5) by the scalar quantity $|\sigma|^{(n)}$; and
(8) multiplying the product $\|q^{(n)}\|^2|\sigma|^{(n)}$ obtained in the step (7) by the coefficient $\beta'$ and thereby obtaining the step size $\alpha_c^{(n)} = \beta'\|q^{(n)}\|^2|\sigma|^{(n)}$.

19. A step size control method as claimed in claim 12, wherein a vector $q^{(n)}$ is calculated one by one according to the following update equation:

$$q^{(n+1)} = (1-\rho)q^{(n)} + \rho\,\mathrm{sgn}(e_n + \upsilon_n)a^{(n)}$$

where the $\rho$ is a leakage coefficient, and the step size $\alpha_c^{(n)}$ at each time n is set as:

$$\alpha_c^{(n)} = \beta'\|q^{(n)}\|^2$$

where $\beta' = \pi/2/\mathrm{trace}(Ra^2)$
where $Ra = E[a^{(n)}a^{(n)T}]$.

20. A step size control method as claimed in claim 19, comprising the steps of:
(1) detecting the sign of the sum of the error signal sequence component $e_n$ and the additive noise sequence component $\upsilon_n$;
(2) multiplying the input signal sequence vector $a^{(n)}$ by the sign $\mathrm{sgn}(e_n + \upsilon_n)$ detected in the step (1);
(3) obtaining the vector $q^{(n)}$ according to the update equation using the leakage coefficient $\rho$ and the product vector $\mathrm{sgn}(e_n + \upsilon_n)a^{(n)}$ obtained in the step (2);
(4) calculating the squared norm of the vector $q^{(n)}$ obtained in the step (3); and
(5) multiplying the squared norm $\|q^{(n)}\|^2$ obtained in the step (4) by the coefficient $\beta'$ and thereby obtaining the step size $\alpha_c^{(n)} = \beta'\|q^{(n)}\|^2$.

21. A step size control method as claimed in claim 12, wherein a vector $q^{(n)}$ is calculated one by one according to the following update equation:

$$q^{(n+1)} = (1-\rho)q^{(n)} + \rho\,\mathrm{sgn}(e_n + \upsilon_n)a^{(n)}$$

where the $\rho$ is a leakage coefficient, and the step size $\alpha_c^{(n)}$ at each time n is set as:

$$\alpha_c^{(n)} = \beta''\|q^{(n)}\|^2$$

where $\beta'' = (\pi/2)\sigma_a^2 N/\mathrm{trace}(Ra^2)$
where $Ra = E[a^{(n)}a^{(n)T}]$,
N is the number of taps, and
$\sigma_a^2$ is the power of the input signal sequence $a^{(n)}$.

22. A step size control method as claimed in claim 21, comprising the steps of:
(1) detecting the sign of the sum of the error signal sequence component $e_n$ and the additive noise sequence component $\upsilon_n$;
(2) multiplying the input signal sequence vector $a^{(n)}$ by the sign $\mathrm{sgn}(e_n + \upsilon_n)$ detected in the step (1);
(3) obtaining the vector $q^{(n)}$ according to the update equation using the leakage coefficient $\rho$ and the product vector $\mathrm{sgn}(e_n + \upsilon_n)a^{(n)}$ obtained in the step (2);
(4) calculating the squared norm of the vector $q^{(n)}$ obtained in the step (3); and
(5) multiplying the squared norm $\|q^{(n)}\|^2$ obtained in the step (4) by the coefficient $\beta''$ and thereby obtaining the step size $\alpha_c^{(n)} = \beta''\|q^{(n)}\|^2$.

23. A computer-readable record medium storing a program for instructing a computer to execute processes for controlling step sizes of an adaptive filter which is realized as a finite impulse response filter employing stochastic gradient algorithm expressed by the following equation as tap weight control algorithm:

$$c^{(n+1)} = c^{(n)} + \alpha_c^{(n)}f(e_n + \upsilon_n)g(a^{(n)})$$

where:
n is time,
$c^{(n)}$ is an N dimensional tap weight vector at the time n,
$\alpha_c^{(n)}$ is a step size at the time n,
$e_n$ is an error signal sequence component at the time n,
$\upsilon_n$ is an additive noise sequence component at the time n, and
$a^{(n)}$ is an input signal sequence vector at the time n,
wherein in the processes, the step size $\alpha_c^{(n)}$ is controlled so as to minimize the mean squared estimation error $\epsilon^{(n)} = E[e_n^2]$ at each time n, in which a step size $\alpha_{c\,opt}^{(n)}$ which satisfies $\delta\epsilon^{(n+1)}/\delta\alpha_{c\,opt}^{(n)} = 0$ at each time n is regarded as a theoretical optimum step size, and the step size $\alpha_c^{(n)}$ at each time n is set so as to be approximately equal to the theoretical optimum step size $\alpha_{c\,opt}^{(n)}$.

24. A computer-readable record medium as claimed in claim 23, wherein in the processes,
vectors $q_0^{(n)}$ and $q^{(n)}$ and a scalar quantity $\tau^{(n)}$ are calculated one by one according to the following update equations:

$$q_0^{(n+1)} = (1-\rho_0)q_0^{(n)} + \rho_0(e_n + \upsilon_n)a^{(n)}$$

$$q^{(n+1)}=(1-\rho)q^{(n)}+\rho f(e_n+\upsilon_n)g(a^{(n)})$$

$$\tau^{(n+1)}=(1-\rho_\tau)\tau^{(n)}+\rho_\tau\{a^{(n-L)T}f(e_n+\upsilon_n)g(a^{(n)})\}^2$$

where the $\rho_0$, $\rho$ and $\rho_\tau$ are leakage coefficients, and the L is a delay time length which is sufficiently large so that $E[a^{(n-L)T}a^{(n)}]$ will be approximately zero, and the step size $\alpha_c^{(n)}$ at each time n is set as:

$$\alpha_c^{(n)}=q_0^{(n)T}q^{(n)}/\tau^{(n)}$$

where the $q_0^{(n)T}q^{(n)}$ is the inner product of the vectors $q_0^{(n)}$ and $q^{(n)}$.

25. A computer-readable record medium as claimed in claim 24, wherein the processes comprises the steps of:

(1) multiplying the input signal sequence vector $a^{(n)}$ by the sum of the error signal sequence component $e_n$ and the additive noise sequence component $\upsilon_n$;

(2) obtaining the vector $q_0^{(n)}$ according to the update equation using the leakage coefficient $\rho_0$ and the product vector $(e_n+\upsilon_n)a^{(n)}$ obtained in the step (1);

(3) obtaining the vector $q^{(n)}$ according to the update equation using the leakage coefficient $\rho$ and the vector $f(e_n+\upsilon_n)g(a^{(n)})$ which is used for controlling the tap weight vector $c^{(n)}$;

(4) obtaining the inner product of the vector $q_0^{(n)}$ and the vector $q^{(n)}$;

(5) obtaining the inner product of the vector $f(e_n+\upsilon_n)g(a^{(n)})$ and a vector $a^{(n-L)}$ which is the input signal sequence vector $a^{(n)}$ delayed by the delay time length L;

(6) obtaining the square of the inner product $a^{(n-L)T}f(e_n+\upsilon_n)g(a^{(n)})$ obtained in the step (5);

(7) obtaining the scalar quantity $\tau^{(n)}$ according to the update equation using the leakage coefficient $\rho_\tau$ and the square $\{a^{(n-L)T}f(e_n+\upsilon_n)g(a^{(n)})\}^2$ obtained in the step (6); and (8) dividing the inner product $q_0^{(n)T}q^{(n)}$ obtained in the step (4) by the scalar quantity $\tau^{(n)}$ obtained in the step (7) and thereby obtaining the step size $\alpha_c^{(n)}=q_0^{(n)T}q^{(n)}/\tau^{(n)}$.

26. A computer-readable record medium as claimed in claim 23, wherein in the processes, a vector $q^{(n)}$ is calculated one by one according to the following update equation:

$$q^{(n+1)}=(1-\rho)q^{(n)}+\rho\,\text{sgn}(e_n+\upsilon_n)(|e_n+\upsilon_n|)^{1/2}a^{(n)}$$

where the $\rho$ is a leakage coefficient, and the step size $\alpha_c^{(n)}$ at each time n is set as:

$$\alpha_c^{(n)}=\beta\|q^{(n)}\|^2$$

where $\beta=(\pi/2)^{1/2}/\Gamma^2(5/4)/\text{trace}(Ra^2)=1.07870520/\text{trace}(Ra^2)$ where $Ra=E[a^{(n)}a^{(n)T}]$.

27. A computer-readable record medium as claimed in claim 26, wherein the processes comprises the steps of:

(1) detecting the sign of the sum of the error signal sequence component $e_n$ and the additive noise sequence component $\upsilon_n$;

(2) calculating the absolute value of the sum $(e_n+\upsilon_n)$;

(3) calculating the square root of the absolute value $|e_n+\upsilon_n|$ calculated in the step (2);

(4) calculating the product of the sign $\text{sgn}(e_n+\upsilon_n)$ detected in the step (1) and the square root $(|e_n+\upsilon_n|)^{1/2}$ calculated in the step (3);

(5) multiplying the input signal sequence vector $a^{(n)}$ by the product $\text{sgn}(e_n+\upsilon_n)(|e_n+\upsilon_n|)^{1/2}$ calculated in the step (4);

(6) obtaining the vector $q^{(n)}$ according to the update equation using the leakage coefficient $\rho$ and the product vector $\text{sgn}(e_n+\upsilon_n)(|e_n+\upsilon_n|)^{1/2}a^{(n)}$ obtained in the step (5);

(7) calculating the squared norm of the vector $q^{(n)}$ obtained in the step (6); and (8) multiplying the squared norm $\|q^{(n)}\|^2$ obtained in the step (7) by the coefficient $\beta$ and thereby obtaining the step size $\alpha_c^{(n)}=\beta\|q^{(n)}\|^2$.

28. A computer-readable record medium as claimed in claim 23, wherein in the processes, a vector $q^{(n)}$ and a scalar quantity $|\sigma|^{(n)}$ are calculated one by one according to the following update equations:

$$q^{(n+1)}=(1-\rho)q^{(n)}+\rho\,\text{sgn}(e_n+\upsilon_n)a^{(n)}$$

$$|\sigma|^{(n+1)}=(1-\rho_\sigma)|\sigma|^{(n)}+\rho_\sigma|e_n+\upsilon_n|$$

where the $\rho$ and $\rho_\sigma$ are leakage coefficients, and the step size $\alpha_c^{(n)}$ at each time n is set as:

$$\alpha_c^{(n)}=\beta'\|q^{(n)}\|^2|\sigma|^{(n)}$$

where $\beta'=\pi/2/\text{trace}(Ra^2)$
where $Ra=E[a^{(n)}a^{(n)T}]$.

29. A computer-readable record medium as claimed in claim 28, wherein the processes comprises the steps of:

(1) detecting the sign of the sum of the error signal sequence component $e_n$ and the additive noise sequence component $\upsilon_n$;

(2) calculating the absolute value of the sum $(e_n+\upsilon_n)$;

(3) multiplying the input signal sequence vector $a^{(n)}$ by the sign $\text{sgn}(e_n+\upsilon_n)$ detected in the step (1);

(4) obtaining the vector $q^{(n)}$ according to the update equation using the leakage coefficient $\rho$ and the product vector $\text{sgn}(e_n+\upsilon_n)a^{(n)}$ obtained in the step (3);

(5) calculating the squared norm of the vector $q^{(n)}$ obtained in the step (4);

(6) obtaining the scalar quantity $|\sigma|^{(n)}$ according to the update equation using the leakage coefficient $\rho_\sigma$ and the absolute value $|e_n+\upsilon_n|$ calculated in the step (2);

(7) multiplying the squared norm $\|q^{(n)}\|^2$ calculated in the step (5) by the scalar quantity $|\sigma|^{(n)}$; and (8) multiplying the product $\|q^{(n)}\|^2|\sigma|^{(n)}$ obtained in the step (7) by the coefficient $\beta'$ and thereby obtaining the step size $\alpha_c^{(n)}=\beta'\|q^{(n)}\|^2|\sigma|^{(n)}$.

30. A computer-readable record medium as claimed in claim 23, wherein in the processes, a vector $q^{(n)}$ is calculated one by one according to the following update equation:

$$q^{(n+1)}=(1-\rho)q^{(n)}+\rho\,\text{sgn}(e_n+\upsilon_n)a^{(n)}$$

where the $\rho$ is a leakage coefficient, and the step size $\alpha_c^{(n)}$ at each time n is set as:

$$\alpha_c^{(n)}=\beta'\|q^{(n)}\|^2$$

where $\beta'=\pi/2/\text{trace}(Ra^2)$
where $Ra=E[a^{(n)}a^{(n)T}]$.

31. A computer-readable record medium as claimed in claim 30, wherein the processes comprises the steps of:

(1) detecting the sign of the sum of the error signal sequence component $e_n$ and the additive noise sequence component $v_n$;
(2) multiplying the input signal sequence vector $a^{(n)}$ by the sign $\text{sgn}(e_n+v_n)$ detected in the step (1);
(3) obtaining the vector $q^{(n)}$ according to the update equation using the leakage coefficient $\rho$ and the product vector $\text{sgn}(e_n+v_n)a^{(n)}$ obtained in the step (2);
(4) calculating the squared norm of the vector $q^{(n)}$ obtained in the step (3); and
(5) multiplying the squared norm $\|q^{(n)}\|^2$ obtained in the step (4) by the coefficient $\beta'$ and thereby obtaining the step size $\alpha_c^{(n)}=\beta'\|q^{(n)}\|^2$.

32. A computer-readable record medium as claimed in claim 23, wherein in the processes, a vector $q^{(n)}$ is calculated one by one according to the following update equation:

$$q^{(n+1)}=(1-\rho)q^{(n)}+\rho\,\text{sgn}(e_n+v_n)a^{(n)}$$

·where the $\rho$ is a leakage coefficient, and the step size $\alpha_c^{(n)}$ at each time n is set as:

$$\alpha_c^{(n)}=\beta''\|q^{(n)}\|^2$$

where $\beta''=(\pi/2)\sigma_a^2 N/\text{trace}(Ra^2)$
where $Ra=E[a^{(n)}a^{(n)T}]$,
N is the number of taps, and
$\sigma_a^2$ is the power of the input signal sequence $a^{(n)}$.

33. A computer-readable record medium as claimed in claim 32, wherein the processes comprises the steps of:
(1) detecting the sign of the sum of the error signal sequence component $e_n$ and the additive noise sequence component $v_n$;
(2) multiplying the input signal sequence vector $a^{(n)}$ by the sign $\text{sgn}(e_n+v_n)$ detected in the step (1);
(3) obtaining the vector $q^{(n)}$ according to the update equation using the leakage coefficient $\rho$ and the product vector $\text{sgn}(e_n+v_n)a^{(n)}$ obtained in the step (2);
(4) calculating the squared norm of the vector $q^{(n)}$ obtained in the step (3); and
(5) multiplying the squared norm $\|q^{(n)}\|^2$ obtained in the step (4) by the coefficient $\beta''$ and thereby obtaining the step size $\alpha_c^{(n)}=\beta''\|q^{(n)}\|^2$.

* * * * *